(12) United States Patent
Suh et al.

(10) Patent No.: US 9,911,787 B2
(45) Date of Patent: Mar. 6, 2018

(54) SEMICONDUCTOR DEVICE AND METHOD OF FORMING THE SAME

(71) Applicants: Kiseok Suh, Hwaseong-si (KR); Gwanhyeob Koh, Seoul (KR); Yoonjong Song, Hwaseong-si (KR)

(72) Inventors: Kiseok Suh, Hwaseong-si (KR); Gwanhyeob Koh, Seoul (KR); Yoonjong Song, Hwaseong-si (KR)

(73) Assignee: Samsung Electronics Co, Ltd., Gyeonggi-do (KR)

( * ) Notice: Subject to any disclaimer, the term of this patent is extended or adjusted under 35 U.S.C. 154(b) by 31 days.

(21) Appl. No.: 15/187,929

(22) Filed: Jun. 21, 2016

(65) Prior Publication Data

US 2017/0110507 A1   Apr. 20, 2017

(30) Foreign Application Priority Data

Oct. 20, 2015   (KR) .......................... 10-2015-0146215

(51) Int. Cl.
| | |
|---|---|
| *H01L 43/02* | (2006.01) |
| *H01L 27/22* | (2006.01) |
| *H01L 43/08* | (2006.01) |
| *H01L 43/12* | (2006.01) |

(52) U.S. Cl.
CPC ............ *H01L 27/228* (2013.01); *H01L 43/02* (2013.01); *H01L 43/08* (2013.01); *H01L 43/12* (2013.01)

(58) Field of Classification Search
CPC ......... H01L 43/02; H01L 43/08; H01L 43/12; H01L 27/22; H01L 27/228

USPC ......................................................... 257/427
See application file for complete search history.

(56) References Cited

U.S. PATENT DOCUMENTS

| | | | |
|---|---|---|---|
| 7,521,743 B2 | 4/2009 | Yamagishi | |
| 8,283,186 B2 | 10/2012 | Kim | |
| 2008/0048333 A1* | 2/2008 | Seo ....................... H01L 21/743 |
| | | | 257/773 |
| 2010/0123190 A1 | 5/2010 | Kim | |
| 2014/0264672 A1 | 9/2014 | Park et al. | |
| 2014/0273287 A1 | 9/2014 | Park et al. | |
| 2015/0035031 A1 | 2/2015 | Kim | |

(Continued)

FOREIGN PATENT DOCUMENTS

KR   10-1095080 B1   12/2011

*Primary Examiner* — Monica D Harrison
(74) *Attorney, Agent, or Firm* — Harness, Dickey & Pierce, P.L.C.

(57) ABSTRACT

A semiconductor device includes an active region defining an isolation region. First and second cell interconnection structures are on the active region and the isolation region, and have line shapes that are parallel to each other. An isolation pattern is on the active region and the isolation region. The isolation pattern is between the first and second cell interconnection structures. Contact structures are between the first and second cell interconnection structures. The contact structures are at both sides of the isolation pattern and overlap the active region. Insulating patterns are between the first and second cell interconnection structures. The insulating patterns are at both sides of the isolation pattern and overlap the isolation region. Common source regions are under the first and second cell interconnection structures. The common source regions are in the active region. An isolating gate pattern that has a line shape is under the isolation pattern.

20 Claims, 49 Drawing Sheets

(56) References Cited

U.S. PATENT DOCUMENTS

2015/0061054 A1 3/2015 Kim et al.
2015/0069480 A1 3/2015 Kanaya et al.
2015/0171214 A1 6/2015 Han et al.

* cited by examiner

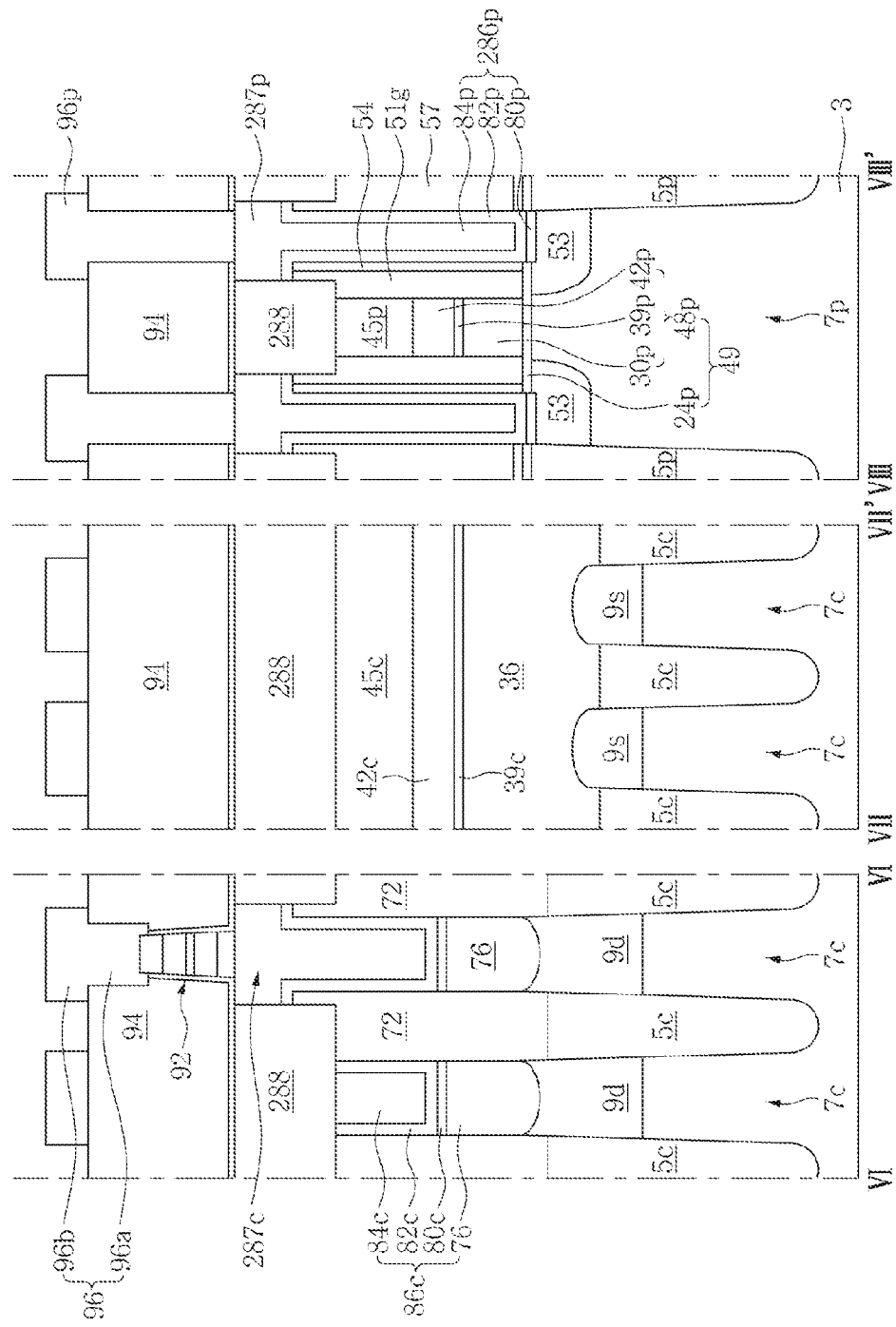

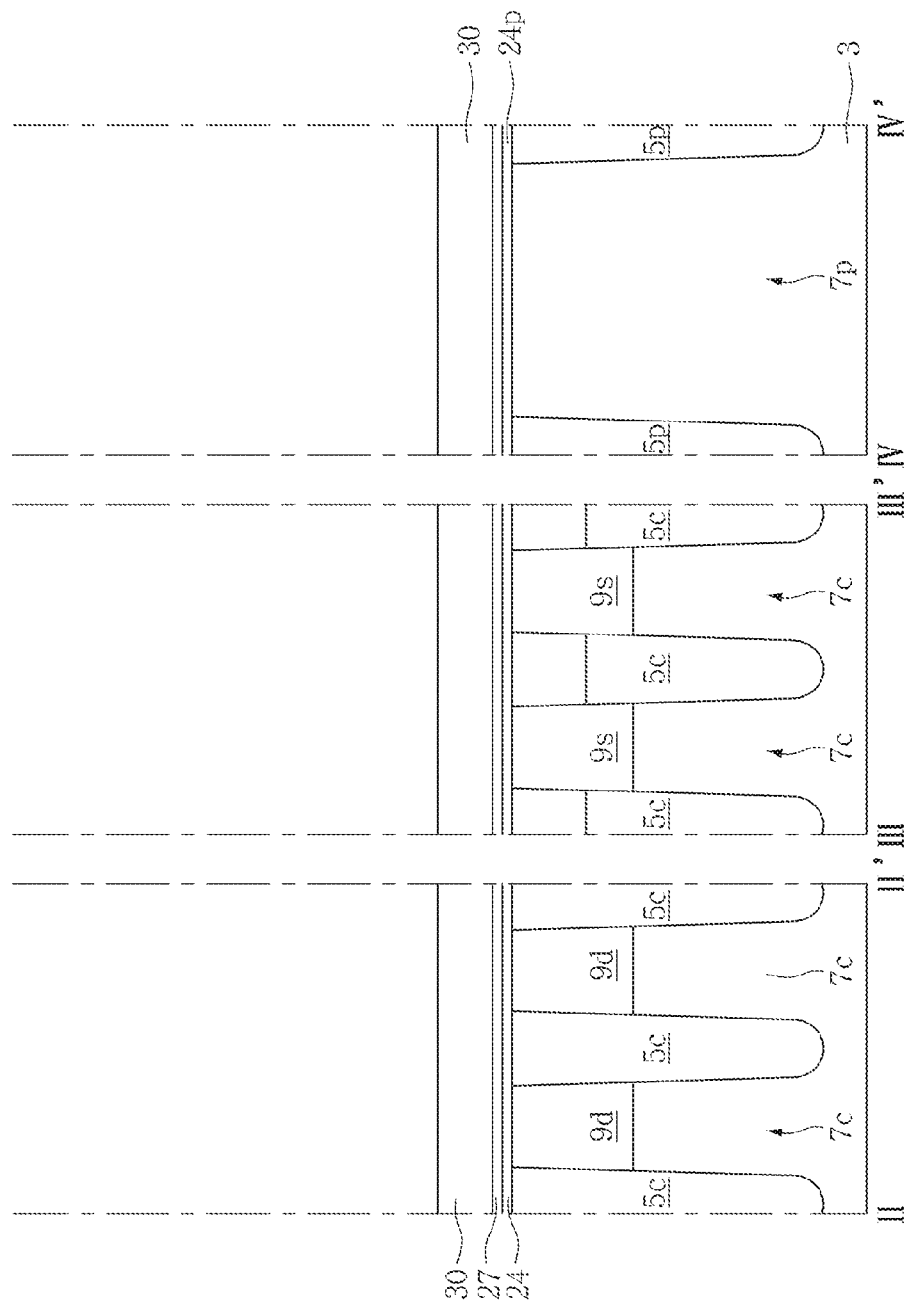

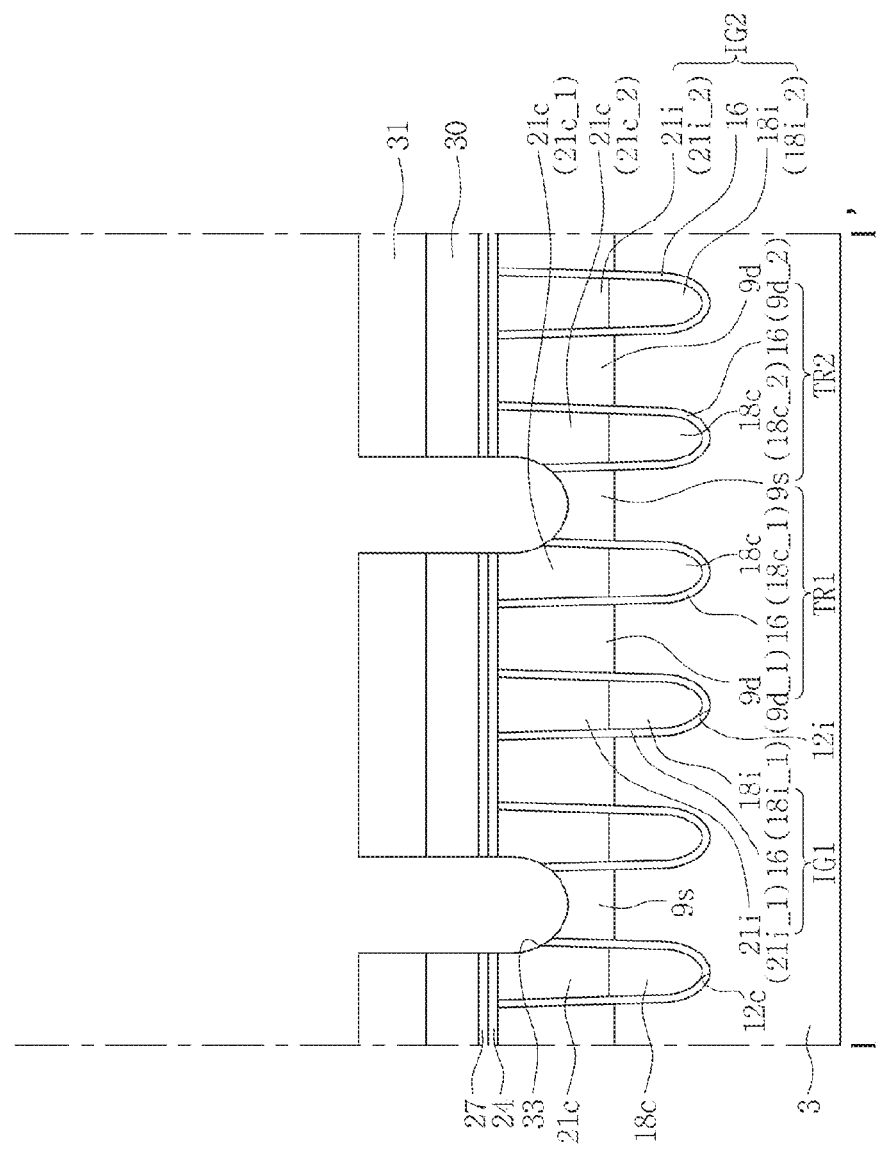

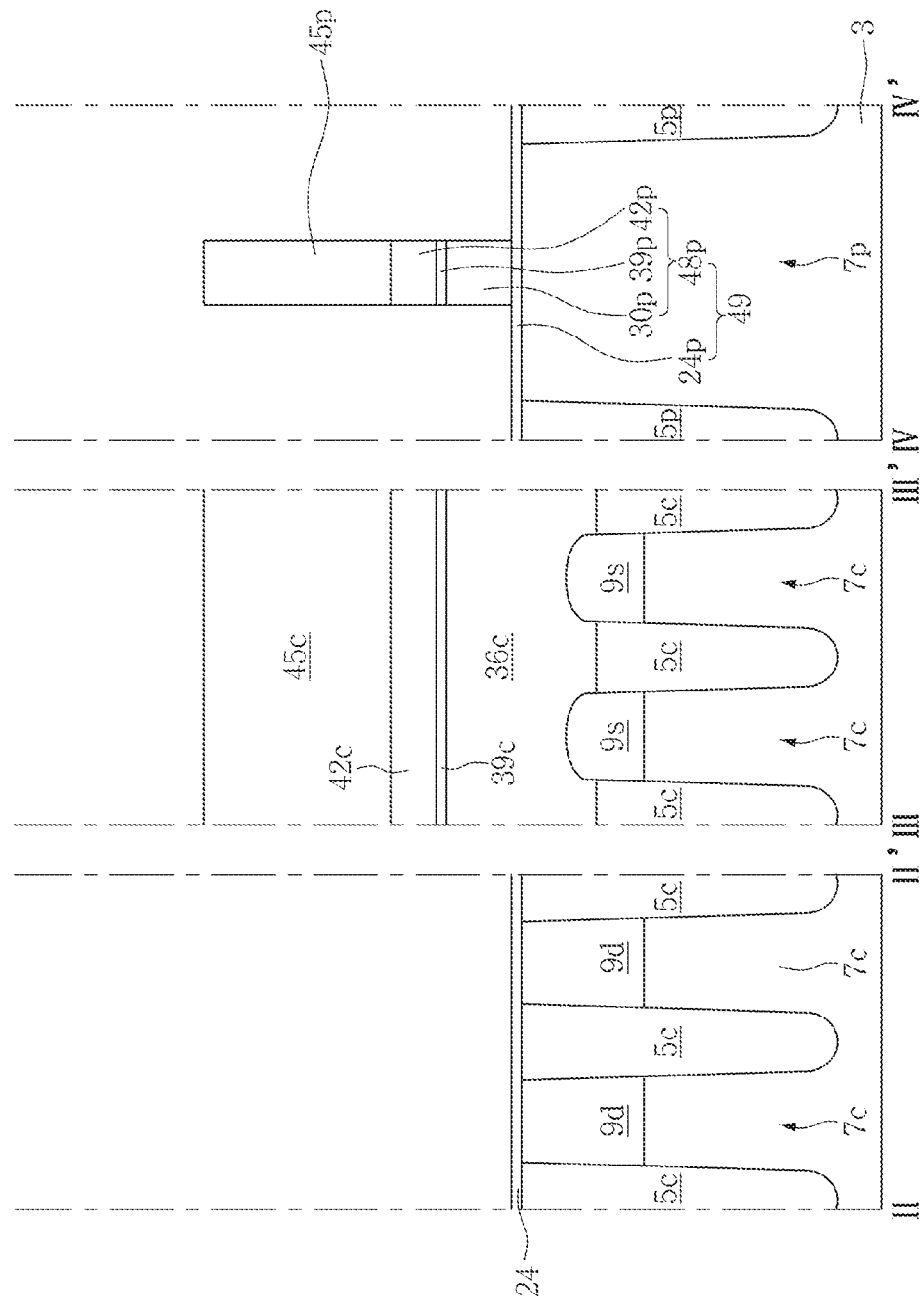

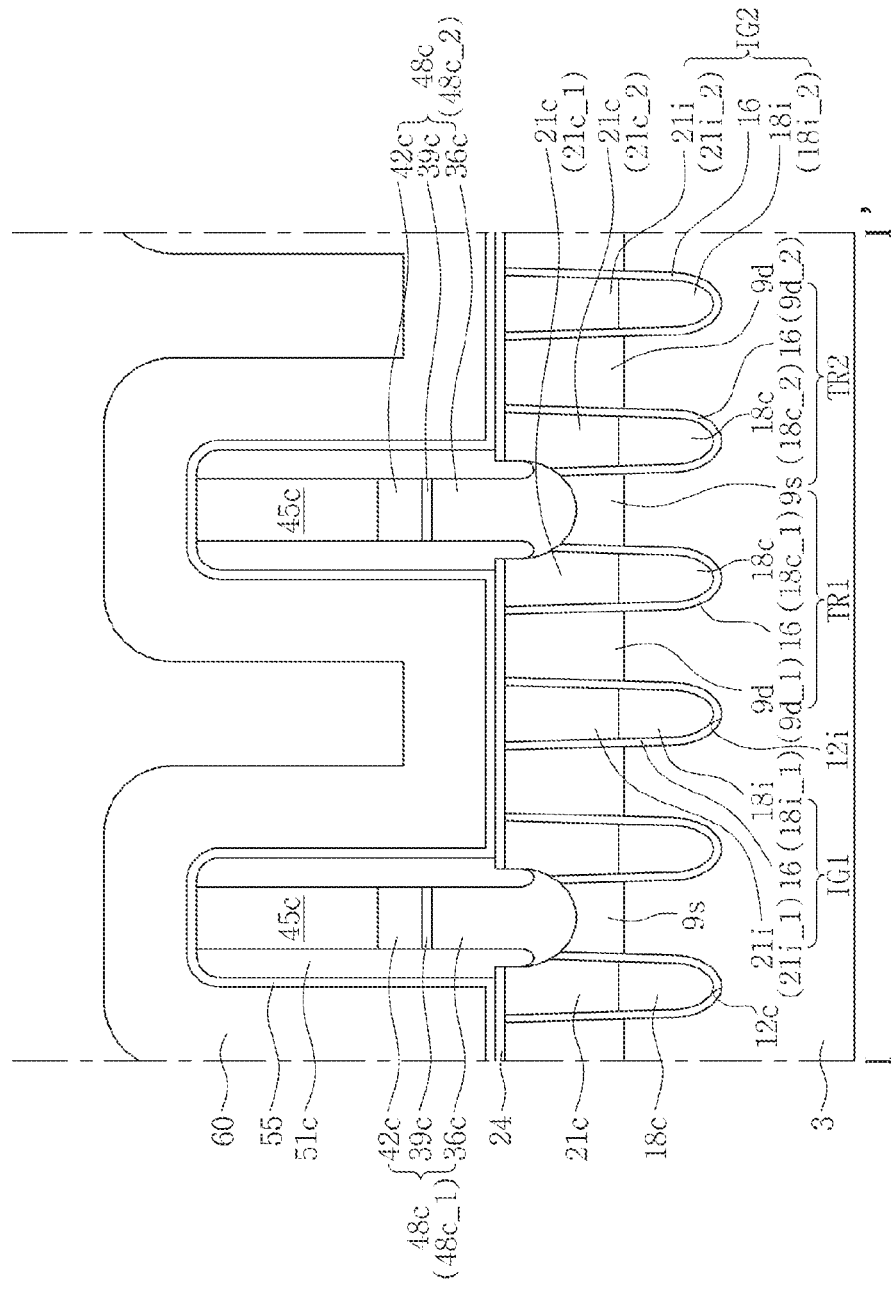

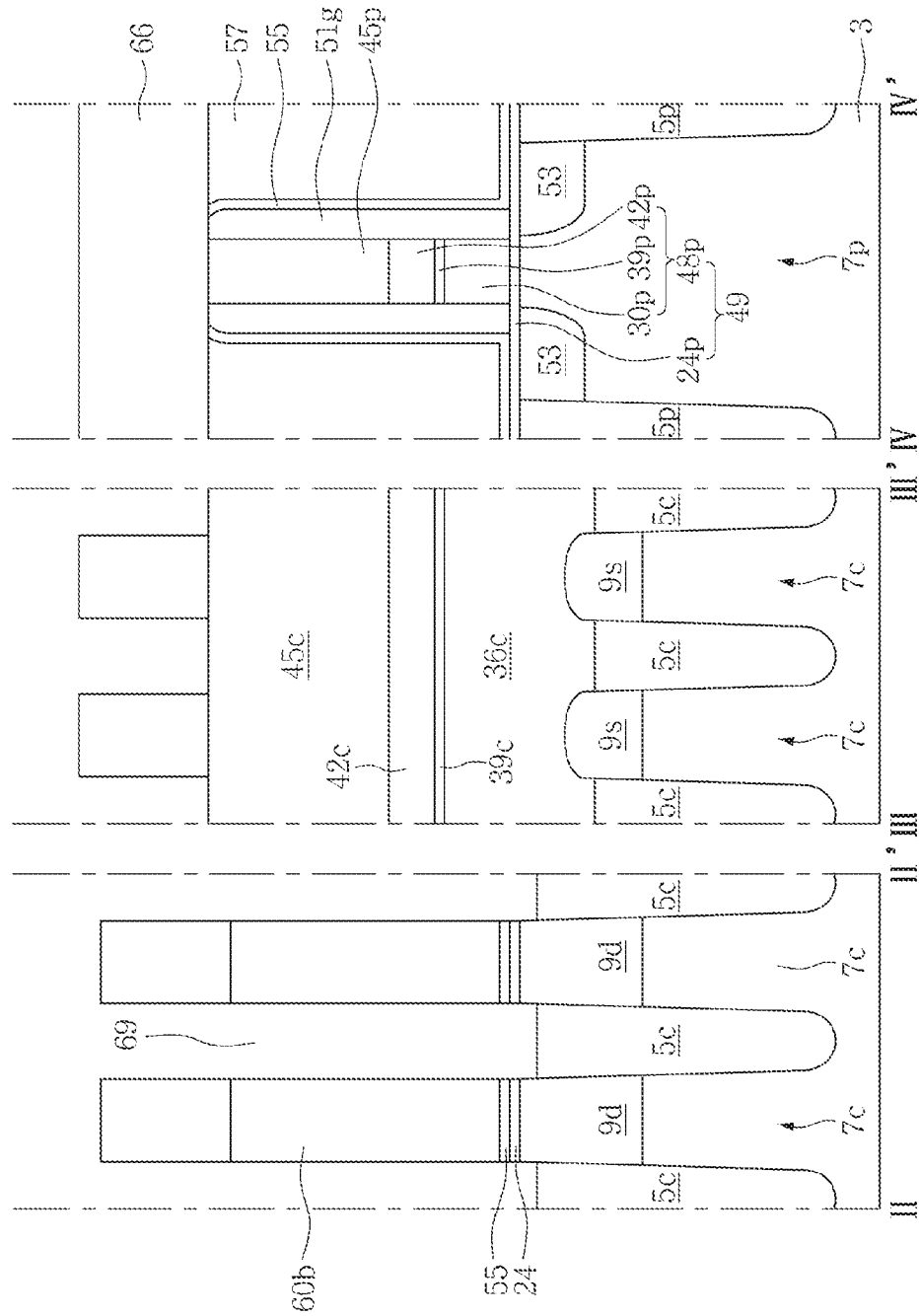

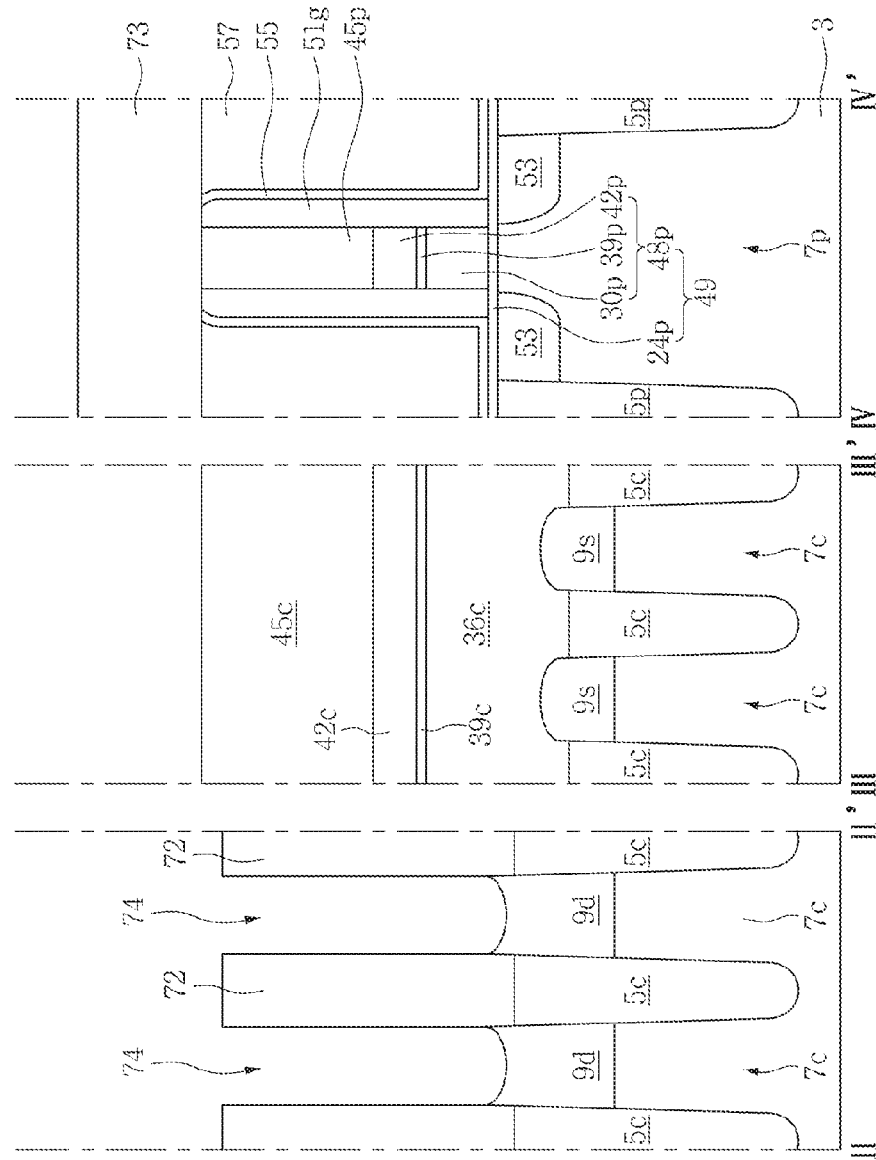

SEMICONDUCTOR DEVICE AND METHOD OF FORMING THE SAME

CROSS-REFERENCE TO RELATED APPLICATION

This application claims priority under 35 U.S.C. § 119 to Korean Patent Application No. 10-2015-0146215 filed on Oct. 20, 2015, the disclosure of which is hereby incorporated by reference in its entirety.

BACKGROUND

Technical Field

Example embodiments of the inventive concepts relate to a semiconductor device and a method of forming the same.

Description of Related Art

A size of a configuration element that constitutes a semiconductor device such as, for example, a magnetic random access memory (MRAM) has been gradually decreasing in accordance with an increasing degree of integration. Generally, a patterning process to form configuration elements is performed using a photolithography and etching process. As an arrangement density of miniaturized configuration elements increase, bridge failure and the like may occur between the configuration elements that are miniaturized and integrated in a high density when the configuration elements are formed by a general patterning process.

SUMMARY

In accordance with an example embodiment of the inventive concepts, a semiconductor device is provided. The semiconductor includes a first and second isolating gate patterns configured to have a line shape extending in a first direction. First and second cell transistors are disposed between the first and second isolating gate patterns. The first and second cell transistors share a common source region. The first cell transistor includes the common source region, a first cell drain region, and a first cell gate line, and the second cell transistor includes the common source region, a second cell drain region, and a second cell gate line. A first isolation pattern is disposed on the first isolating gate pattern. The first isolation pattern has a line shape extending in the first direction. A second isolation pattern is disposed on the second isolating gate pattern. The second isolation pattern has a line shape extending in the first direction. A cell interconnection structure is disposed between the first and second isolation patterns. The cell interconnection structure is disposed on the common source region, and has a line shape extending in the first direction. A first contact structure is disposed on the first cell drain region. A second contact structure is disposed on the second cell drain region.

In an example embodiment, the semiconductor device may further include an active region having a line shape extending in a second direction substantially perpendicular to the first direction.

In an example embodiment, the first and second cell gate lines may be buried in the active region.

In an example embodiment, the first and second isolating gate patterns may each include an isolating gate line buried in the active region.

In an example embodiment, the first and second cell gate lines may have a line shape extending in the first direction and.

In an example embodiment, the first isolating gate pattern may include a first isolating gate line and a first isolating gate capping pattern that are stacked, for example sequentially stacked, and the second isolating gate pattern may include a second isolating gate line and a second isolating gate capping pattern that are stacked, for example sequentially stacked.

In an example embodiment, the first isolation pattern may be in contact with the first isolating gate capping pattern and the second isolation pattern may be in contact with the second isolating gate capping pattern.

In an example embodiment, the semiconductor device may further include a first cell gate capping pattern on the first cell gate line, wherein an uppermost portion of the first cell gate capping pattern is higher than an uppermost portion of the first isolating gate capping pattern.

In an example embodiment, the semiconductor device may further include a first data storage element disposed on the first contact structure and a second data storage element disposed on the second contact structure.

In an example embodiment, the semiconductor device may further include a bit line disposed on the first and second data storage elements and having a line shape extending in the first direction.

In accordance with an example embodiment of the inventive concepts, a semiconductor device is provided. The semiconductor device includes an isolation region defining an active region. First and second cell interconnection structures are disposed on the active region and the isolation region. The first and second cell interconnection structures have line shapes that are substantially parallel to each other. An isolation pattern is disposed on the active region and the isolation region. The isolation pattern is disposed between the first and second cell interconnection structures. Contact structures are disposed between the first and second cell interconnection structures. The contact structures are disposed at both sides of the isolation pattern and overlap the active region. Insulating patterns are disposed between the first and second cell interconnection structures. The insulating patterns are disposed at both sides of the isolation pattern and overlap the isolation region. Common source regions are disposed under the first and second cell interconnection structures. The common source regions are disposed in the active region. An isolating gate pattern in a line shape is disposed under the isolation pattern.

In an example embodiment, the first and second cell interconnection structures, the isolation pattern and the isolating gate pattern may have a line shape extending in a first direction, and the active region and the isolation region may have a line shape extending in a second direction substantially perpendicular to the first direction.

In an example embodiment, the isolating gate pattern may be disposed in an isolating gate trench intersecting the active region and the isolation region.

In an example embodiment, the semiconductor device may further include cell gate lines disposed in cell gate trenches, which are disposed at both sides of the isolating gate trench, and drain regions disposed in the active region, which is disposed under the contact structures.

In an example embodiment, the semiconductor device may further include variable resistance structures disposed on cell pad portions of the contact structures, and a bit line disposed on the variable resistance structures and configured to overlap the active region, wherein any one of the pad portions of the contact structures at least partially overlaps an upper surface of the isolation pattern and the other one does not overlap the upper surface of the isolation pattern.

In accordance with an example embodiment of the inventive concepts, a semiconductor device is provided. The semiconductor includes cell isolation regions to define cell active regions. A pair of isolating gate lines are disposed in a pair of isolating gate trenches that intersect the cell active regions and the cell isolation regions. A pair of cell gate lines are disposed in a pair of cell gate trenches that intersect the cell active regions and the cell isolation regions. The pair of cell gate lines are disposed between the pair of isolating gate lines. A pair of isolation patterns are disposed on the pair of isolating gate lines. A cell interconnection structure is disposed between the pair of isolation patterns. The cell interconnection structure is disposed on the cell active regions and the cell isolation regions. Cell contact structures are disposed between the pair of isolation patterns and the cell interconnection structure. The cell structures are disposed on the cell active regions. Insulating patterns are disposed between the pair of isolation patterns and the cell interconnection structure. The insulating patterns are disposed on the cell isolation regions.

In an example embodiment, the pair of isolating gate lines and the pair of cell gate lines may have a line shape extending in a first direction, and the cell active regions and the cell isolation regions may have a line shape extending in a second direction substantially perpendicular to the first direction.

In an example embodiment, the cell interconnection structure and the pair of isolation patterns may have a line shape extending in the first direction.

In an example embodiment, the cell interconnection structure may include a contact portion in contact with the cell active region between the pair of cell gate lines and an interconnection portion on the contact portion, wherein the contact portion of the cell interconnection structure may have a line shape extending in the first direction.

In an example embodiment, the semiconductor device includes a peripheral isolation region defining a peripheral active region, a peripheral gate structure intersecting the peripheral active region, peripheral source and drain regions disposed in the peripheral active region at both sides of the peripheral gate structure, peripheral contact structures disposed on the peripheral source and drain regions, and cell drain regions disposed in the cell active regions under the cell contact structures, wherein the peripheral contact structures include a peripheral contact silicide layer on the peripheral source and drain regions and peripheral contact conductive patterns on the peripheral contact silicide layer, and the cell contact structures include a cell lower contact pattern on the cell drain region, a cell contact silicide layer on the cell lower contact pattern and a cell pattern contact pattern on the cell contact silicide layer, wherein the cell contact silicide layer and the peripheral contact silicide layer are formed of or include the same material and the cell upper contact pattern and the peripheral contact conduction pattern are formed of or include the same material.

A method of forming a semiconductor device according to an example embodiment of the inventive concepts is provided. The method includes forming an isolation region that defines an active region in a semiconductor substrate. The method includes forming gate trenches to intersect the active region and the isolation region, wherein the gate trenches include isolating gate trenches and cell gate trenches. The method includes contemporaneously or simultaneously forming isolating gate lines in the isolating gate trenches and cell gate lines in the cell gate trenches. The method includes contemporaneously or simultaneously forming isolating gate capping patterns on the isolating gate lines and cell gate capping patterns on the cell gate lines. The method includes forming cell interconnection structures and cell interconnection mask patterns that are stacked, for example sequentially stacked on the active region and the isolation region between the cell gate trenches. The method includes forming contact spacer lines on side surfaces of the cell interconnection structures and the cell interconnection mask patterns. The method includes forming isolation patterns on the isolating gate capping patterns. The method includes forming contact spacer patterns by, for example, patterning the contact spacer lines.

The step of forming of the cell interconnection structure and the cell interconnection mask pattern may include forming a buffer layer on the semiconductor substrate having the isolating gate capping patterns and cell gate capping patterns, forming a lower layer on the buffer layer, and forming a contact groove that passes through the buffer layer and the lower layer and that exposes a source region in the active region. The step of forming of the cell interconnection structure may also include forming an interconnection lower line that fills the contact groove, forming an interconnection upper layer on the interconnection lower line and the lower layer, forming the cell interconnection mask pattern on the interconnection upper layer, and forming an interconnection lower pattern and an interconnection upper pattern that are stacked, for example sequentially stacked by etching the interconnection upper layer, the lower layer, and the interconnection lower line, which are under the cell interconnection mask pattern, using the cell interconnection mask pattern as an etching mask.

In an example embodiment, the method may further include forming the cell gate lines and a pair of isolating gate lines in a pair of isolating gate trenches that intersect the active region and the isolation region, and forming the cell gate capping patterns on the cell gate lines and the isolating gate capping patterns on the isolating gate lines, wherein the cell gate lines are formed between the pair of isolating gate lines.

In an example embodiment, the method may further include performing an etching process to expose the isolating gate capping patterns after the contact spacer lines is formed, and forming the isolation patterns on the exposed isolating gate capping patterns before the contact spacer lines are patterned.

In an example embodiment, the method may further include forming second holes that expose drain regions in the active region by removing the contact spacer patterns, forming lower contact patterns at least partially fill the second holes, forming upper contact patterns on the lower contact patterns, forming variable resistance structures on the upper contact patterns, and forming a bit line on the variable resistance structures.

A method of forming a semiconductor device according to an example embodiment of the inventive concepts is provided. The method includes forming a cell isolation region that defines a cell active region. The method includes forming gate lines in gate trenches that intersect the cell active region and the cell isolation region, wherein the gate lines include a pair of isolating gate lines, and a pair of cell gate lines between the pair of isolating gate lines. The method includes forming isolating gate capping patterns on the pair of isolating gate lines and cell gate capping patterns on the pair of cell gate lines. The method includes forming a cell interconnection structure and a cell interconnection mask pattern that are stacked, for example sequentially stacked on the active region and the isolation region between the pair of cell gate lines. The method includes forming contact spacer lines on side surfaces of the cell interconnection structure. The method includes forming isolation patterns on the isolating gate capping patterns. The method includes forming first holes and contact spacer patterns by patterning the contact spacer line, and forming insulating patterns in the first holes.

In an example embodiment, the contact spacer patterns may be formed on the cell active region, and the first holes may be formed on the isolation region.

In an example embodiment, the method may further include forming second holes that expose the active region by removing the contact spacer patterns after forming the insulating patterns, and forming contact structures in the second holes.

In an example embodiment, the method may further include forming interconnection spacers on the side surfaces of the cell interconnection structure before forming the contact spacer lines.

In an example embodiment, the method may further include forming a peripheral isolation region that defines a peripheral active region while forming the cell isolation region, and forming a peripheral gate electrode and a peripheral gate mask pattern that are stacked, for example sequentially stacked on the peripheral active region while forming the cell interconnection structure and the cell interconnection mask pattern.

A method of forming a semiconductor device according to an example embodiment of the inventive concepts is provided. The method includes forming an isolation region in a semiconductor substrate that defines an active region. The method includes forming gate trenches to intersect the active region and the isolation region, wherein the gate trenches include isolating gate trenches and cell gate trenches. The method includes forming isolating gate lines in the isolating gate trenches and cell gate lines in the cell gate trenches, contemporaneously or simultaneously. The method includes forming isolating gate capping patterns on the isolating gate lines and cell gate capping patterns on the cell gate lines, contemporaneously or simultaneously. The method includes forming cell interconnection structures and cell interconnection mask patterns that are stacked, for example sequentially stacked on the active region and the isolation region between the cell gate trenches. The method includes forming contact spacer lines on side surfaces of the cell interconnection structures and the cell interconnection mask patterns. The method includes forming isolation patterns on the isolating gate capping patterns. The method includes forming contact spacer patterns by patterning the contact spacer lines.

In an example embodiment, the contact spacer patterns may be formed on the active region, and the contact spacer lines may be patterned to form first holes on the isolation region between the contact spacer patterns.

In an example embodiment, the method may further include forming insulating patterns in the first holes, forming second holes that expose the active region by removing the contact spacer patterns, and forming contact structures in the second holes.

In an example embodiment, the method may further include forming data storage elements on the contact structures, and forming a bit line on the data storage elements.

In an example embodiment, the method may further include forming interconnection spacers on the side surfaces of the cell interconnection structures and the cell interconnection mask patterns before forming the contact spacer lines.

In an example embodiment, the method may further include performing an etching process to expose the active region at both sides of the cell interconnection structures before forming the contact spacer lines, forming insulating patterns in the first holes after forming the first holes, forming lower contact patterns by at least partially etching the contact spacer patterns after formation of the insulating patterns, and forming upper contact patterns on the lower contact patterns.

In an example embodiment, the isolation patterns may be formed to have a line shape.

In an example embodiment, the method may further include forming gate dielectric layers on a surface of the active region exposed by the gate trenches before forming the isolating gate lines and the cell gate lines.

In an example embodiment, the forming of the cell interconnection structures and the cell interconnection mask patterns includes forming a buffer layer that is insulating on a semiconductor substrate having the isolating gate capping patterns and the cell gate capping patterns, forming an lower layer on the buffer layer, forming contact grooves which pass through the lower layer and the buffer layer and expose the isolating gate capping patterns, forming interconnection lower lines in the contact grooves, forming an interconnection intermediate layer and an interconnection upper layer on the interconnection lower lines and the lower layer, forming cell interconnection mask patterns on the interconnection upper layer, and etching the interconnection upper layer, the interconnection intermediate layer, the lower layer, and the interconnection lower lines using the cell interconnection mask patterns as an etching mask.

In an example embodiment, the cell interconnection mask patterns may overlap the interconnection lower lines and have a smaller width than the interconnection lower lines.

It is noted that example embodiments of the inventive concepts described with respect to one example embodiment, may be incorporated in a different embodiment although not specifically described relative thereto. That is, all example embodiments and/or features of any embodiment can be combined in any way and/or combination. These and other objects of the inventive concepts are explained in detail in the specification set forth below

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings:

FIGS. 5A and 5B are cross-sectional views illustrating an example of a semiconductor device according to an example embodiment of the inventive concepts.

FIGS. 6A to 19B are cross-sectional views illustrating an example of a method for forming a semiconductor device according to an example embodiment of the inventive concepts.

DETAILED DESCRIPTION OF THE EMBODIMENTS

Figure 1:
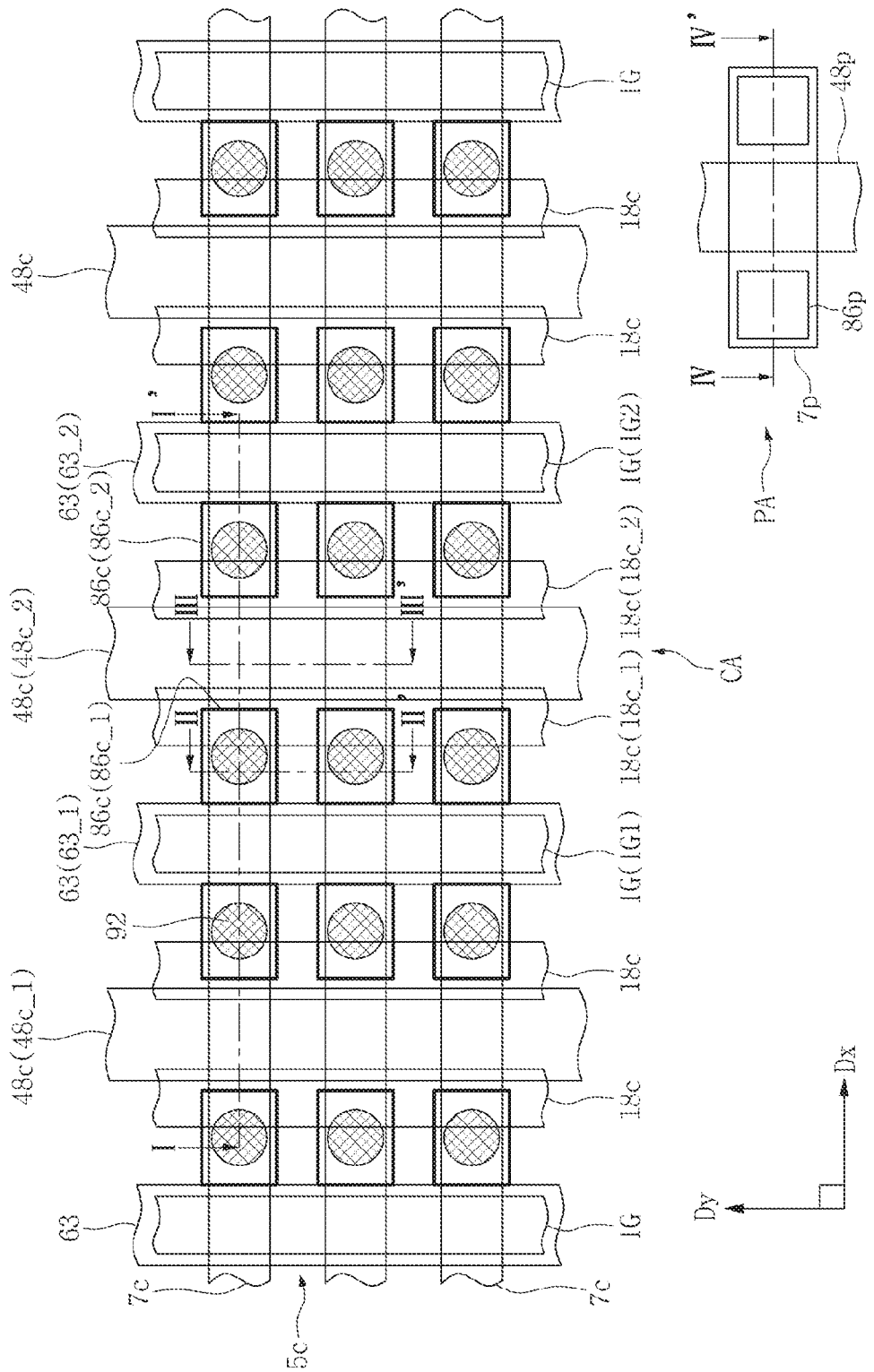
FIG. 1 is a top plain view illustrating a semiconductor device according to embodiments of the inventive concepts.

Advantages and features of the inventive concepts and methods of achieving them will be made apparent with reference to the accompanying figures and the embodiments to be described below in detail. However, the inventive concepts should not be limited to the embodiments set forth herein, and may be construed as various embodiments in different forms. Rather, these embodiments are provided so that disclosure of the inventive concepts is thorough and complete, and fully conveys the inventive concepts to those of ordinary skill in the art. The inventive concepts is defined by the appended claims. In the drawings, the sizes or thicknesses of layers and regions are exaggerated for clarity. Like numbers refer to like elements throughout the entire text herein.

It will be understood that when an element is referred to as being "on," "connected" or "coupled" to another element, it can be directly on, connected or coupled to the other element or intervening elements that may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

The example embodiments of the invention will be described with reference to cross-sectional views, plan views, and block diagrams, which are ideal example views. Forms of the embodiments may be modified by the manufacturing technology and/or tolerances. Therefore, the embodiments of the invention are not intended to be limited to illustrated specific forms, and include modifications of forms generated according to the manufacturing processes. Therefore, areas illustrated in the drawings have overview properties, shapes of the areas are intended to illustrate particular forms of the areas of a device, and are not intended to limit to the scope of the invention.

Thicknesses of layers and areas in the drawings may be exaggerated for clarity. It will be understood that when a layer is referred to as being "on" another layer or a substrate, it can be directly formed on another layer or the substrate, or a third layer can be interposed between the layers. In the drawings, the sizes and relative sizes of layers and regions may be exaggerated for clarity. Like numerals refer to like elements throughout.

Spatially relative terms, such as "upper end," "lower end," "upper surface," "lower surface," "upper part," "lower part," and the like, may be used herein for ease of description to distinguish relative locations of elements. For example, when an upper part is used as a top in the drawing and a lower part is used as a bottom in the drawing for convenience, the upper part could be termed the lower part and the lower part could be termed the upper part without departing from the scope of the example embodiments. The device may be otherwise oriented (rotated 90 degrees or at other orientations) and the spatially relative descriptors used herein interpreted accordingly.

Further, although terms, such as "upper," "intermediate," "lower," and the like, may be used herein for ease of description to distinguish relative locations of elements, the inventive concepts should not be limited by these terms. Therefore, the terms, such as "upper," "intermediate," "lower," and the like, may also be used to describe the elements in the specification by being replaced by terms, such as "first," "second," "third," and the like.

It will be understood that, although the terms including ordinal numbers such as "first," "second," etc. may be used herein to describe various elements, components, regions, layers and/or sections, these elements are not limited by these terms. These terms are used only to distinguish one element, component, region, layer and/or section from another. For example, a second element, component, region, layer and/or section could be termed a first element without departing from the teachings of the inventive concepts, and similarly a first element, component, region, layer and/or section could also be termed a second element, component, region, layer and/or section without departing from the teachings of example embodiments.

The terminology used herein is for the purpose of describing particular embodiments only and is not intended to be limiting of the inventive concepts.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

In the drawing figures, the dimensions of layers and regions may be exaggerated for clarity of illustration. Like reference numerals refer to like elements throughout. The same reference numbers indicate the same components throughout the specification.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2A:
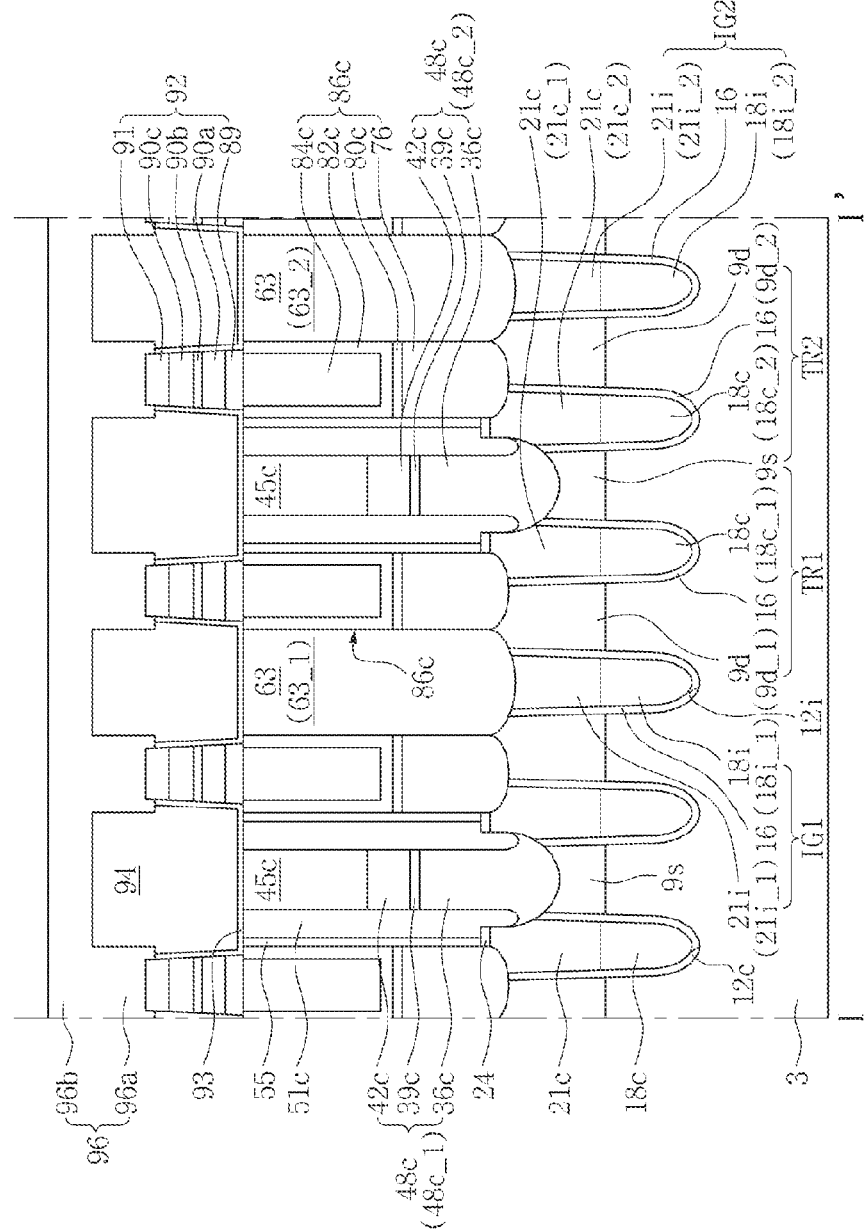
FIGS. 2A and 2B are cross-sectional views illustrating an example of the semiconductor device according to an example embodiment of the inventive concepts.
Figure 2B:
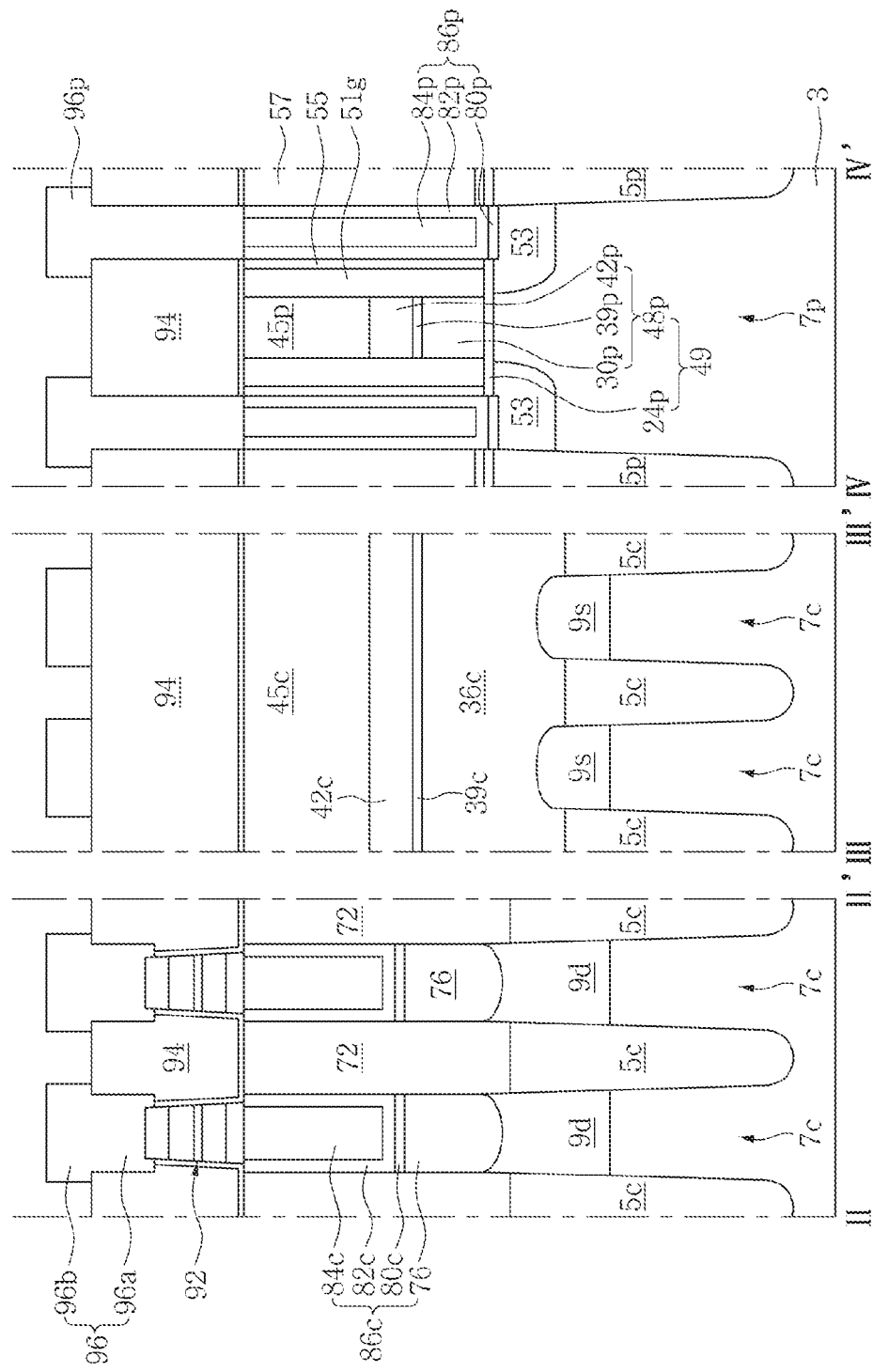
Figure 3:
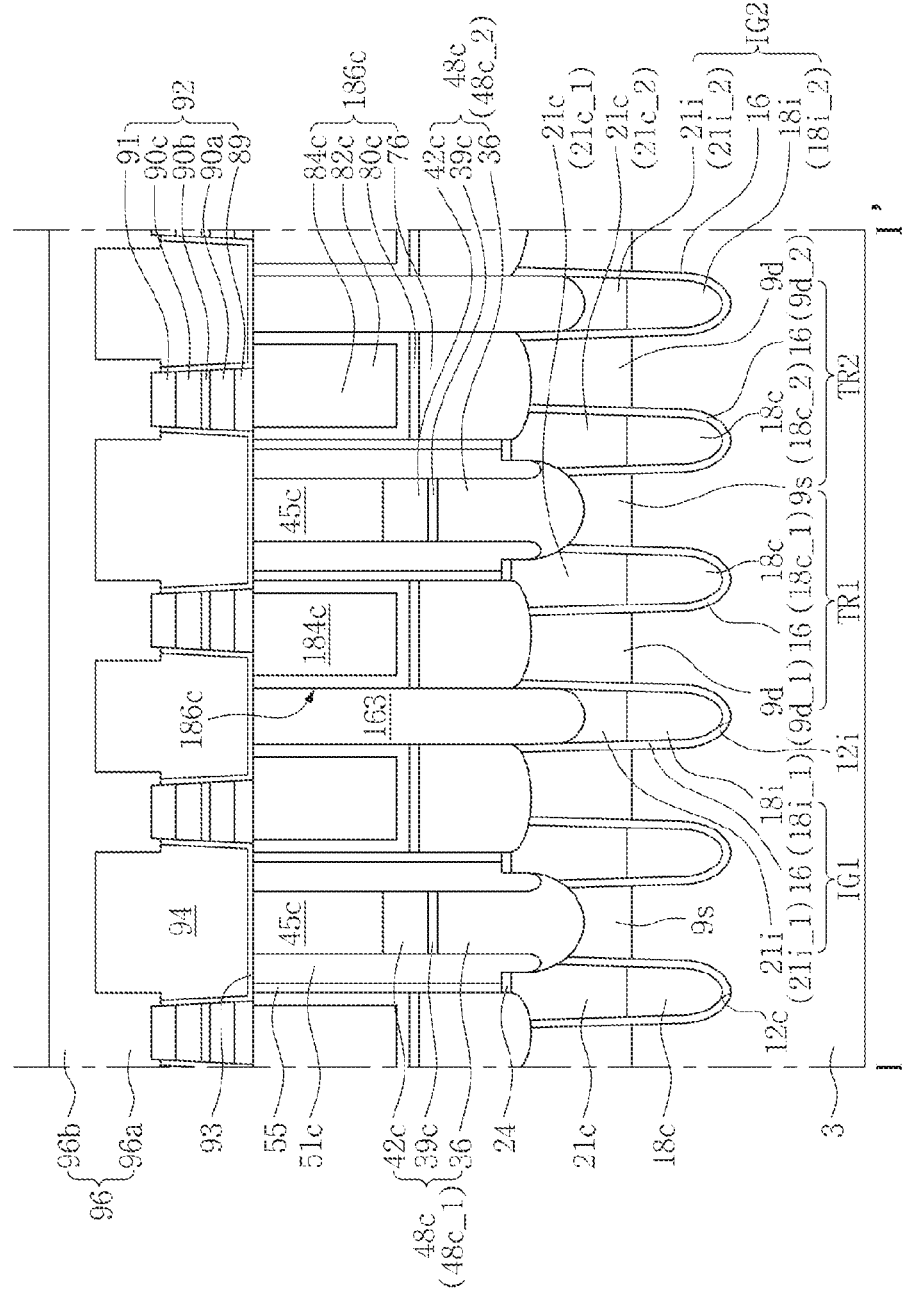
FIG. 3 is a cross-sectional view illustrating an example of the semiconductor device according to an example embodiment of the inventive concepts.

FIG. 1 is a top plain view illustrating a semiconductor device according to example embodiments of the inventive concepts. FIGS. 2A and 2B are cross-sectional views illustrating an example of the semiconductor device according to an example embodiment of the inventive concepts. FIG. 3 is a cross-sectional view illustrating an example of the semiconductor device according to an example embodiment of the inventive concepts. In FIGS. 2A and 2B, FIG. 2A shows a region taken along line I-I' in FIG. 1 and FIG. 2B shows regions taken along lines II-II', III-III' and IV-IV' in FIG. 1. FIG. 3 shows a region taken along line I-I' in FIG. 1.

First, referring to FIGS. 1, 2A and 2B, an example of a semiconductor device according to an example embodiment of the inventive concepts will be described.

Referring to FIGS. 1, 2A and 2B, isolation regions that define active regions may be disposed in a semiconductor substrate 3. The semiconductor substrate 3 may be a substrate formed using a semiconductor material such as, for example, silicon. The active regions may include cell active regions 7c disposed in a cell array region CA of the semiconductor substrate 3 and a peripheral active region 7p disposed in a peripheral circuit region PA of the semiconductor substrate 3.

The isolation region may include cell isolation regions 5c that define the cell active regions 7c and a peripheral isolation region 5p that defines the peripheral active region 7p. The isolation regions may be formed using a shallow trench isolation process. The cell active regions 7c may be formed in line shapes that are substantially parallel to each other. The cell isolation regions 5c may define the cell active regions 7c and may be formed in a line shape between the cell active regions 7c.

Gate trenches may be disposed intersecting the cell active regions 7c and the cell isolation regions 5c. The gate trenches may include cell gate trenches 12c and isolating gate trenches 12i. A pair of cell gate trenches 12c may be disposed between a pair of isolating gate trenches 12i.

Gate lines 18i and 18c and gate capping patterns 21i and 21c thereon may be disposed in the gate trenches. The gate lines 18i and 18c may be formed of or include a conductive material such as, for example, a metal nitride and/or a metal. The gate capping patterns 21i and 21c may be formed of or include an insulating material such as, for example, a silicon nitride.

The gate lines 18i and 18c may have a line shape extending in a direction substantially perpendicular to the cell active regions 7c. For example, the gate lines 18i and 18c may have a line shape extending in a first direction Dy, and the cell active regions 7c may have a line shape extending in a second direction Dx substantially perpendicular to the first direction Dy.

The gate lines and the gate capping patterns disposed in the cell gate trenches 12c may be referred to as cell gate lines 18c and cell gate capping patterns 21c, respectively. The gate lines and the gate capping patterns disposed in the isolating gate trenches 12i may be referred to as isolating gate lines 18i and isolating gate capping patterns 21i, respectively.

Gate dielectric layers 16 may be interposed between the cell active regions 7c and the gate lines 18i and 18c and between the cell active regions 7c and the gate capping patterns 21i and 21c.

The gate dielectric layer 16, the isolating gate lines 18i and the isolating gate capping patterns 21i disposed in the isolating gate trenches 12i may constitute isolating gate patterns IG1 and IG2. A pair of the cell gate lines 18c may be disposed between a pair of the isolating gate patterns IG1 and IG2 adjacent to each other.

Impurity regions 9s and 9d may be disposed in the cell active regions 7c. The impurity regions 9s and 9d may include common source regions 9s and drain regions 9d.

A pair of the drain regions 9d adjacent to each other may be disposed between a pair of the common source regions 9s adjacent to each other.

The common source regions 9s may each be disposed in the active region 7c between the pair of cell gate lines 18c_1 and 18c_2 adjacent to each other.

The drain regions 9d may each be disposed, or at least one of the drain regions 9d may be disposed, in active regions 7c between the isolating gate patterns IG1 and IG2 and the cell gate lines 18c. For example, the drain regions 9d may each be disposed in an active region between an isolating gate pattern and a cell gate line that are adjacent to each other.

A pair of drain regions 9d_1 and 9d_2 may be disposed between the pair of the isolating gate patterns IG1 and IG2. The common source region 9s may be disposed between the pair of drain regions 9d_1 and 9d_2.

First and second cell transistors TR1 and TR2 may be disposed between the pair of isolating gate patterns IG1 and IG2 adjacent to each other. The first and second cell transistors TR1 and TR2 may share the common source region 9s. The first cell transistor TR1 may include the common source region 9s, a first drain region 9d_1 and a first cell gate line 18c_1. The second cell transistor TR2 may include the common source region 9s, a second drain region 9d_2 and a second cell gate line 18c_2.

Isolation patterns 63 may be disposed on the semiconductor substrate 3. The isolation patterns 63 may overlap the isolating gate patterns IG1 and IG2. The isolation patterns 63 may extend in the first direction Dy and have line shapes that are substantially parallel to each other. The isolation patterns 63 may include a first isolation pattern 63_1 overlapping the first isolating gate pattern IG1 and a second isolation pattern 63_2 overlapping the second isolating gate pattern IG2.

The isolation patterns 63 may be formed of or include an insulating material such as, for example, a silicon nitride. The isolation patterns 63 may be in contact with the isolating gate capping patterns 21i of the isolating gate patterns IG1 and IG2.

In an example embodiment, the isolating gate capping patterns 21i and the isolation patterns 63 may be formed of or include a nitride-based insulating material. For example, the isolating gate capping patterns 21i and the isolation patterns 63 may be formed of or include a silicon nitride.

Cell interconnection structures 48c and a peripheral gate electrode 48p may be disposed on the semiconductor substrate 3.

The cell interconnection structures 48c may extend in the first direction Dy and have line shapes that are substantially parallel to each other. The cell interconnection structures 48c may be substantially parallel with the isolation patterns 63. The isolation patterns 63 may be disposed between the cell interconnection structures 48c. For example, a first isolation pattern 63_1 may be disposed between a pair of first and second cell interconnection structures 48c_1 and 48c_2. Further, the first isolation pattern 63_1 may be separated by a certain distance from the first and second cell interconnection structures 48c_1 and 48c_2.

The cell interconnection structures 48c may have an upper surface disposed to be coplanar with an upper surface of the peripheral gate electrode 48p. The cell interconnection structures 48c may have a lower surface disposed not to be coplanar with a lower surface of the peripheral gate electrode 48p. The cell interconnection structures 48c may have a lower surface disposed to have a level lower than the lower surface of the peripheral gate electrode 48p.

The cell interconnection structures 48c may each include an interconnection lower pattern 36c, an interconnection intermediate pattern 39c and an interconnection upper pattern 42c that are stacked, for example sequentially stacked. The peripheral gate electrode 48p may include a gate lower pattern 30p, a gate intermediate pattern 39p and a gate upper pattern 42p that are stacked, for example sequentially stacked.

The interconnection lower pattern 36c and the gate lower pattern 30p may be formed of or include the same material, for example, polysilicon. The interconnection intermediate pattern 39c and the gate lower pattern 30p may be formed of or include the same material, for example, a metal silicide and/or a metal nitride. The interconnection upper pattern 42c and the gate upper pattern 42p may be formed of or include the same material, for example, a metal material such as, for example, tungsten (W).

The interconnection lower patterns 36c of the cell interconnection structures 48c may have a line shape extending in the first direction Dy. The interconnection lower patterns 36c of the cell interconnection structures 48c may overlap and be in contact with the cell active regions 7c and the cell isolation regions 5c between the cell active regions 7c. Lower surfaces of the interconnection lower patterns 36c that overlap the cell active regions 7c may be higher than lower surfaces of the interconnection lower patterns 36c that overlap the cell isolation regions 5c.

The cell active regions 7c under the interconnection lower patterns 36c may be a shape protruding more than the cell isolation regions 5c. The interconnection lower patterns 36c may cover and be in contact with upper and side surfaces of the cell active regions 7c protruding more than the cell isolation regions 5c. The interconnection lower patterns 36c may cover and be in contact with upper and side surfaces of the common source regions 9s.

Cell interconnection mask patterns 45c, which are self-aligned with the cell interconnection structures 48c, may be disposed on the cell interconnection structures 48c. A peripheral gate mask pattern 45p, which is self-aligned with the peripheral gate electrode 48p, may be disposed on the peripheral gate electrode 48p. The cell interconnection mask patterns 45c and the peripheral gate mask pattern 45p may be formed of or include the same material, for example, such as, for example, a silicon nitride.

Cell contact structures 86c may be disposed on the drain regions 9d in the cell array region CA and peripheral contact structures 86p may be disposed on peripheral source and drain regions 53 in the peripheral circuit region PA. The cell contact structures 86c and the peripheral contact structures 86p may have upper surfaces that are disposed at the same level.

The cell contact structures 86c may be disposed between the isolation patterns 63 and the cell interconnection structures 48c and disposed on the cell active regions 7c. The cell contact structures 86c may overlap the cell active regions 7c, in which the drain regions 9d are formed, and overlap the cell gate capping patterns 21c.

The cell contact structures 86c may overlap the cell active regions 7c and the cell gate capping patterns 21c but not overlap the isolating gate capping patterns 21i. For example, one cell contact structure 86c may overlap a part of one cell active region 7c and one cell gate capping pattern 21c but not overlap the isolating gate capping patterns 21i.

The cell contact structures 86c arranged, for example sequentially arranged in the second direction Dx may be separated by the isolation patterns 63. For example, first and second cell contact structures 86c_1 and 86c_2 may be disposed at both sides of the first isolation pattern 63_1. The first isolation pattern 63_1 that is in contact with an isolating gate capping pattern 21i of the first isolating gate pattern IG1 and is disposed to have a line shape may reduce or prevent a failure between the first and second cell contact structures 86c_1 and 86c_2, for example, an electrical short and/or bridge failure.

The cell contact structures 86c may include cell lower contact patterns 76, cell contact silicide layers 80c, cell barrier patterns 82c and cell upper contact patterns 84c. The cell lower contact patterns 76 may be in contact with and electrically connected to the drain regions 9d. The cell contact silicide layers 80c may be disposed on the cell lower contact patterns 76 and be in contact with the cell lower contact patterns 76. The cell upper contact patterns 84c may be disposed on the cell contact silicide layers 80c. The cell barrier patterns 82c may cover a bottom and a side surface of the cell upper contact patterns 84c.

The peripheral contact structures 86p may include peripheral contact silicide layers 80p, peripheral barrier patterns 82p and peripheral contact conductive patterns 84p. The peripheral contact silicide layers 80p may be in contact with the peripheral source and drain regions 53. The peripheral contact silicide layers 80p may be disposed at a different level from the cell contact silicide layers 80c, and may be formed of or include the same material as the cell contact silicide layers 80c. For example, the peripheral contact silicide layers 80p may be disposed at a lower level than the cell contact silicide layers 80c, the peripheral contact silicide layers 80p and the cell contact silicide layers 80c may be formed of or include a material such as, for example, TiSi, TaSi, CoSi or NiSi.

The peripheral contact conductive patterns 84p may be disposed on the peripheral contact silicide layers 80p. The peripheral contact conductive patterns 84p may be formed of or include the same material as the cell upper contact patterns 84c, for example, tungsten (W). The peripheral barrier patterns 82p may cover a bottom and a side surface of the peripheral contact conductive patterns 84p. The peripheral barrier patterns 82p may include the same material as the cell barrier patterns 82c, for example, a metal nitride such as, for example, TiN, TaN, WN or the like.

Interconnection spacers 51c may be disposed on side surfaces of the cell interconnection structures 48c and the cell interconnection mask patterns 45c. The interconnection spacers 51c may be interposed between the cell interconnection structures 48c and the cell contact structures 86c. The lowermost end of the interconnection spacers 51c may be higher than the lowermost end of the interconnection lower patterns 36c. The interconnection spacers 51c may be formed of or include an insulating material.

Peripheral gate spacers 51p may be disposed on side surfaces of the peripheral gate electrode 48p and the peripheral gate mask pattern 45p. The peripheral gate spacers 51p may be interposed between the peripheral contact structures 86p and the peripheral gate electrode 48p, and formed of or include an insulating material. The lowermost end of the peripheral gate spacers 51p may be disposed higher than the lowermost end of the interconnection spacers 51c.

An insulating liner 55 may be disposed. The insulating liner 55 may be interposed between the interconnection spacers 51c and the cell contact structures 86c, and interposed between the peripheral gate spacers 51p and the peripheral contact structures 86p. The insulating liner 55 may be formed of or include a silicon nitride. A lower surface of the insulating liner 55 may be higher than the lowermost end of the interconnection spacers 51c.

The interconnection spacers 51c and the insulating liner 55 may reduce or prevent a failure between the cell contact structures 86c and the cell interconnection structures 48c, for example, an electrical short and/or a bridge failure.

A lower buffer insulating layer 24 may be disposed under the insulating liner 55 in the cell array region CA. The lower buffer insulating layer 24 may substantially vertically overlap some of the interconnection spacers 51c.

Insulating patterns 72 may be disposed on the semiconductor substrate 3. The insulating patterns 72 may be disposed between the isolation patterns 63 and the cell interconnection structures 48c, and on the cell isolation regions 5c. The insulating patterns 72 may be disposed between the cell contact structures 86c, and in contact with the cell isolation regions 5c. The insulating patterns 72 may be formed of or include an insulating material such as, for example, a silicon nitride.

The insulating patterns 72 may be in contact with the cell isolation regions 5c and may have a bottom located at a level lower than a bottom of the cell contact structures 86c. The insulating patterns 72 described above may serve to reduce or prevent a failure between the cell contact structures 86c arranged in the first direction Dy, for example, an electrical short and/or bridge failure.

Data storage elements 92 of a memory device may be disposed on the cell contact structures 86c. The data storage elements 92 may be variable resistance structures. The data storage elements 92 may include memory cells that store data of a magnetic random access memory (MRAM). The data storage elements 92 may include memory cells that store data of a spin transfer torque MRAM (STT-MRAM).

Each of the data storage elements 92 may include a base layer 89, a magnetization layer 90a, a tunnel barrier layer 90b, a free layer 90c and a capping layer 91 that are stacked, for example sequentially stacked. The base layer 89 may be formed of or include a conductive material and include a lower electrode or a seed layer. The base layer 89 may include a metal material such as, for example, Ru, Ta, Ti or the like. The capping layer 91 may be formed of or include a conductive material such as, for example, Cu, Ta, Al, Au, Ti, TiN, TaN or the like.

The magnetization layer 90a may be formed of or include a plurality of layers. For example, the magnetization layer 90a may include a lower fixed layer, a spacer, and an upper fixed layer that are stacked, for example sequentially stacked. The lower fixed layer may be formed of or include a magnetic material in which a magnetization direction may be fixed. The spacer may be formed of or include a non-magnetic material. The upper fixed layer may be formed of or include a magnetic material in which a magnetization direction may be fixed. The tunnel barrier layer 90b may be formed of or include a material such as, for example, magnesium oxide (MgO). The free layer 90c may include a magnetic material in which a magnetization direction may be changed.

An upper interlayer insulating layer 94 may be disposed on the isolation patterns 63, the cell interconnection mask patterns 45c, the peripheral gate mask pattern 45p, the peripheral interlayer insulating layer 57, the cell contact structures 86c and the peripheral contact structures 86p. The upper interlayer insulating layer 94 may be disposed on side surfaces of the data storage elements 92.

A protection liner 93 that insulates may be disposed between side surfaces of the upper interlayer insulating layer 94 and the data storage elements 92.

Bit line structures 96 and peripheral interconnection structures 96p may be disposed on the upper interlayer insulating layer 94. The bit line structures 96 may each include bit lines 96b that have a line shape extending in the second direction Dx, and contact portions 96a that pass through the upper interlayer insulating layer 94 and are physically and electrically connected to the data storage elements 92. The peripheral interconnection structures 96p may include contact portions that pass through the upper interlayer insulating layer 94 and are physically and electrically connected to the peripheral contact structures 86p.

In one example of a semiconductor device according to an example embodiment of the inventive concepts, the isolation patterns 63 may have a greater width than the isolating gate patterns IG1 and IG2. However, the inventive concepts are not limited thereto. For example, as shown in FIG. 3, the inventive concepts may include isolation patterns 163 which have a width equal to or less than a width of the isolating gate patterns IG1 and IG2. Since a width of a cell contact structure 186c may increase in proportion to a decrease in a width of the isolation pattern 163, contact resistance characteristic may be enhanced due to the increase in width of the cell contact structure 186c.

Figure 4:
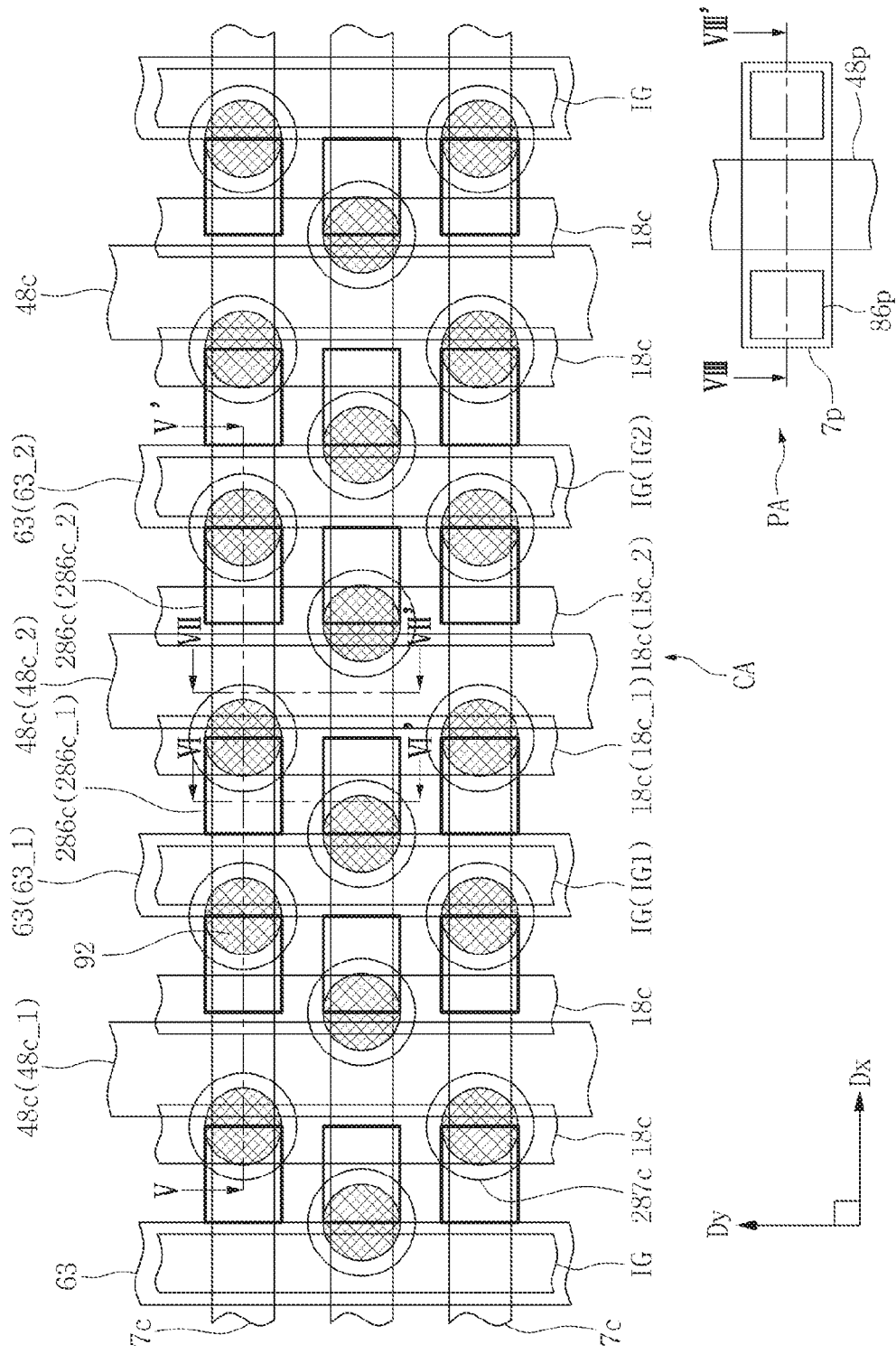
FIG. 4 is a top plain view illustrating an example of a semiconductor device according to an example embodiment of the inventive concepts.
Figure 5A:
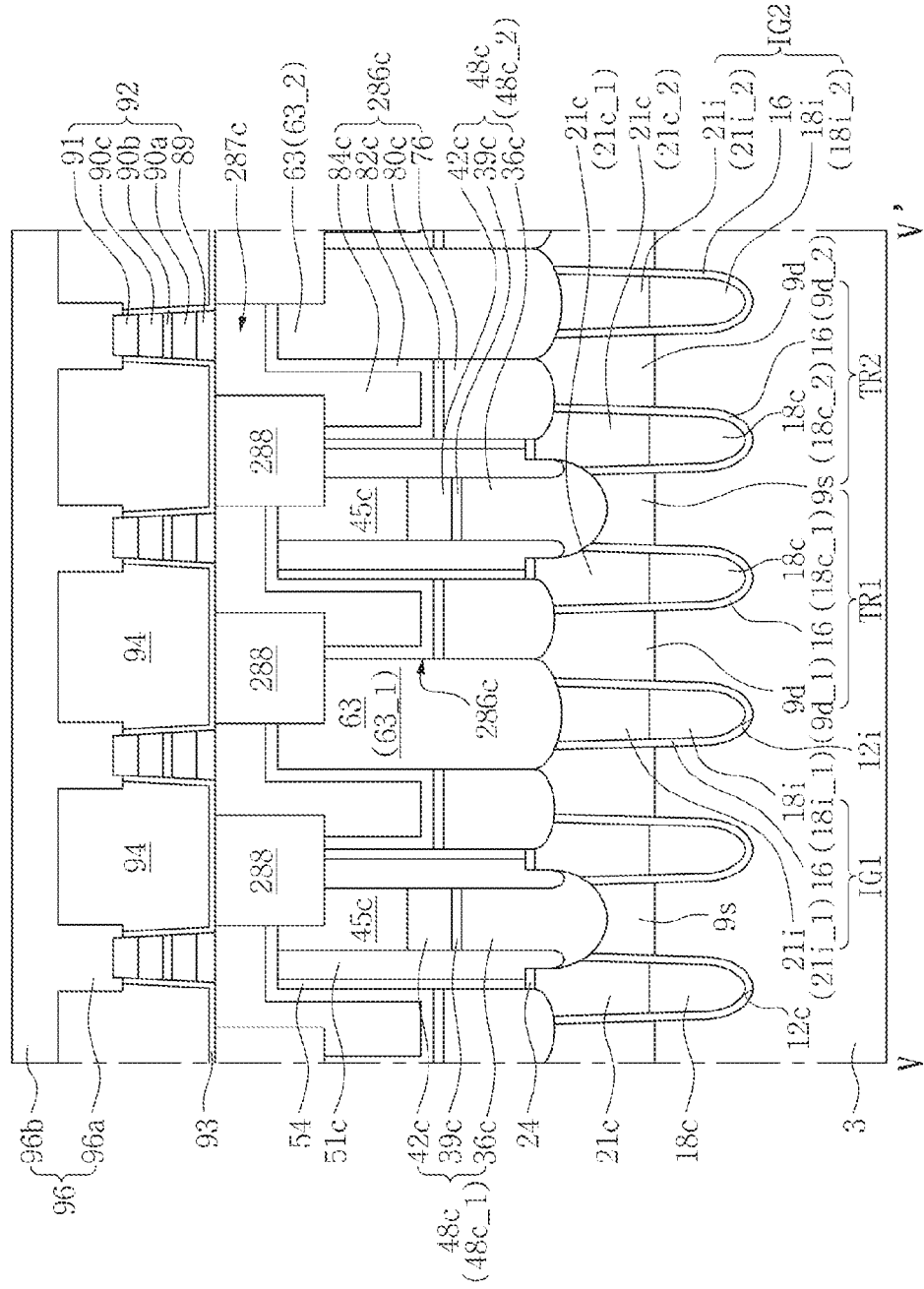

Next, referring to FIGS. 4, 5A and 5B, an example of a semiconductor device according to an example embodiment of the inventive concepts will be described. FIG. 4 is a top plain view illustrating an example of a semiconductor device according to an example embodiment of the inventive concepts. FIGS. 5A and 5B are cross-sectional views illustrating an example of the semiconductor device according to an example embodiment of the inventive concepts. In FIGS. 5A and 5B, FIG. 5A shows a region taken along line V-V' in FIG. 4, and FIG. 5B shows regions taken along lines VI-VI', VII-VII' and VIII-VIII' in FIG. 4.

Referring to FIGS. 4, 5A and 5B, as described with reference to FIGS. 1, 2A and 2B, the cell and peripheral isolation regions 5c and 5p that are disposed in the semiconductor substrate 3 and define the cell and peripheral active regions 7c and 7p may be provided. Further, the isolating gate patterns IG1 and IG2 and the cell transistors TR1 and TR2 therebetween, which are as described with reference to FIGS. 1, 2A and 2B, may be provided. Further, the cell interconnection structures 48c, the peripheral gate electrode 48p, the cell interconnection mask patterns 45c, the peripheral gate mask pattern 45p, the isolation patterns 63, and the insulating patterns 72, which are as described with reference to FIGS. 1, 2A and 2B, may be provided.

Cell contact structures 286c may be disposed on the drain regions 9d in the cell array region CA. The cell contact structures 286c may overlap the cell active regions 7c in which the drain regions 9d are formed, and the cell gate capping patterns 21c.

The cell contact structures 286c may have cell pad portions 287c that are disposed between the isolation patterns 63 and the cell interconnection structures 48c, and extend onto upper surfaces of any one of the isolation patterns 63 and the cell interconnection mask patterns 45c. Any one of the cell pad portions 287c of the cell contact structures 286c may overlap at least a part of an upper surface of the isolation pattern 63, and the other cell pad portions 287c may not overlap the upper surface of the isolation pattern 63. For example, any one of the cell contact structures 286c may have a cell pad portion 287c extending onto an upper surface of the isolation pattern among the isolation patterns 63 that is adjacent the cell contact structures 286c and may not overlap an upper surface of the cell interconnection mask patterns 45c. Further, the other cell contact structures 286c may have a cell pad portion 287c extending onto an upper surface of the cell interconnection mask pattern of the cell interconnection mask patterns 45c that is adjacent the cell contact structures 286c and may not overlap an upper surface of the isolation patterns 63.

The cell contact structures 286c may include cell lower contact patterns 76 that are in contact with and electrically connected to the drain regions 9d, cell contact silicide layers 280c disposed on the cell lower contact patterns 76, cell upper contact patterns 284c disposed on the cell contact silicide layers 280c, and cell barrier patterns 282c that cover a bottom and side surface of the cell upper contact patterns 284c. The cell barrier patterns 282c and the cell upper contact patterns 284c that are disposed at a higher level than the isolation patterns 63 and the cell interconnection mask patterns 45c may constitute the cell pad portions 287c of the cell contact structures 286c.

Peripheral contact structures 286p may be disposed on the peripheral source and drain regions 53 in the peripheral circuit region PA. The peripheral contact structures 286p may have peripheral pad portions 287p extending onto an upper surface of the peripheral interlayer insulating layer 57. The peripheral contact structures 286p may include peripheral contact silicide layers 280p that are in contact with and electrically connected to the peripheral source and drain regions 53, peripheral contact conductive patterns 284p disposed on the peripheral contact silicide layers 280p, and peripheral barrier patterns 282p that cover bottoms and side surfaces of the peripheral contact conductive patterns 284p.

A pad insulating layer 288 may be disposed filling between the cell pad portions 287c of the cell contact structures 286c and between the peripheral pad portions 287p of the peripheral contact structures 286p.

Data storage elements 92 may be disposed on the cell pad portions 287c of the cell contact structures 286c. The data storage elements 92 may be arranged in zigzag, or alternating pattern, on a plane. The data storage elements 92 may be the same as described with reference to FIGS. 1, 2A and 2B. The bit line structures 96 and the peripheral interconnection structures 96p, which are as described with reference to FIGS. 1, 2A and 2B, may be disposed on the data storage elements 92.

According to example embodiments of the inventive concepts, a semiconductor device may be provided to reduce or prevent a failure between patterns, for example, an electrical short or bridge failure between patterns. In an example embodiment, the patterns may be the cell contact structures 86c, 186c, and 286c.

A method of forming an example of the semiconductor device according to an example embodiment of the inventive concepts will be described below with reference to FIGS. 1, 2A, 2B, and 6A to 19B. In FIGS. 6A to 19B, FIGS. 6A, 7A, 8A, 9A, 10A, 11A, 12A, 13A, 14A, 15A, 16A, 17A, 18A and 19A are cross-sectional views taken along line I-I' in FIG. 1, and FIGS. 6B, 7B, 8B, 9B, 10B, 11B, 12B, 13B, 14B, 15B, 16B, 17B, 18B and 19B are cross-sectional views taken along lines II-II', III-III' and IV-IV' in FIG. 1.

Figure 6A:
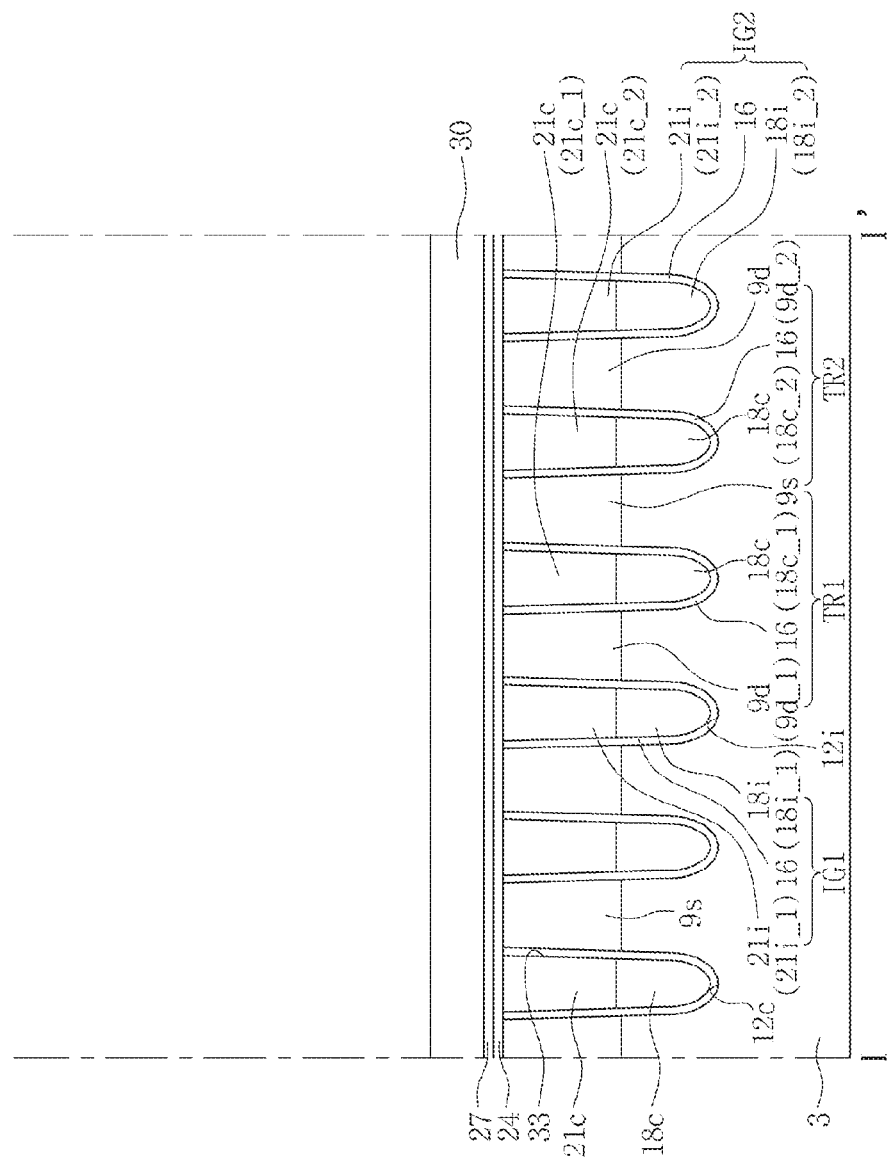

Referring to FIGS. 1, 6A, and 6B, a semiconductor substrate 3 having a cell array region CA and a peripheral circuit region PA may be provided. The semiconductor substrate 3 may be a substrate formed using a semiconductor material such as, for example, silicon. Isolation regions that define active regions may be formed in the semiconductor substrate 3. The isolation region may be formed using a shallow trench isolation process. The active regions may include cell active regions 7c formed on the cell array region CA and a peripheral active region 7p formed on the peripheral circuit region PA. The cell active regions 7c may be formed to be line shapes that are substantially parallel. The isolation regions may include cell isolation regions 5c that define the cell active regions 7c and peripheral isolation regions 5p that define the peripheral active regions 7p. The cell isolation regions 5c may define the cell active regions 7c and be formed to be a line shape between the cell active regions 7c.

Gate trenches intersecting the cell active regions 7c and the cell isolation regions 5c may be formed. The gate trenches may include cell gate trenches 12c and isolating gate trenches 12i. A pair of the cell gate trenches 12c may be formed between a pair of the isolating gate trenches 12i. The gate trenches 12c and 12i may have a line shape extending in a first direction Dy, and the cell active regions 7c may have a line shape extending in a second direction Dx substantially perpendicular to the first direction Dy.

Gate dielectric layers 16 may be formed on surfaces of the cell active regions 7c exposed by the gate trenches. Gate lines 18i and 18c may be formed in the gate trenches, and gate capping patterns 21i and 21c may be formed on the gate lines 18i and 18c. The gate lines 18i and 18c may be formed of or include a conductive material such as, for example, a metal nitride and/or a metal, and the gate capping patterns 21i and 21c may be formed of or include an insulating material such as, for example, a silicon nitride. The gate dielectric layer 16 may be interposed between the cell active regions 7c and the gate lines 18i and 18c and between the cell active regions 7c and the gate capping patterns 21i and 21c.

The gate lines and the gate capping patterns formed in the cell gate trenches 12c may be referred to as cell gate lines 18c and cell gate capping patterns 21c, respectively. Gate lines and gate capping patterns formed in the isolating gate trenches 12i may be referred to as isolating gate lines 18i and isolating gate capping patterns 21i, respectively. The gate dielectric layer 16, the isolating gate lines 18i and the isolating gate capping patterns 21i that are formed in the isolating gate trenches 12i may constitute isolating gate patterns IG1 and IG2.

Impurity regions 9s and 9d may be formed in the cell active regions 7c.

In an example embodiment, the impurity regions 9s and 9d may be formed by, for example, an ion implantation process before the gate trenches 12i, 12c are formed. However, the inventive concepts are not limited thereto. For example, the impurity regions 9s and 9d may be formed by an ion implantation process after the gate lines 18i and 18c and the gate capping patterns 21i and 21c are formed.

Of the impurity regions 9s and 9d, an impurity region that is formed in the active region 7c between a pair of cell gate lines 18c_1 and 18c_2 that are adjacent to each other may be a common source region 9s. An impurity region that is formed in the active region 7c between the isolating gate patterns IG1 and IG2 and the cell gate lines 18c may be a drain region 9d.

First and second cell transistors TR1 and TR2 sharing the common source region 9s between a pair of isolating gate patterns IG1 and IG2 adjacent to each other may be formed. The first cell transistor TR1 may include the common source region 9s, a first drain region 9d_1 and a first cell gate line 18c_1, and the second cell transistor TR2 may include the common source region 9s, a second drain region 9d_2 and a second cell gate line 18c_2.

A lower buffer layer 24, an upper buffer layer 27 and an interconnection lower layer 30 that are stacked, for example sequentially stacked on the cell array region CA may be formed on a semiconductor substrate having the gate capping patterns 21i and 21c and the first and second transistors TR1 and TR2, and a peripheral gate dielectric layer 24p may be formed on the peripheral circuit region PA.

The lower buffer layer 24 and the upper buffer layer 27 may include different insulating materials. For example, the lower buffer layer 24 may include a silicon oxide, and the upper buffer layer 27 may include a silicon nitride. However, the inventive concepts are not limited to these kinds of material and the lower and upper buffer layers 24 and 27 may be formed of or include a combination of various insulating materials. The interconnection lower layer 30 may be formed of or include polysilicon.

Figure 7B:
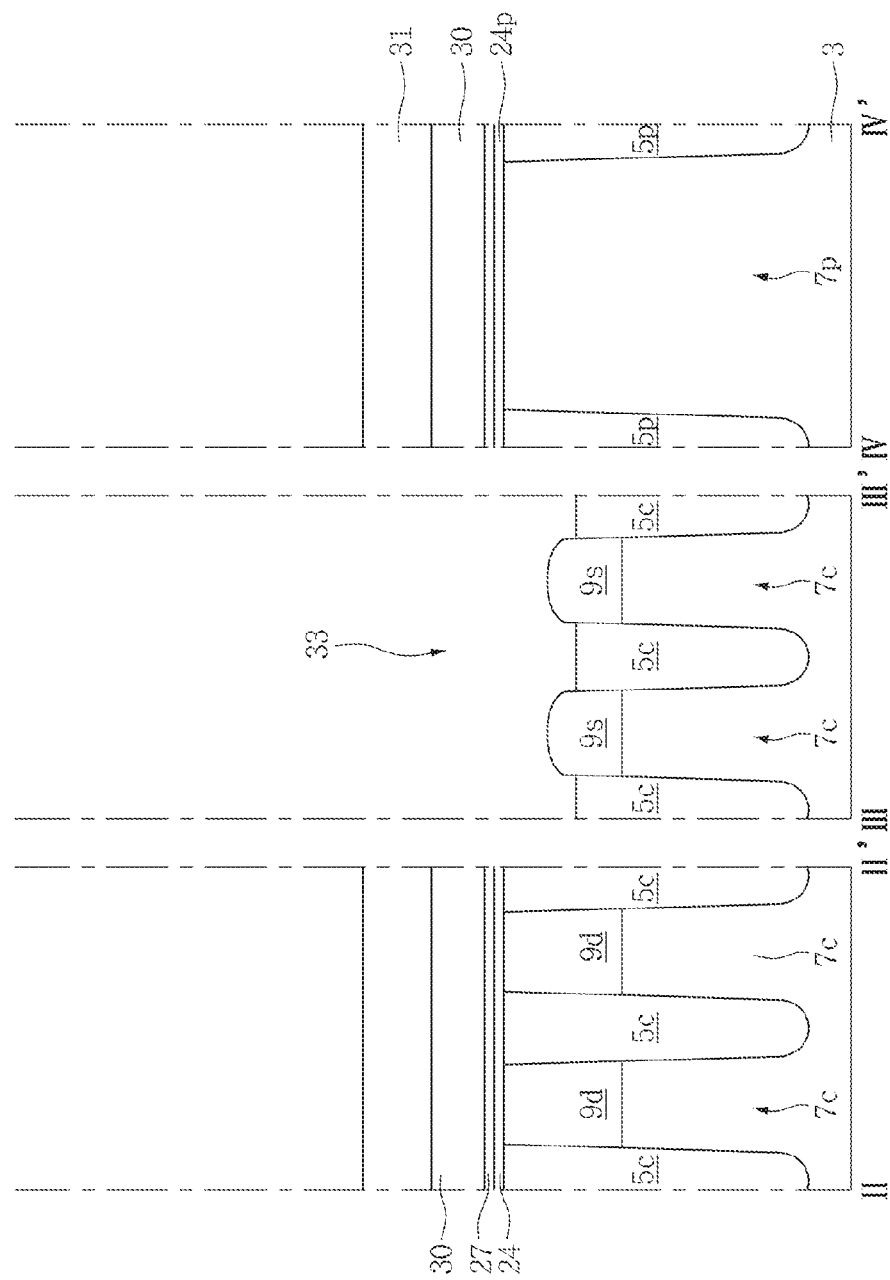

Referring to FIGS. 1, 7A and 7B, contact grooves 33 may be formed to expose the common source region 9s. Forming the contact grooves 33 may include forming a cell mask 31 on the interconnection lower layer 30, performing an etching process using the cell mask 31 as an etching mask, and etching the interconnection lower layer 30, the lower buffer layers 24 and the upper buffer layers 27.

In an example embodiment, during an etching process using the cell mask 31 as an etching mask, the cell active regions 7c, the gate capping patterns 21c and the cell isolation regions 5c are at least partially etched and, thereby, bottoms of the contact grooves 33 may be formed to have a lower level than the uppermost portions of the gate capping patterns 21c.

In an example embodiment, during an etching process using the cell mask 31 as an etching mask, the cell isolation regions 5c are etched more than the cell active regions 7c, in a bottom surface of the contact grooves 33, thereby, upper and side surfaces of the cell active regions 7c may be exposed. In bottoms surface of the contact grooves 33, the cell active regions 7c may be a shape protruding more than the cell isolation regions 5c.

Figure 8A:
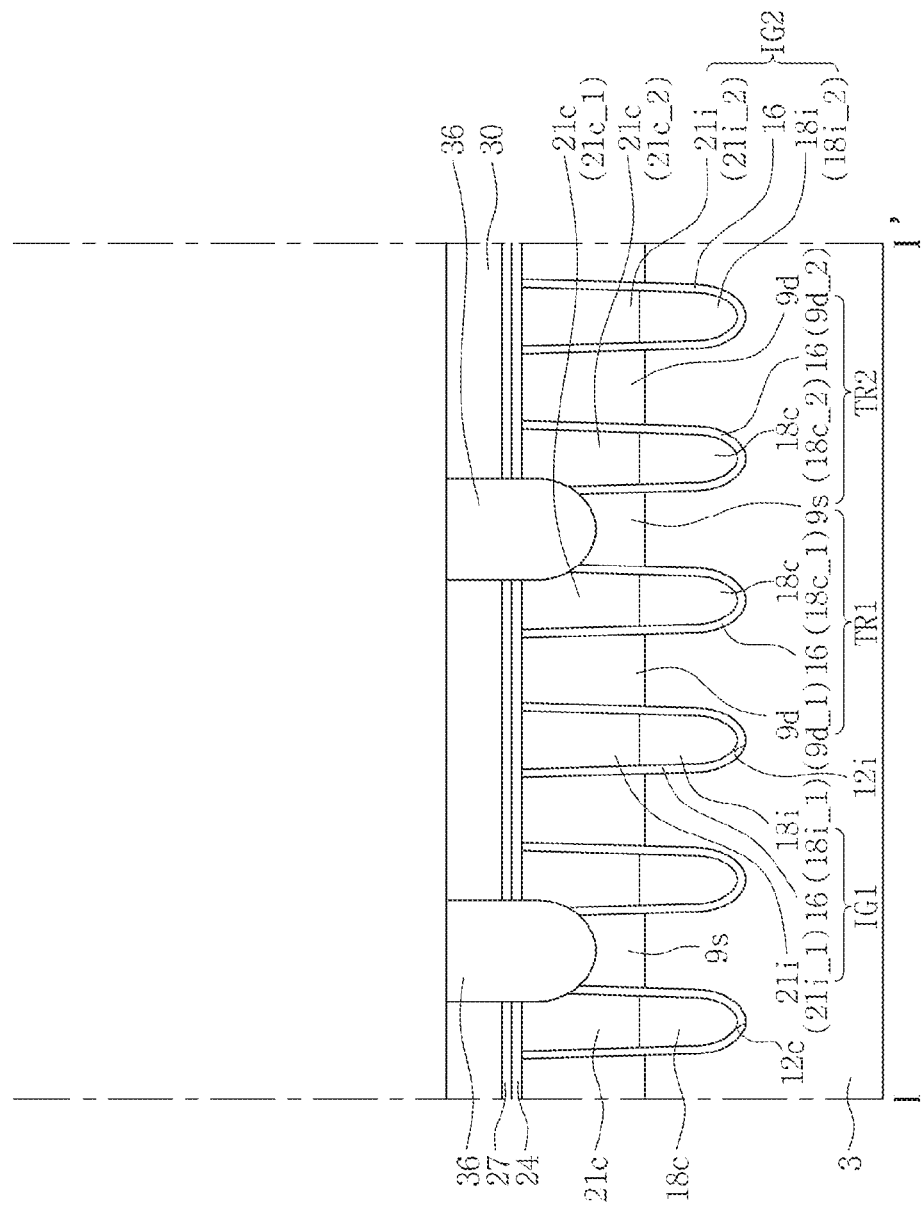
Figure 8B:
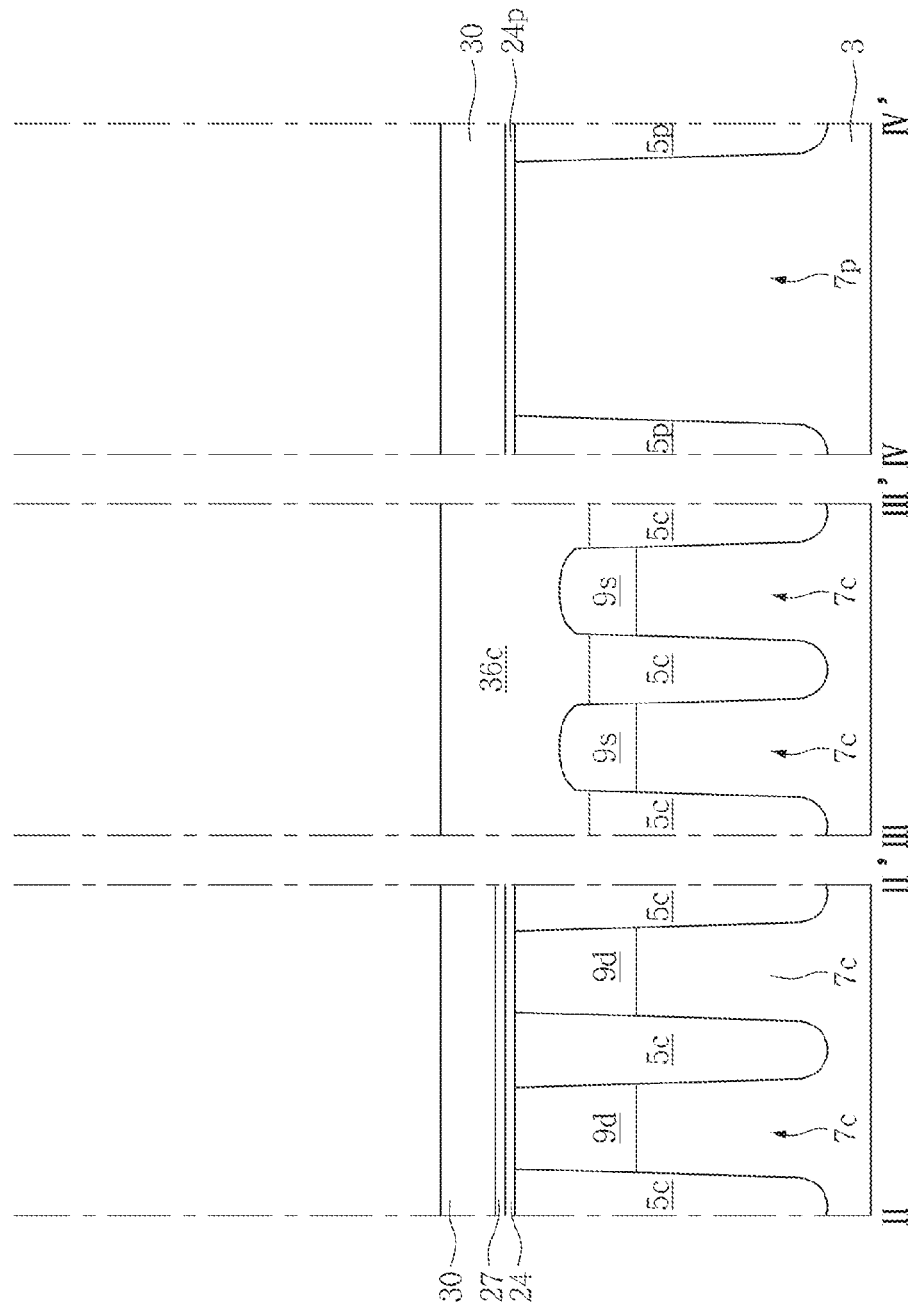

Referring to FIGS. 1, 8A and 8B, interconnection lower lines 36 may be formed filling the contact grooves 33. The interconnection lower lines 36 may have a line shape extending in the first direction Dy. Forming the interconnection lower lines 36 may include forming a conductive material layer on a semiconductor substrate having the contact grooves 33 and planarizing the conductive material layer. By planarizing the conductive material layer, the interconnection lower lines 36 are formed, and the cell mask (31 in FIGS. 7A and 7B) is removed to expose the interconnection lower layer 30.

Figure 9A:
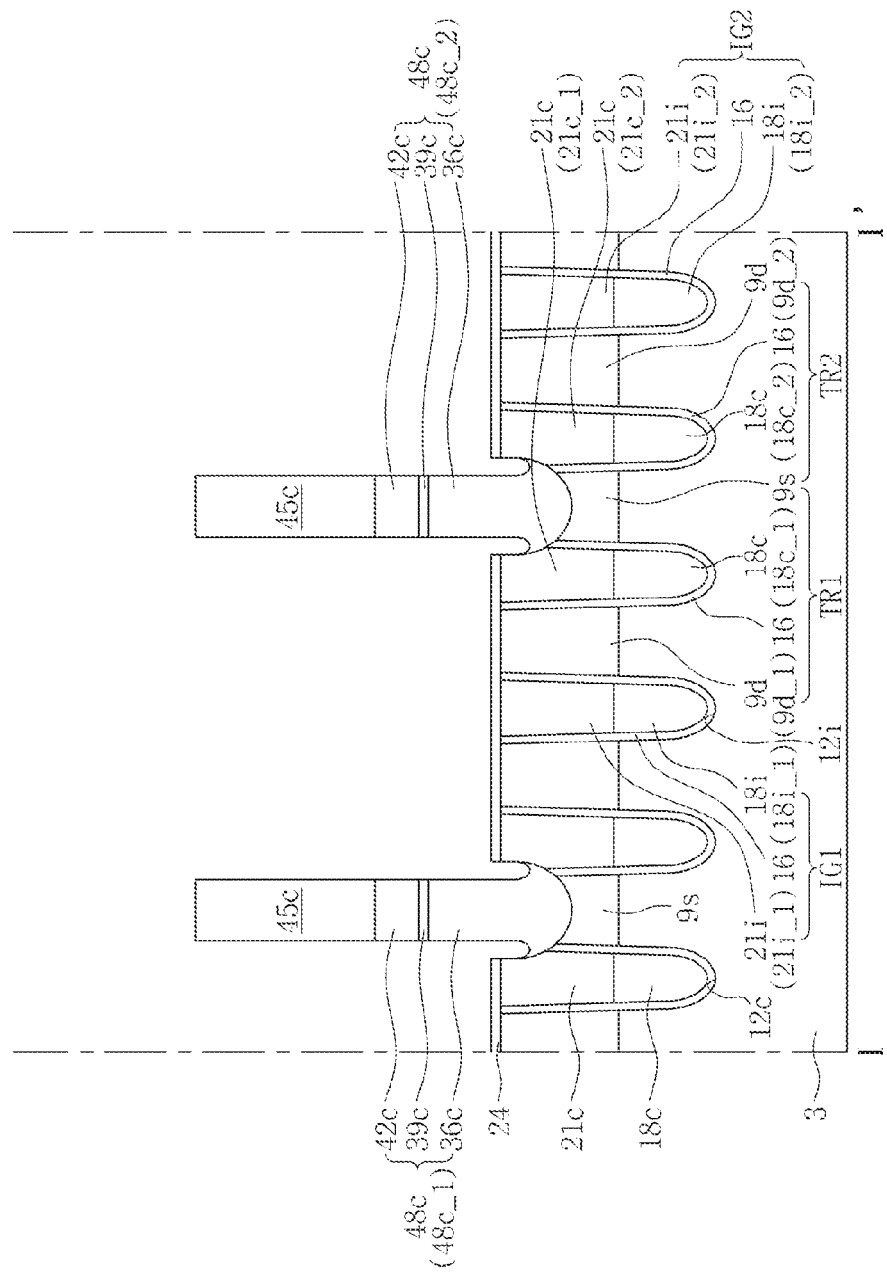

Referring to FIGS. 1, 9A and 9B, an interconnection intermediate layer and an interconnection upper layer may be formed, for example sequentially formed on the interconnection lower lines 36 and the interconnection lower layer 30. Cell interconnection mask patterns 45c and a peripheral gate mask pattern 45p may be formed on the interconnection upper layer. The cell interconnection mask patterns 45c may overlap the interconnection lower lines 36. The cell interconnection mask patterns 45c and the peripheral gate mask pattern 45p may be formed of or include an insulating material such as, for example, a silicon nitride.

In an example embodiment, the cell interconnection mask patterns 45c may have a smaller width than the interconnection lower lines 36.

By performing an etching process using the cell interconnection mask patterns 45c as an etching mask, cell interconnection structures 48c are formed, and by performing an etching process using the peripheral gate mask pattern 45p as an etching mask, a peripheral gate electrode 48p may be formed. The peripheral gate electrode 48p and the peripheral gate dielectric layer 24p may constitute a peripheral gate structure 49.

In an example embodiment, when the etching process is processed, the upper buffer layer (27 in FIGS. 8A and 8B) may be removed via etching.

In an example embodiment, an etching process using the cell interconnection mask patterns 45c as an etching mask and an etching process using the peripheral gate mask pattern 45p as an etching mask may be performed at different times. However, the inventive concepts is not limited thereto. For example, an etching process using the cell interconnection mask patterns 45c as an etching mask and an etching process using the peripheral gate mask pattern 45p as an etching mask may be contemporaneously or simultaneously performed.

Cell interconnection structures 48c may be formed by performing an etching process using the cell interconnection mask patterns 45c as an etching mask to etch, for example sequentially etch and form the interconnection upper layer, the interconnection intermediate layer, and the interconnection lower lines 36.

The peripheral gate electrode 48p may be formed by performing an etching process using the peripheral gate mask pattern 45p as an etching mask to etch, for example sequentially etch and form the interconnection upper layer, the interconnection intermediate layer, and the interconnection lower layer 30.

Under the cell interconnection mask pattern 45c, the interconnection upper layer may be etched and formed into interconnection upper patterns 42c, the interconnection intermediate layer may be etched and formed into interconnection intermediate patterns 39c, and the interconnection lower lines 36 may be at least partially etched and formed into interconnection lower patterns 36c in which a width of upper portions thereof is narrow.

Under the peripheral gate mask pattern 45p, the interconnection upper layer may be etched and formed into a gate upper pattern 42p, the interconnection intermediate layer may be etched and formed into a gate intermediate pattern 39p, and the interconnection lower layer 30 may be etched and formed into a gate lower pattern 30p.

Each of the cell interconnection structures 48c may include the interconnection lower pattern 36c, the interconnection intermediate pattern 39c and the interconnection upper pattern 42c that are stacked, for example sequentially stacked. The peripheral gate electrode 48p may include the gate lower pattern 30p, the gate intermediate pattern 39p and the gate upper pattern 42p that are stacked, for example sequentially stacked. The cell interconnection structures 48c may have a line shape extending in the first direction Dy.

The interconnection lower pattern 36c and the gate lower pattern 30p may be polysilicon. The interconnection intermediate pattern 39c and the gate lower pattern 30p may be formed of or include a metal silicide and/or a metal nitride. The interconnection upper pattern 42c and the gate upper pattern 42p may be formed of or include a metal material such as tungsten (W).

Figure 10A:
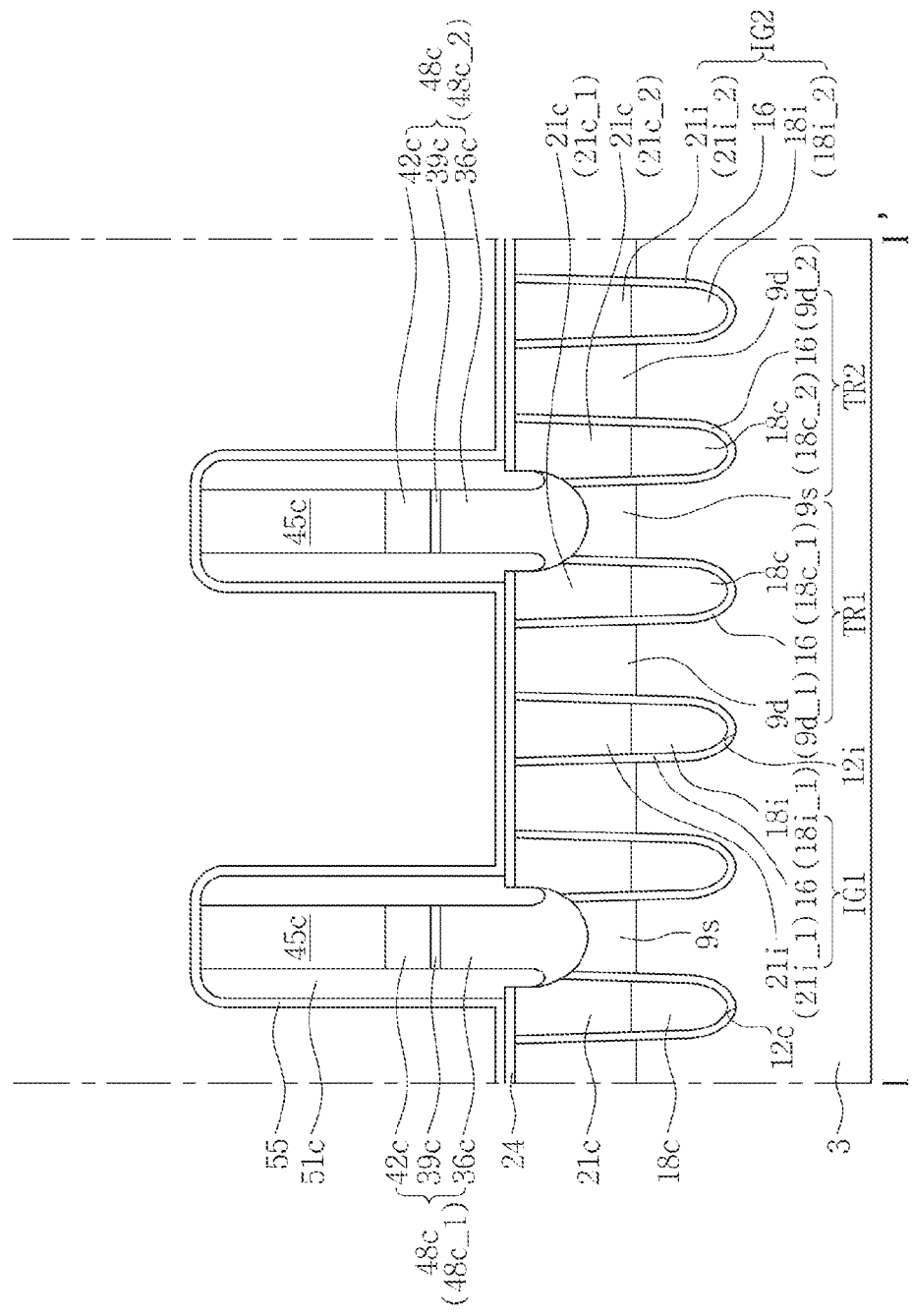
Figure 10B:
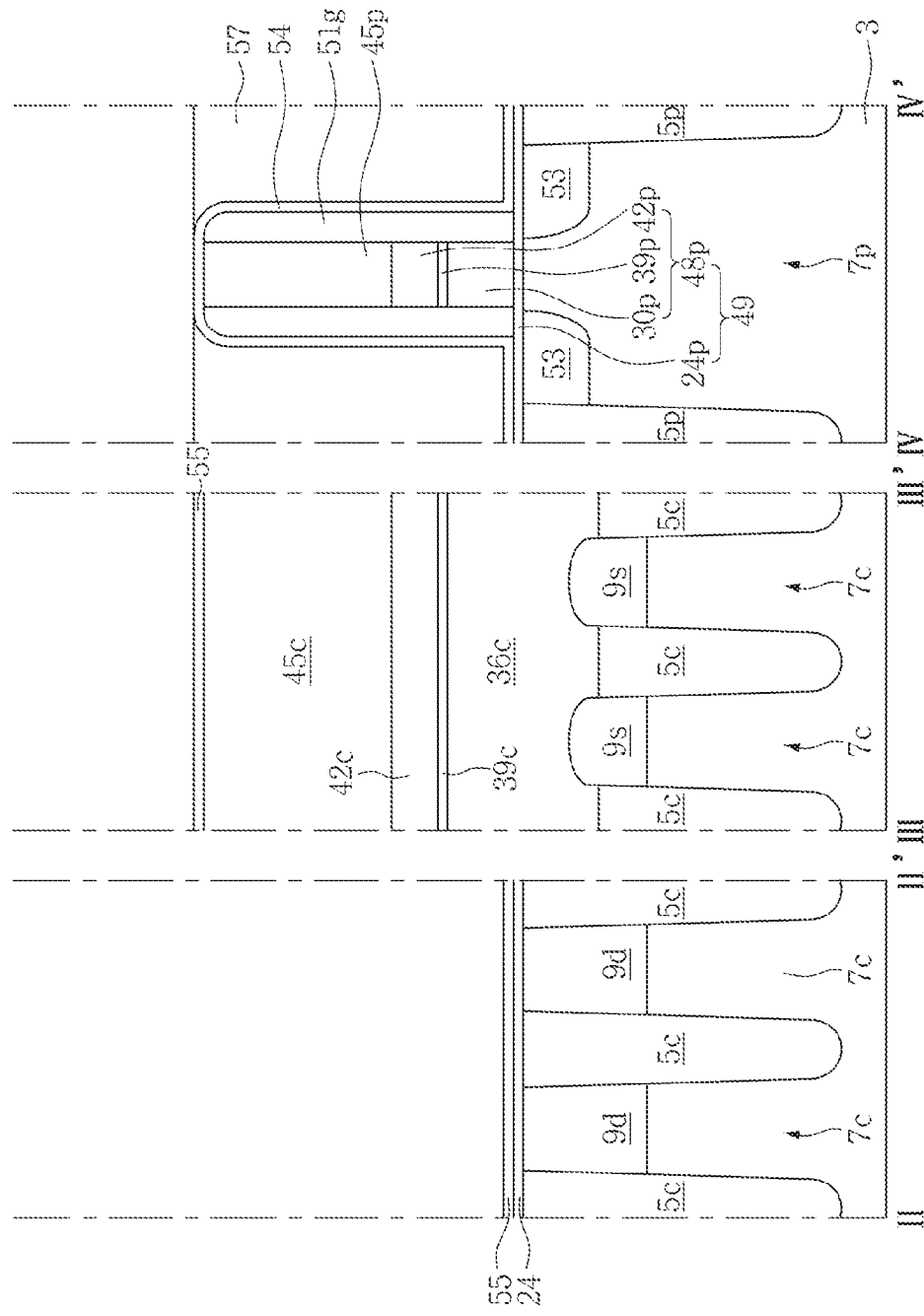

Referring to FIGS. 1, 10A and 10B, when an interconnection spacer layer is formed on a semiconductor substrate having the cell interconnection structures 48c, the peripheral gate electrode 48p, the cell interconnection mask patterns 45c and the peripheral gate mask pattern 45p, and the interconnection spacer layer are anisotropically etched and interconnection spacers 51c and peripheral gate spacers 51p may be formed.

The interconnection spacers 51c may be formed on side surfaces of the cell interconnection structures 48c and the cell interconnection mask patterns 45c that are stacked, for example sequentially stacked. The peripheral gate spacers 51p may be formed on side surfaces of the peripheral gate electrode 48p and the peripheral gate mask pattern 45p that are stacked, for example sequentially stacked.

The interconnection spacers 51c and the peripheral gate spacers 51p may be formed of or include an insulating material including a silicon nitride. The interconnection spacers 51c and the peripheral gate spacers 51p may be formed of or include a plurality of insulating material layers including a silicon nitride and a silicon oxide Peripheral source and drain regions 53 may be formed in the peripheral active region 7p at both sides the peripheral gate electrode 48p. An insulating liner 55 may be conformally formed on a semiconductor substrate having the interconnection spacers 51c and the peripheral gate spacers 51p. The insulating liner 55 may be formed of or include an insulating material such as, for example, a silicon nitride. A peripheral interlayer insulating layer 57 that covers the peripheral circuit region PA may be formed on the insulating liner 55. Forming the peripheral interlayer insulating layer 57 may include forming an insulating material layer on the insulating liner 55 and selectively removing the insulating material layer on the cell array region CA.

Figure 11B:
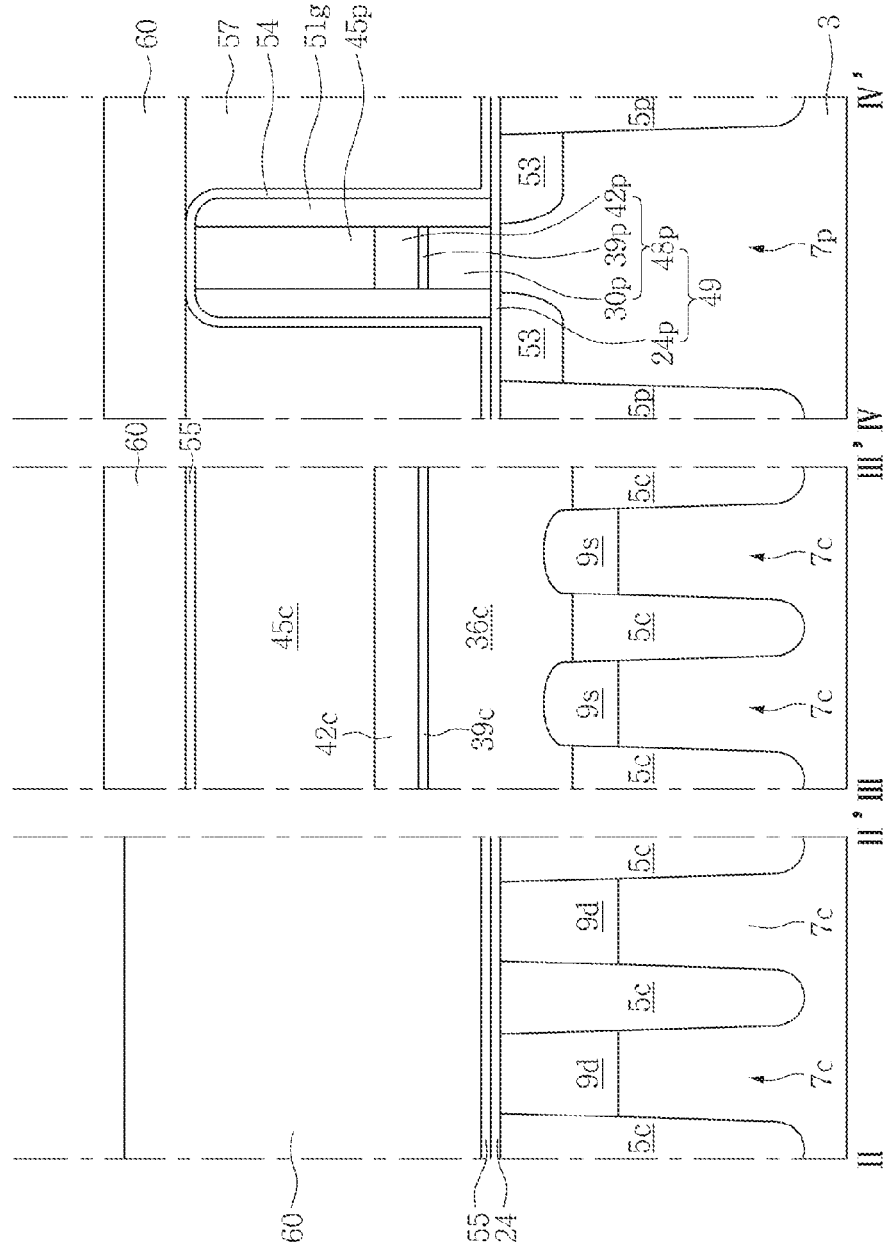

Referring to FIGS. 1, 11A and 11B, a contact spacer layer 60 that is thicker than the insulating liner 55 may be formed on the insulating liner 55 and the peripheral interlayer insulating layer 57. The contact spacer layer 60 may be conformally formed using a deposition process. The contact spacer layer 60 may be formed of or include a material having an etch selectivity with respect to the insulating liner 55, for example, a silicon oxide. The contact spacer layer 60 may be conformally formed to have a thickness that does not fully fill a space between the cell interconnection structures 48c.

Figure 12A:
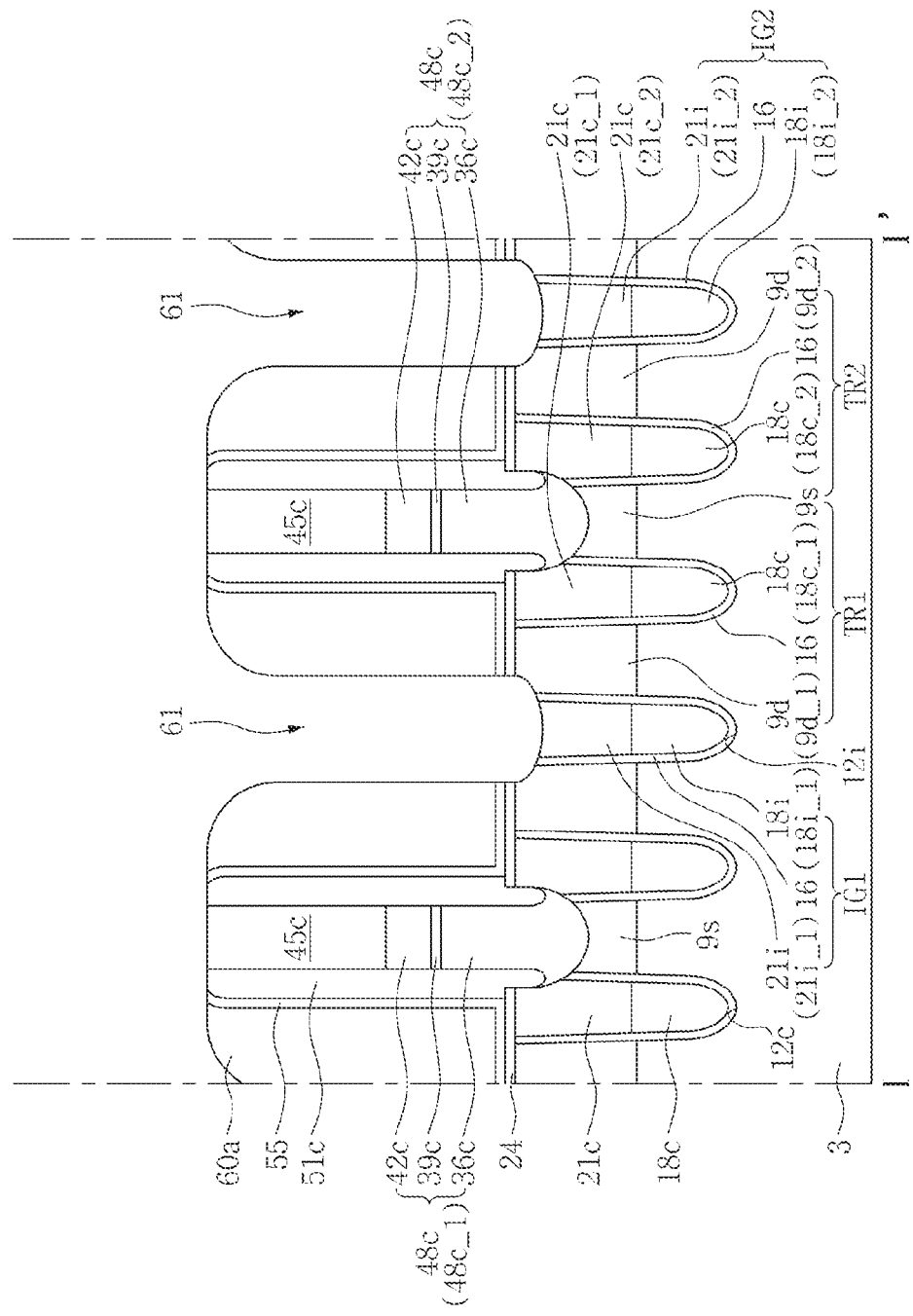
Figure 12B:
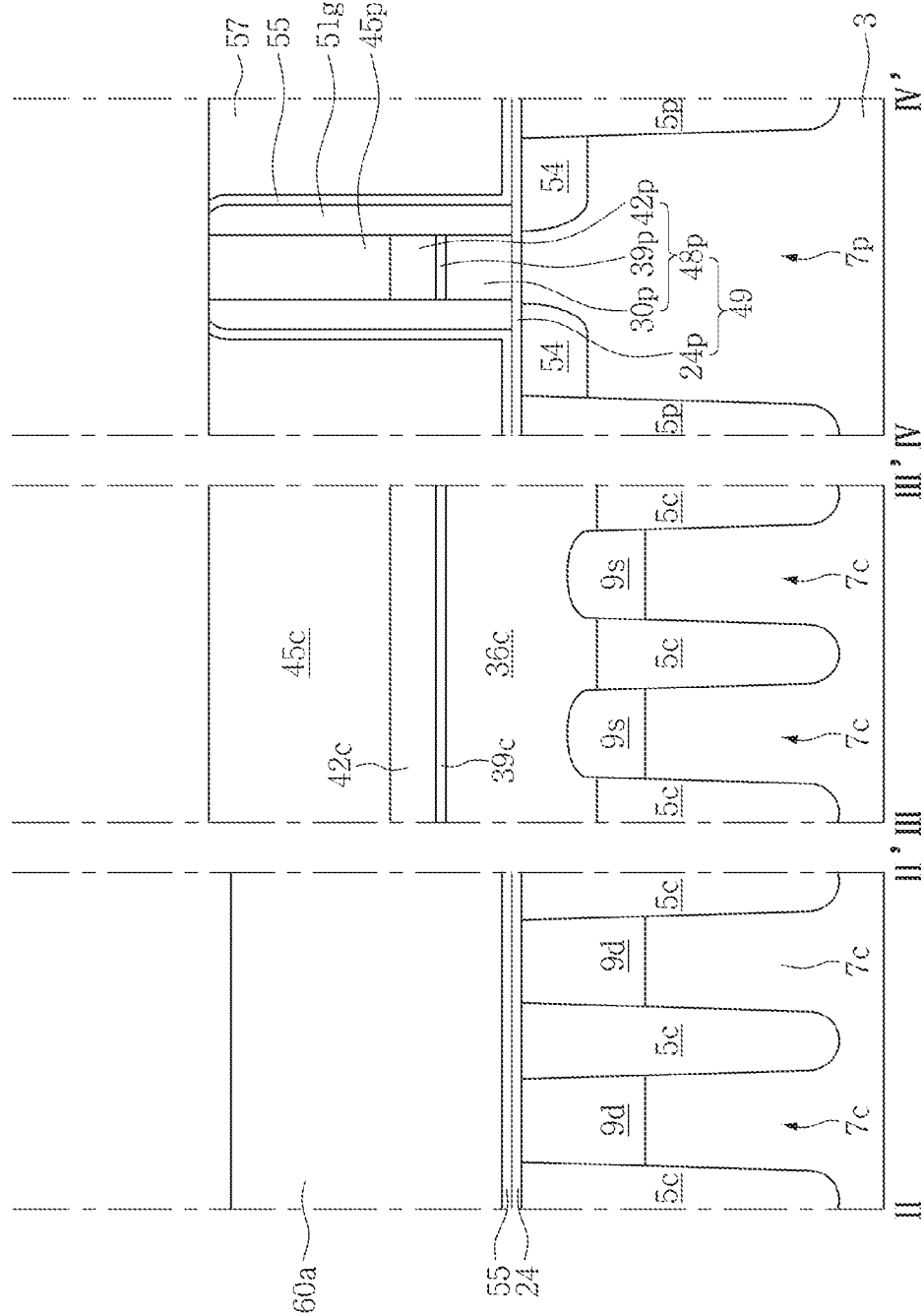

Referring to FIGS. 1, 12A and 12B, by performing an etching process etching the contact spacer layer 60 to expose the isolating gate capping patterns 21i, form spacer lines 60a and isolation grooves 61 may be formed. When the etching process is performed, a part of the isolating gate capping patterns 21i may be etched. Therefore, the uppermost portions of the isolating gate capping patterns 21i exposed by the isolation grooves 61 may be formed to be at a level lower than the uppermost portions of the cell gate capping patterns 21c. The spacer lines 60a may be formed on side surfaces of the cell interconnection structures 48c and the cell interconnection mask patterns 45c. The spacer lines 60a may have bottoms that overlap the drain regions 9d.

Figure 13A:
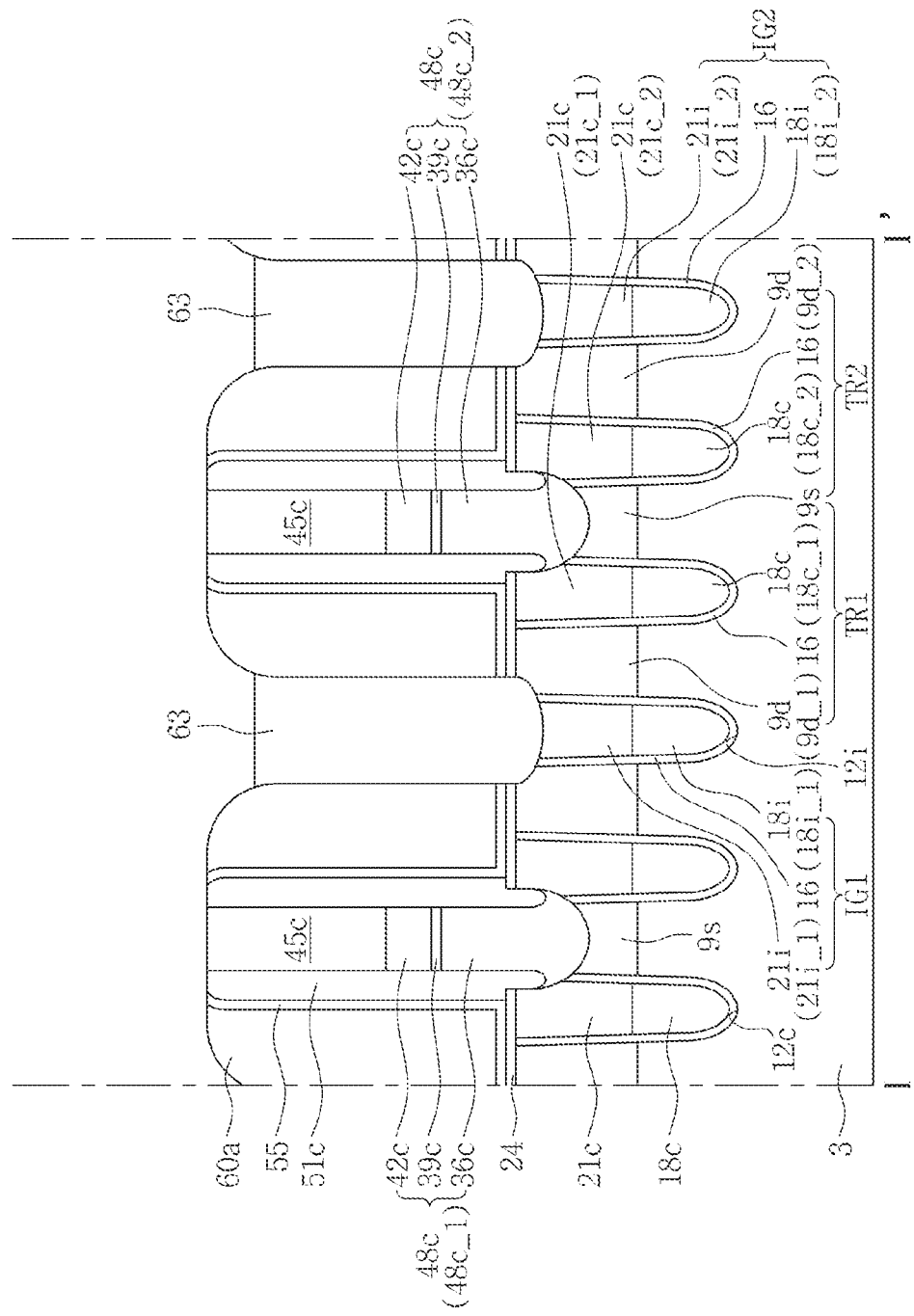
Figure 13B:
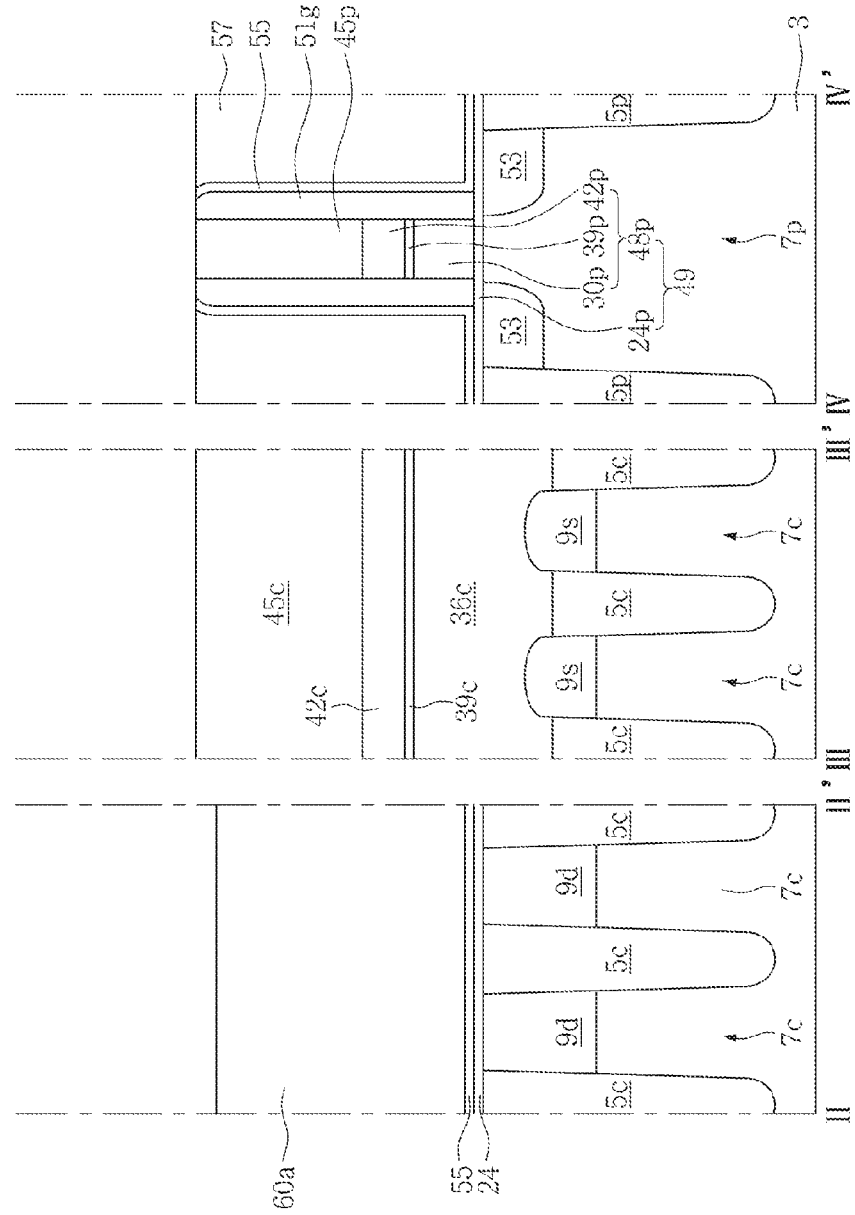

Referring to FIGS. 1, 13A and 13B, isolation patterns 63 that are insulating may be formed in the isolation grooves 61. The isolation patterns 63 may fill the isolation grooves 61. The isolation patterns 63 may be formed of or include an insulating material such as, for example, a silicon nitride. Forming the isolation patterns 63 may include forming an insulating material layer on a semiconductor substrate having the isolation grooves 61 and planarizing the insulating material layer. The planarizing may be performed by an etch back process.

The isolation patterns 63 may be formed without a photolithography process and may be formed to be spaced apart a certain distance from the cell interconnection structures 48c. For example, of the isolation patterns 63, any one may be formed as a first isolation pattern 63_1 spaced apart a certain distance from a pair of cell interconnection structures 48c_1 and 48c_2 disposed at both sides of the first isolation pattern 63_1.

A spacing distance between the isolation patterns 63 and the cell interconnection structures 48c may vary depending on a thickness of the contact spacer layer 60 formed by a deposition process. The thickness of the contact spacer layer 60 may depend on a deposition process, which precisely controls the thickness than a photolithography process. Therefore, the isolation patterns 63 may be disposed to be self-aligned between the cell interconnection structures 48c.

Figure 14A:
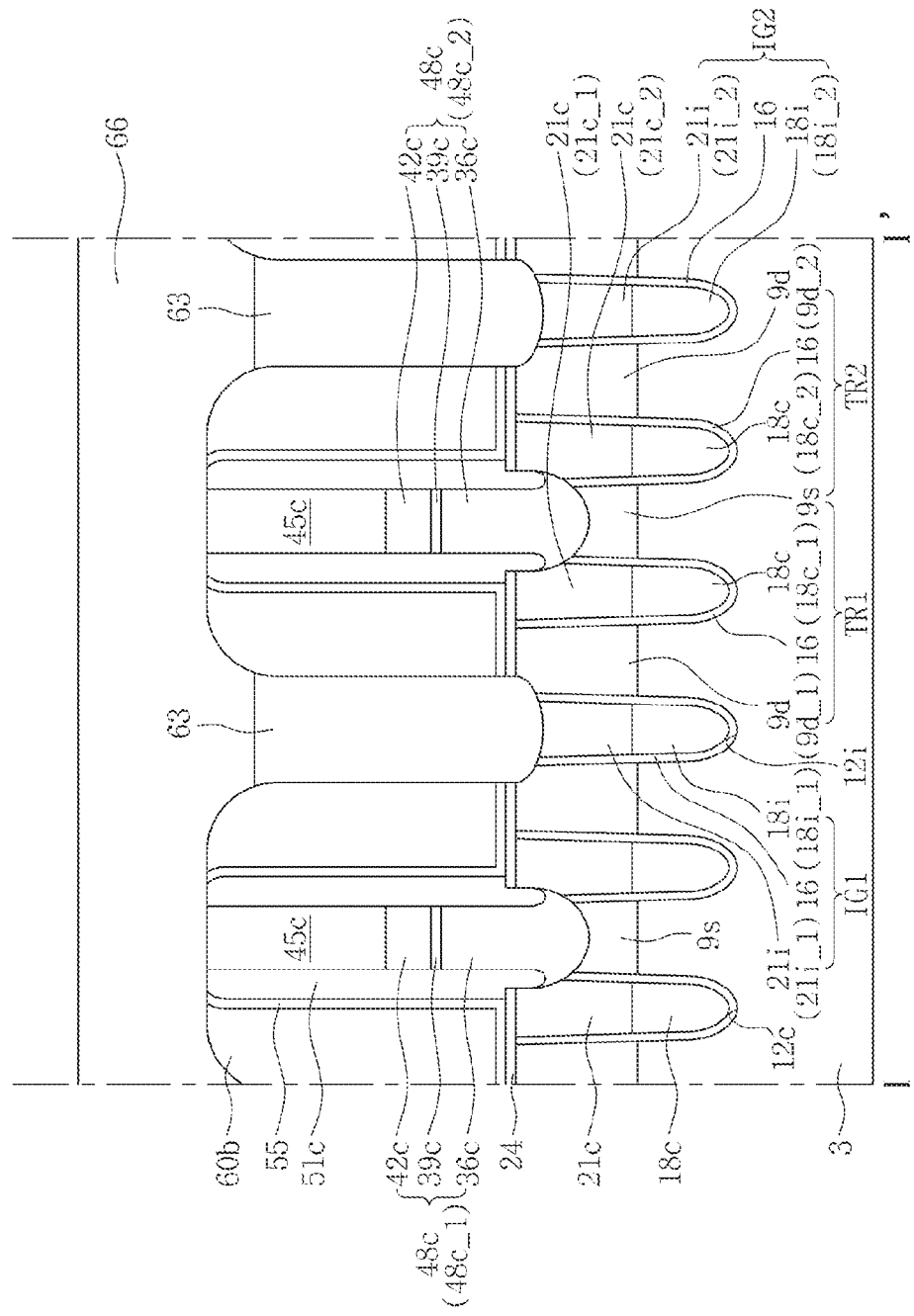

Referring to FIGS. 1, 14A and 14B, an isolation mask pattern 66 may be formed on a semiconductor substrate having the isolation patterns 63. The isolation mask pattern 66 may cover the peripheral circuit region PA and may be formed to be a plurality of patterns that have a line shape extending in the second direction Dx substantially perpendicular to the cell interconnection structures 48c in the cell array region CA. For example, in the cell array region CA, since the isolation mask pattern 66 is formed using a photoresist pattern in a line and space shape, a smaller pattern may be easily formed.

By etching the contact spacer lines 60a, the lower buffer insulating layer 24 under the contact spacer lines 60a and the insulating liner 55 using the isolation mask pattern 66 on the cell array region CA as an etching mask, first holes 69 may be formed. By etching the contact spacer lines 60a, contact spacer patterns 60b may be formed. The first holes 69 may expose the cell isolation regions 5c.

Figure 15A:
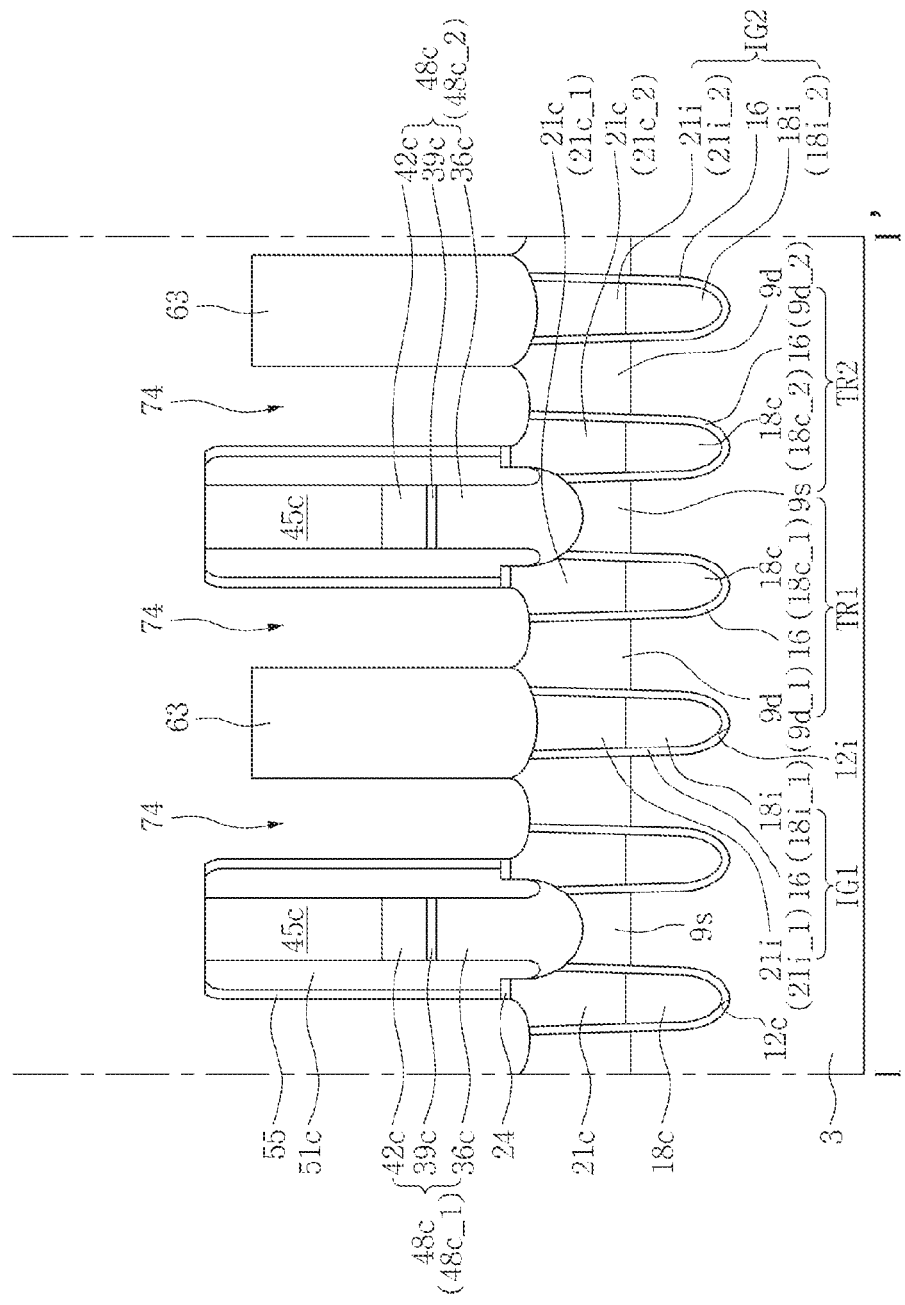

Referring to FIGS. 1, 15A and 15B, insulating patterns 72 filling the first holes 69 may be formed. The insulating patterns 72 may be formed of or include an insulating material having an etch selectivity with respect to the contact spacer patterns 60b. For example, when the contact spacer patterns 60b are formed of or include a silicon oxide, the insulating patterns 72 may be formed of or include a silicon nitride. The isolation mask pattern 66 may be removed. A peripheral protection mask 73 may be formed to cover the peripheral circuit region PA and expose the cell array region CA. By etching the contact spacer patterns 60b, the insulating liner 55 and the lower buffer insulating layer 24 that remains under the contact spacer patterns 60b, second holes 74 may be formed. The second holes 74 may be referred to as cell contact holes. When the contact spacer patterns 60b and the peripheral interlayer insulating layer 57 are formed of or include a silicon oxide, the peripheral protection mask 73 may protect the peripheral interlayer insulating layer 57 from a process in which the contact spacer patterns 60b are etched and removed. Subsequently, the peripheral protection mask 73 may be removed.

Figure 16A:
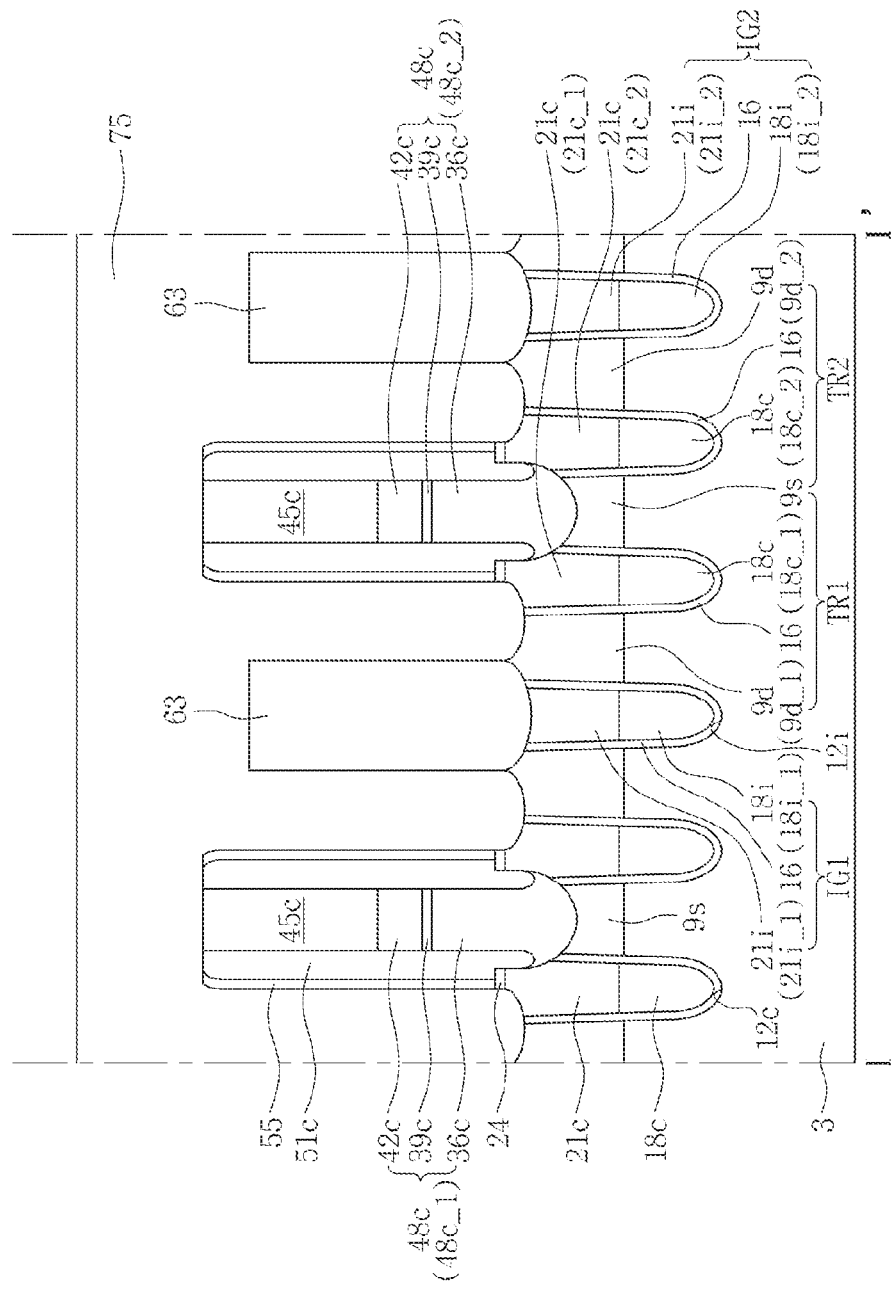
Figure 16B:
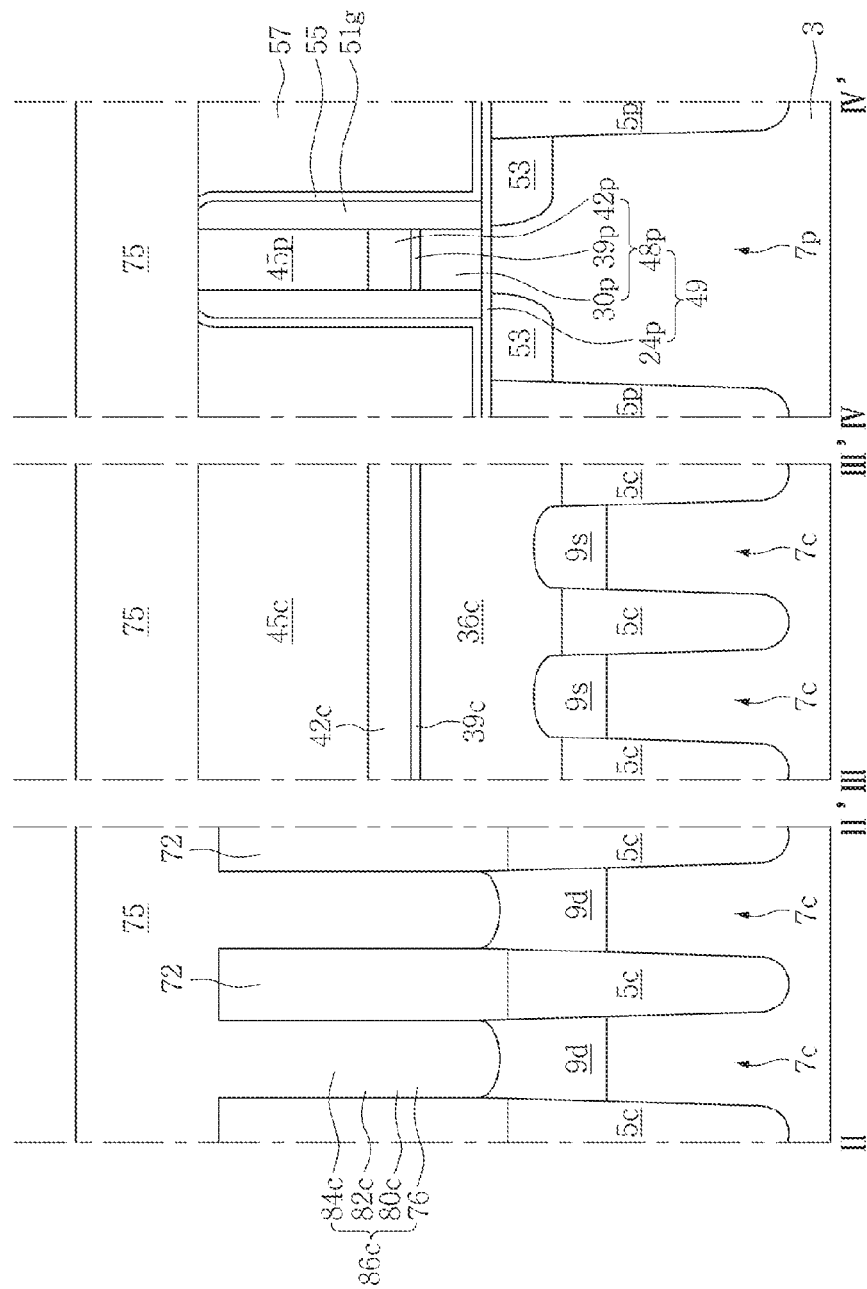

Referring to FIGS. 1, 16A and 16B, a lower conductive layer 75 may be formed on a semiconductor substrate having cell contact holes 74. The lower conductive layer 75 may be formed of or include a conductive material such as, for example, polysilicon.

Figure 17A:
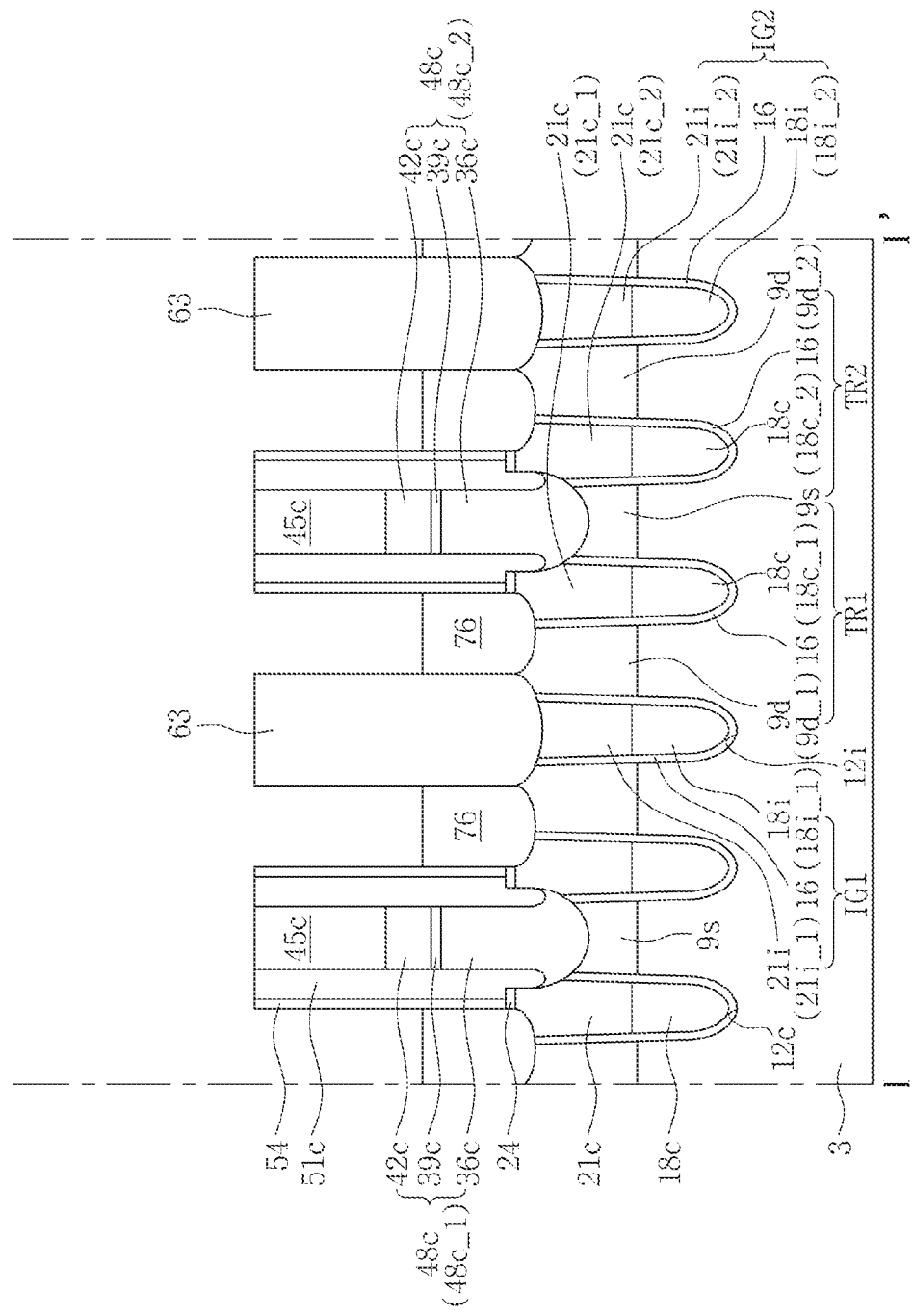
Figure 17B:
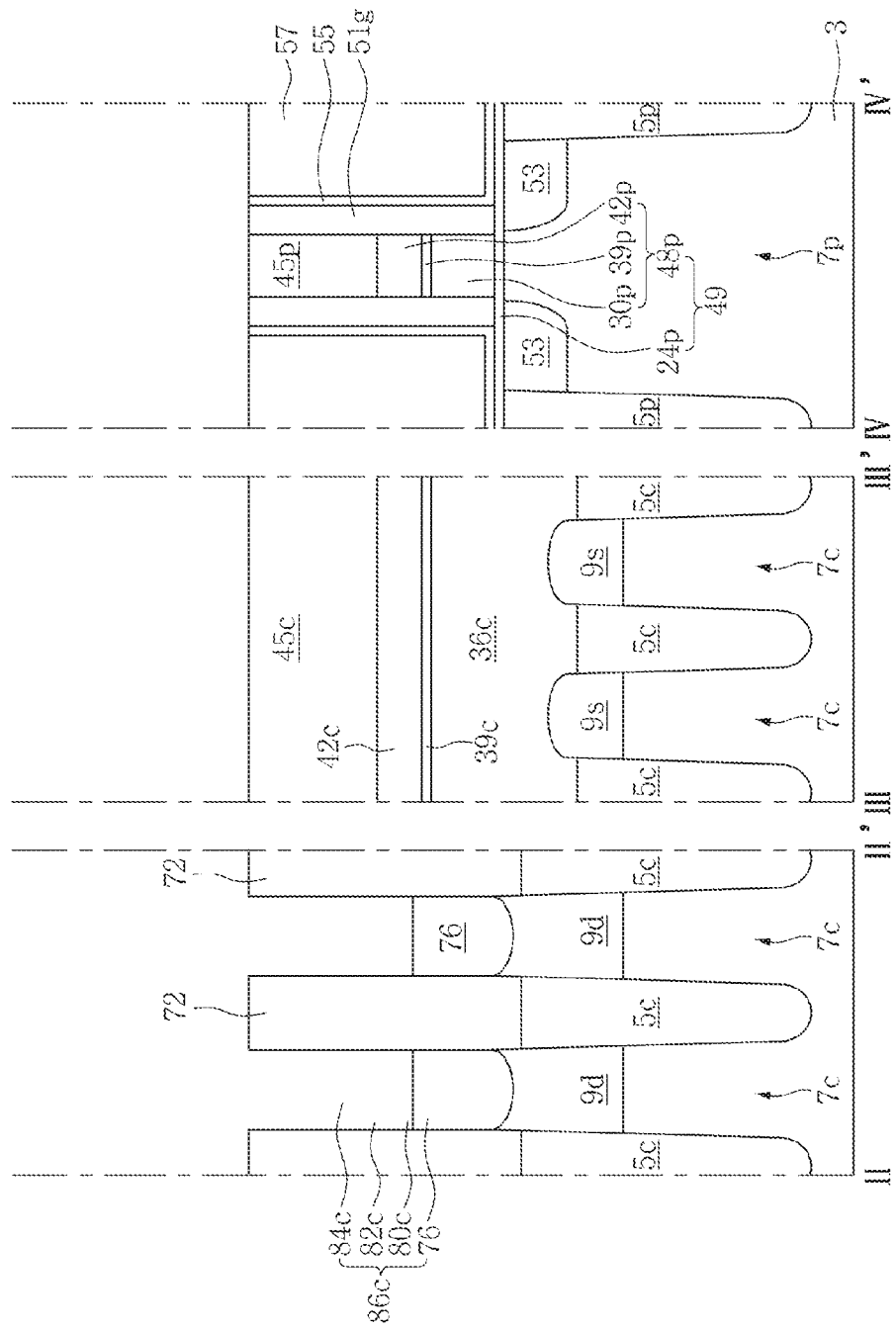

Referring to FIGS. 1, 17A and 17B, cell lower conductive patterns 76 that at least partially fill the cell contact holes 74 may be formed. Forming the cell lower conductive patterns 76 may include planarizing the lower conductive layer 75, and at least partially etching the planarized lower conductive layer. Planarizing the lower conductive layer 75 may be performed using a planarizing technique such as, for example, a chemical mechanical polishing (CMP).

In an example embodiment, while the lower conductive layer 75 is planarized, upper surfaces of the cell interconnection mask patterns 45c, the isolation patterns 63, the peripheral interlayer insulating layer 57 and the peripheral gate mask pattern 45p may be planarized.

Figure 18A:
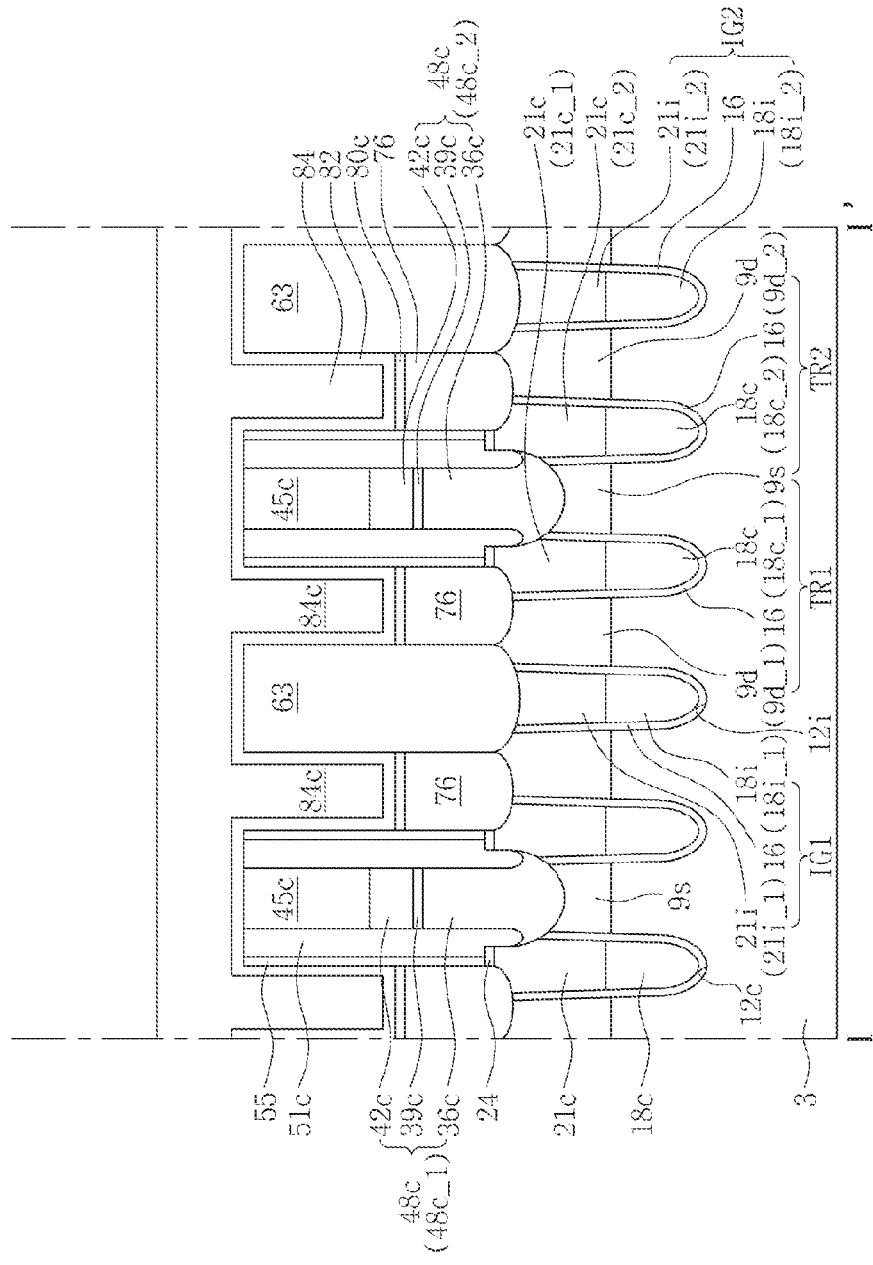
Figure 18B:
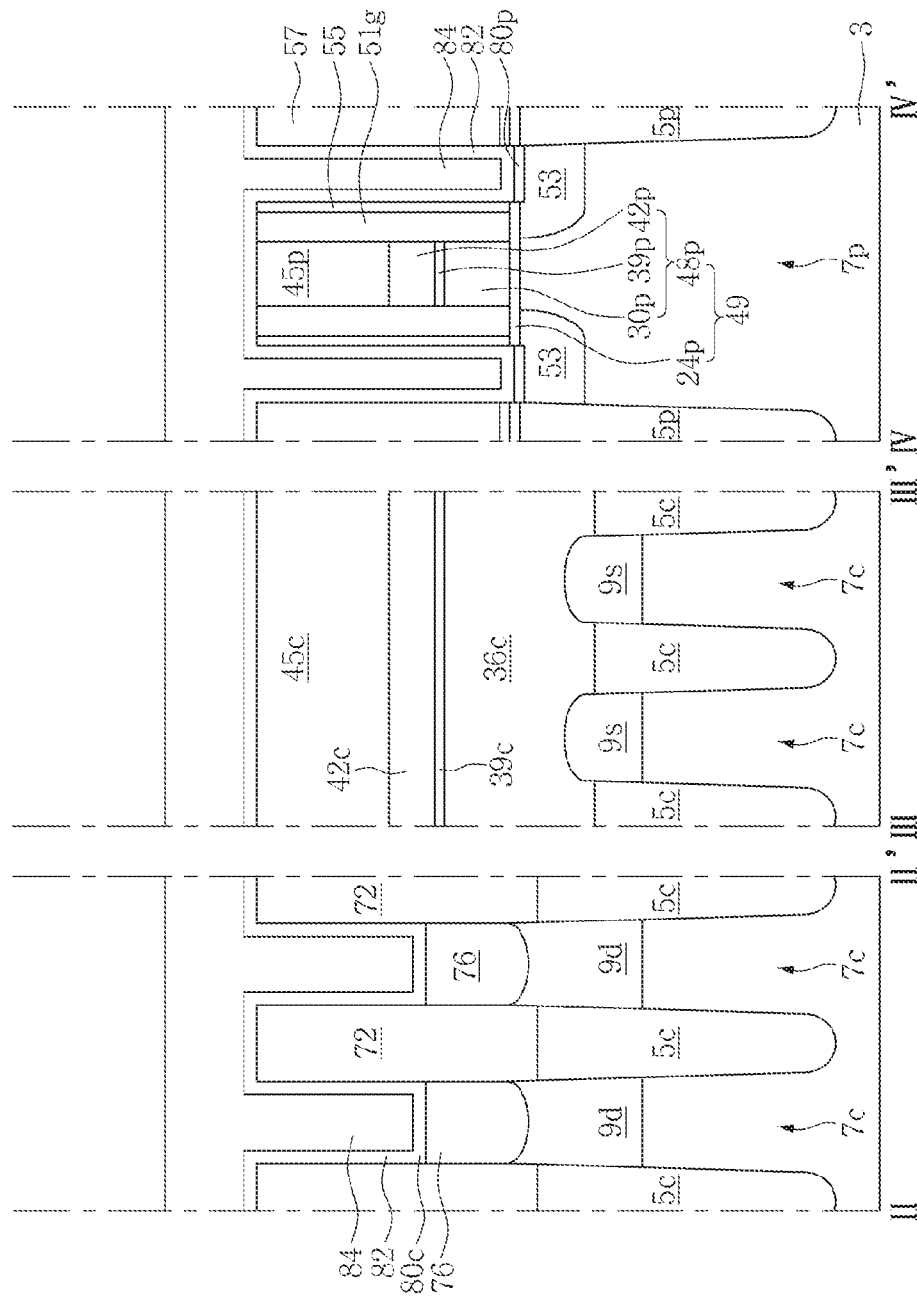

Referring to FIGS. 1, 18A and 18B, peripheral contact holes 78 may be formed by patterning the peripheral interlayer insulating layer 57, passing through the peripheral interlayer insulating layer 57 and exposing the peripheral source and drain regions 53 in the peripheral active region 7p. Cell and peripheral silicide layers 80c and 80p, a barrier layer 82 and an upper conductive layer 84 may be formed.

In an example embodiment, forming the cell and peripheral silicide layers 80c and 80p may include forming a peripheral contact silicide layer 80p by performing a silicide process to react a metal material with the peripheral source and drain regions 53 exposed by the peripheral contact holes 78, and forming a cell contact silicide layer 80c by performing a silicide process to react a metal material with the cell lower conductive patterns 76. The metal material may be a material such as, for example, Ti, Ta, Co or Ni. The barrier layer 82 may include a metal nitride such as, for example, TiN, cover the cell and peripheral silicide layers 80c and 80p and be conformally formed. The upper conductive layer 84 may be formed on the barrier layer 82 and fill the cell and peripheral contact holes 74 and 78.

Figure 19A:
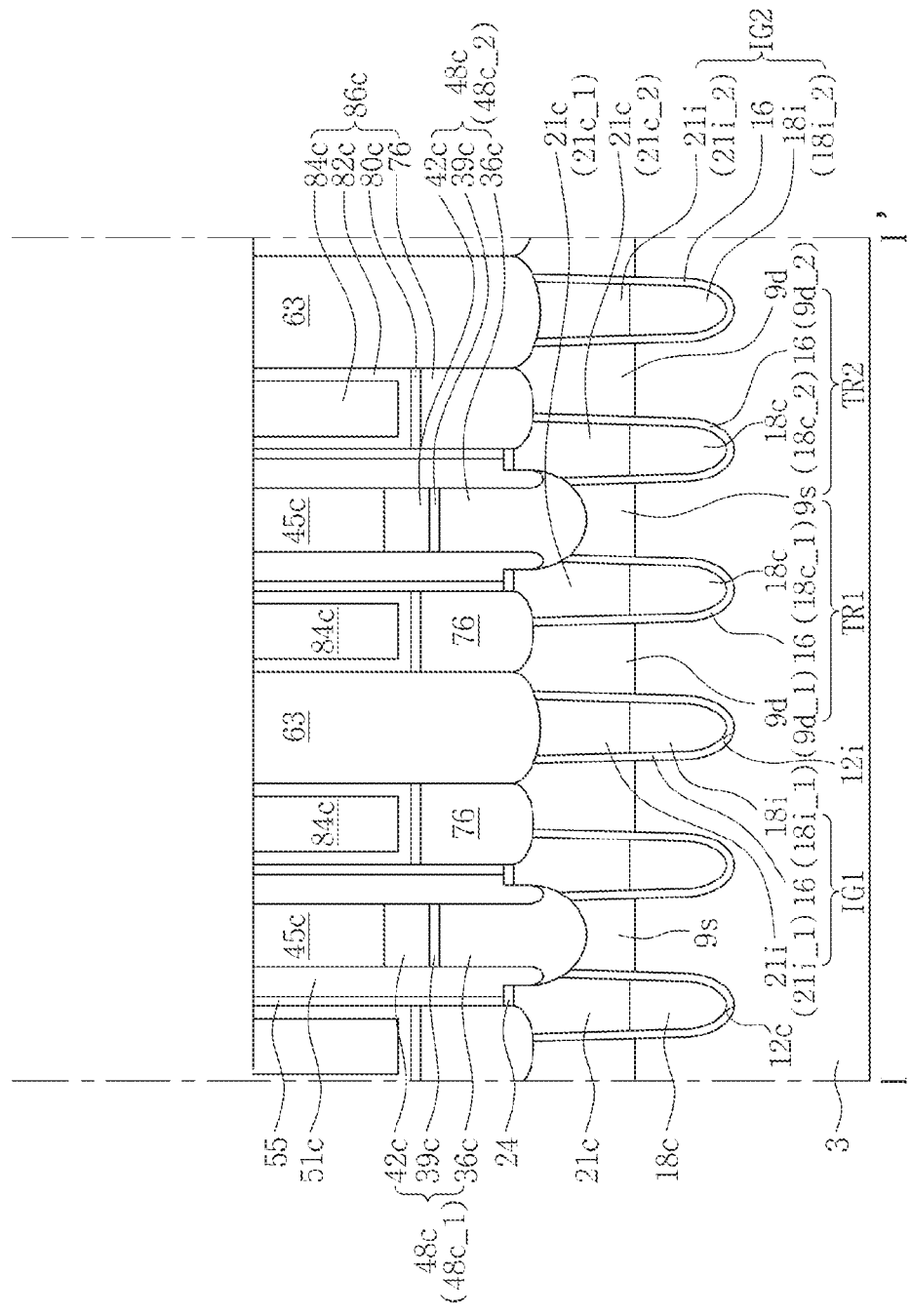
Figure 19B:
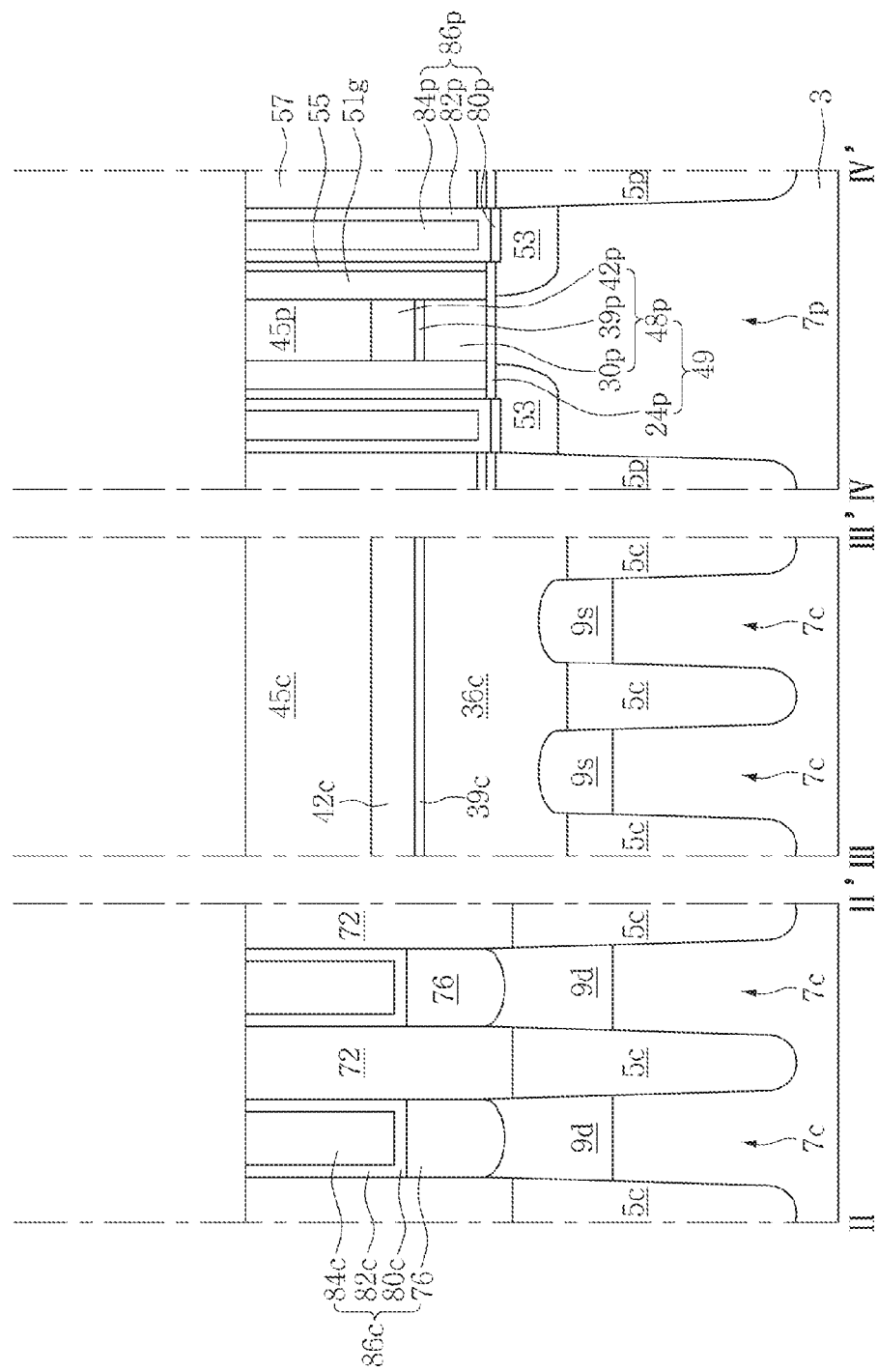

Referring to FIGS. 1, 19A and 19B, by planarizing the barrier layer 82 and the upper conductive layer 84, a cell barrier pattern 82c and a cell upper contact pattern 84c that remains in the cell contact holes 74 may be formed and a peripheral barrier pattern 82p and peripheral contact conduction pattern 84p that remains in the peripheral contact holes 78 may be formed. Planarizing the barrier layer 82 and the upper conductive layer 84 may include performing planarizing on the isolation patterns 63, the cell interconnection mask patterns 45c, the peripheral gate mask pattern 45p and the peripheral interlayer insulating layer 57 until upper surfaces thereof are exposed.

Cell contact structures 86c may be composed of the cell lower contact patterns 76 formed in the cell contact holes 74, the cell contact silicide layers 80c, the cell barrier patterns 82c and the cell upper contact patterns 84c.

Peripheral contact structures 86p may be composed of the peripheral contact silicide layers 80p formed in the peripheral contact holes 78, the peripheral barrier patterns 82p and the peripheral contact conductive patterns 84p.

Referring FIGS. 1, 2A and 2B, data storage elements 92 of a memory device may be formed on the cell contact structures 86c. The data storage elements 92 may be variable resistance structures. The data storage elements 92 may include memory cells that store data of an STT-MRAM. The data storage elements 92 may each include a base layer 89, a magnetization layer 90a, a tunnel barrier layer 90b, a free layer 90c and a capping layer 91 that are stacked, for example sequentially stacked. The base layer 89 may be formed of or include a conductive material and include a lower electrode or a seed layer. The base layer 89 may include a metal material such as, for example, Ru, Ta, Ti or the like. The capping layer 91 may be formed of or include a conductive material such as, for example, Cu, Ta, Al, Au, Ti, TiN, TaN or the like. The magnetization layer 90a may be formed of or include a plurality of layers. For example, the magnetization layer 90a may include a lower fixed layer, a spacer, and an upper fixed layer that are stacked, for example sequentially stacked. The lower fixed layer may be formed of or include a magnetic material in which a magnetization direction can be fixed. The spacer may be formed of or include a non-magnetic material. The tunnel barrier layer 90b may be formed of or include a material such as, for example, magnesium oxides (MgO). The free layer 90c may include a magnetic material in which a magnetization direction can be changed. A protection liner 93 may be formed on a semiconductor substrate having the data storage elements 92. The protection liner 93 may be formed of or include an insulating material. An upper interlayer insulating layer 94 may be formed on a semiconductor substrate having the protection liner 93.

Bit line structures 96 and peripheral interconnection structures 96p may be formed on the upper interlayer insulating layer 94. Each of the bit line structures 96 may include a bit line 96b which has a line shape extending in the second direction Dx and contact portions 96a that are disposed under the bit line 96b, pass through the upper interlayer insulating layer 94 and the protection liner 93, and are physically and/or electrically connected to the data storage elements 92. The bit lines 96b of the bit line structures 96 may overlap the cell active regions 7c. The peripheral interconnection structures 96p may pass through the upper interlayer insulating layer 94 and the protection liner 93 and include connection portions that are physically and/or electrically connected to the peripheral contact structures 86p.

According to embodiments of the inventive concepts, in order to reduce or prevent a bridge failure between patterns and to increase the degree of integration, a plurality of interconnections (e.g., see 48c in FIGS. 9A and 9B) substantially parallel to each other may be formed, spacer lines (e.g., see 60a in FIGS. 12A and 12B) may be formed on side surfaces of the interconnections 48c without a photolithography process, line-shaped isolation patterns (e.g., see 63 in FIGS. 13A and 13B) may be formed between the interconnections 48c without a photolithography process, and contact spacer patterns (see 60b in FIGS. 14A and 14B) and first holes (see 69 in FIGS. 14A and 14B) between the contact spacer patterns 60b may be formed by being patterned from spacer lines 60a using a photolithography process. Insulating patterns (see 72 in FIGS. 15A and 15B) in the first holes 69 may be formed, second contact holes (see 74 in FIGS. 15A and 15B) may be formed by removing the contact spacer patterns 60b, and cell contact structures (see 86c in FIGS. 19A and 19B) in the second contact holes 74 may be formed.

Since the isolation patterns 63 are in contact with the isolating gate capping patterns 21i of the isolating gate patterns IG and are formed to have a line shape, the isolation patterns 63 can reduce or prevent a failure between the cell contact structures 86c, for example, an electrical short and/or bridge failure.

Since a width of the cell contact structures 86c is formed by a deposition process and not a photolithography process, the width may be precisely controlled. Since a width of the spacer lines (e.g., see 60a in FIGS. 12A and 12B) may be formed by a deposition process that may be more precisely controlled than a photolithography process, the cell contact structures 86c formed using the spacer lines 60a may be formed to have a small width, which is not easy to be implemented by a photolithography process. Therefore, the overall degree of integration of a semiconductor device may be enhanced.

Figure 20A:
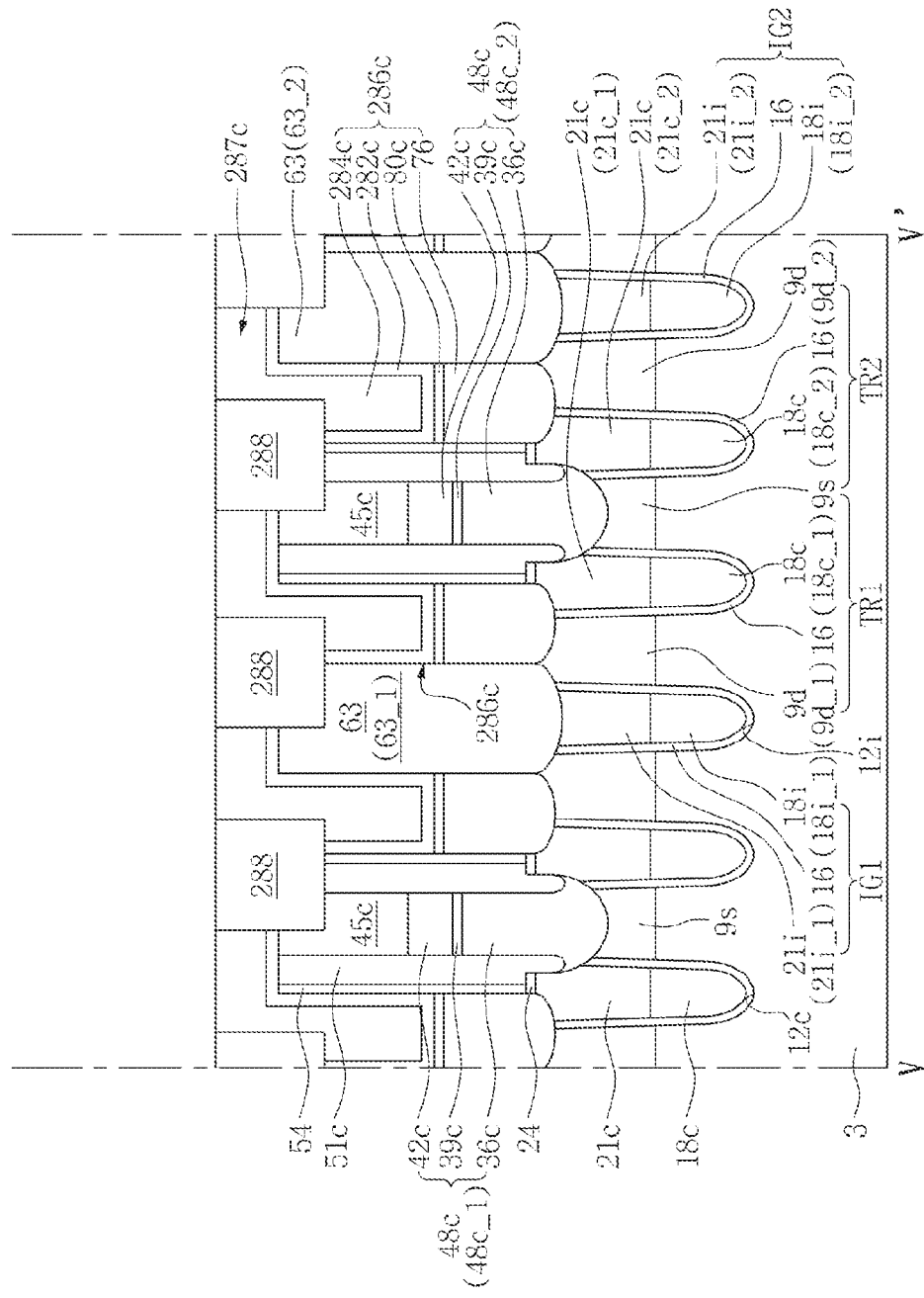
FIGS. 20A and 20B are cross-sectional views illustrating an example of a method for forming a semiconductor device according to an example embodiment of the inventive concepts.
Figure 20B:
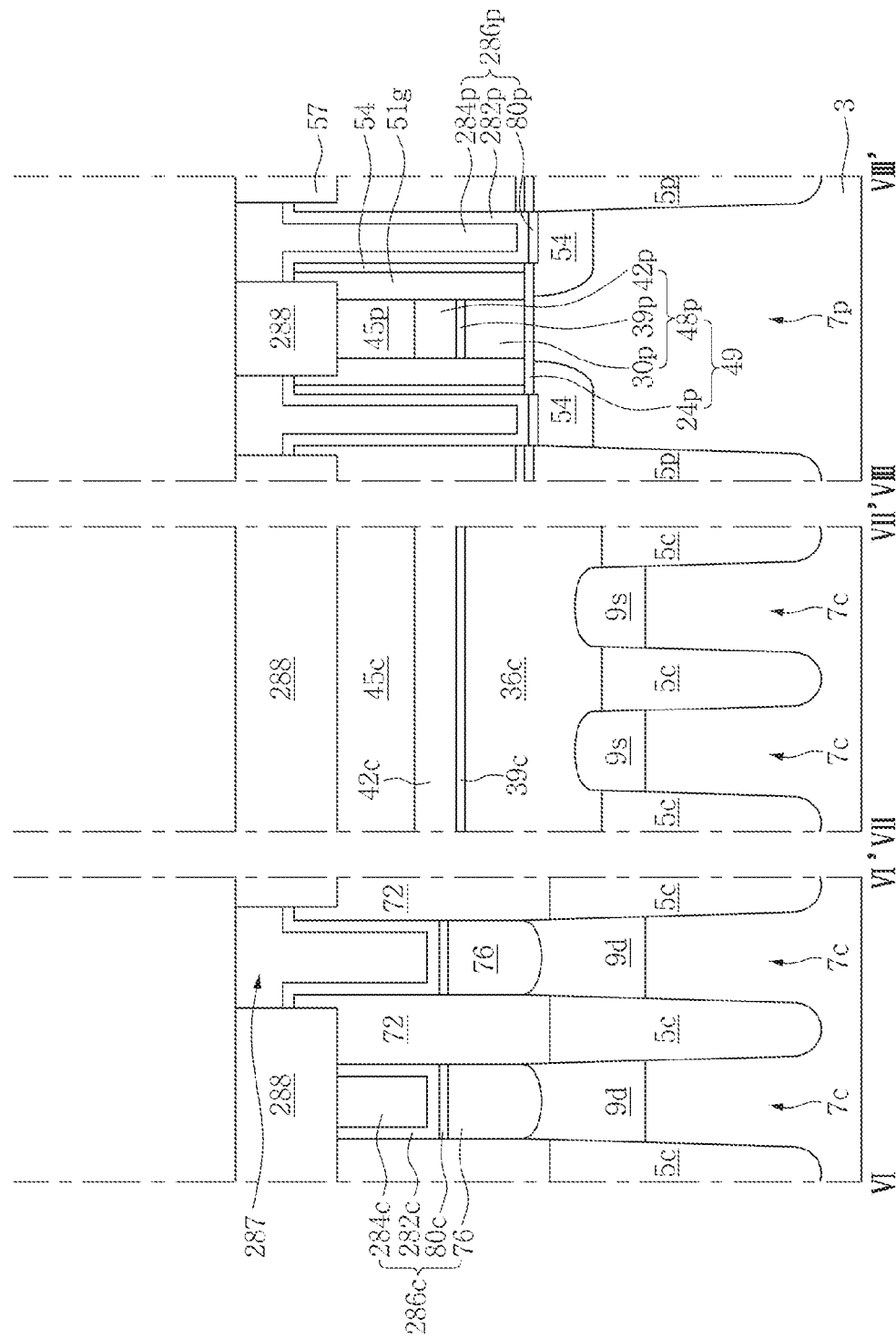

Next, Referring to FIGS. 4, 5A, 5B, 20A and 20B, an example of a method of forming a semiconductor according to an example embodiment of the inventive concepts a semiconductor device will be described. In FIGS. 20A and 20B, FIG. 20A is a cross-sectional view illustrating a region taken along line V-V' in FIG. 4, and FIG. 20B is a cross-sectional view illustrating a region taken along lines VI-VI', VII-VII' and VIII-VIII' in FIG. 4.

Referring to FIGS. 4, 20A and 20B, by using the method described in FIGS. 6A to 18B, processes from a process of forming the isolation regions 5c and 5p that define the active regions 7c and 7p in the semiconductor substrate 3 to a process of forming the barrier layer (see 82 in FIGS. 18A and 18B) and the upper conductive layer (see 84 in FIG. 18A and 18B) may be performed. The barrier layer (see 82 in FIGS. 18A and 18B) and the upper conductive layer (see 84 in FIGS. 18A and 18B) may be patterned by performing a photolithography and etching process.

The barrier layer (see 82 in FIGS. 18A and 18B) and the upper conductive layer (see 84 in FIGS. 18A and 18B) may be patterned and formed into cell barrier patterns 282c and cell upper contact patterns 284c in the cell array region CA, and into peripheral barrier patterns 282p and peripheral contact conductive patterns 284p in the peripheral circuit region PA.

Portions of the cell barrier patterns 282c and the cell upper contact patterns 284c disposed at a higher level than the isolation patterns 63 and the cell interconnection mask patterns 45c may constitute cell pad portions 287c of cell contact structures 286c. The cell contact structures 286c may include cell contact silicide layers 80c under the cell barrier patterns 282c, and cell lower contact patterns 76 under the cell contact silicide layers 80c.

Portions of the peripheral barrier patterns 282p and the peripheral contact conductive patterns 284p disposed at a higher level than the peripheral interlayer insulating layer 57 and the peripheral gate mask pattern 45p may constitute peripheral pad portions 287p of peripheral contact structures 286p. The peripheral contact structures 286p may include peripheral contact silicide layers 80p under the peripheral barrier patterns 282p.

Subsequently, a pad insulating layer 288 may be disposed filling between the cell pad portions 287c of the cell contact structures 286c and between the peripheral pad portions 287p of the peripheral contact structures 286p. Forming the pad insulating layer 288 may include forming an insulating material on a semiconductor substrate having the cell contact structures 286c and the peripheral contact structures 286p, and planarizing the insulating material until upper surfaces of the cell and peripheral pad portions 287c and 287p are exposed.

Referring to FIGS. 4, 5A and 5B, data storage elements 92 of a memory device may be formed on the cell contact structures 286c. The data storage elements 92 may be variable resistance structures. The data storage elements 92 may include memory cells that can store data of an MRAM. The data storage elements 92 may each include a base layer 89, a magnetization layer 90a, a tunnel barrier layer 90b, a free layer 90c and a capping layer 91 that are stacked, for example sequentially stacked.

A protection liner 93 that is insulating may be formed on a semiconductor substrate having the data storage elements 92. An upper interlayer insulating layer 94 may be formed on a semiconductor substrate having the protection liner 93. Bit line structures 96 and peripheral interconnection structures 96p may be formed on the upper interlayer insulating layer 94. Each of the bit line structures 96 may include a bit line 96b that has a line shape extending in the second direction Dx and contact portions 96a that pass through the upper interlayer insulating layer 94 and the protection liner 94 and are physically and/or electrically connected to the data storage elements 92. The bit lines 96b of the bit line structures 96 may overlap the cell active regions 7c.

Referring to FIGS. 21A to 26B, an example of a method of forming a semiconductor device according to an example embodiment of the inventive concepts will be described. In FIGS. 21A to 26B, FIGS. 21A, 22A, 23A, 24A, 25A and 26A are cross-sectional views illustrating a region taken along line I-I' in FIG. 1, and FIGS. 21B, 22B, 23B, 24B, 25B and 26B are cross-sectional views illustrating regions taken along line II-II', III-III' and IV-IV' in FIG. 1.

Figure 21A:
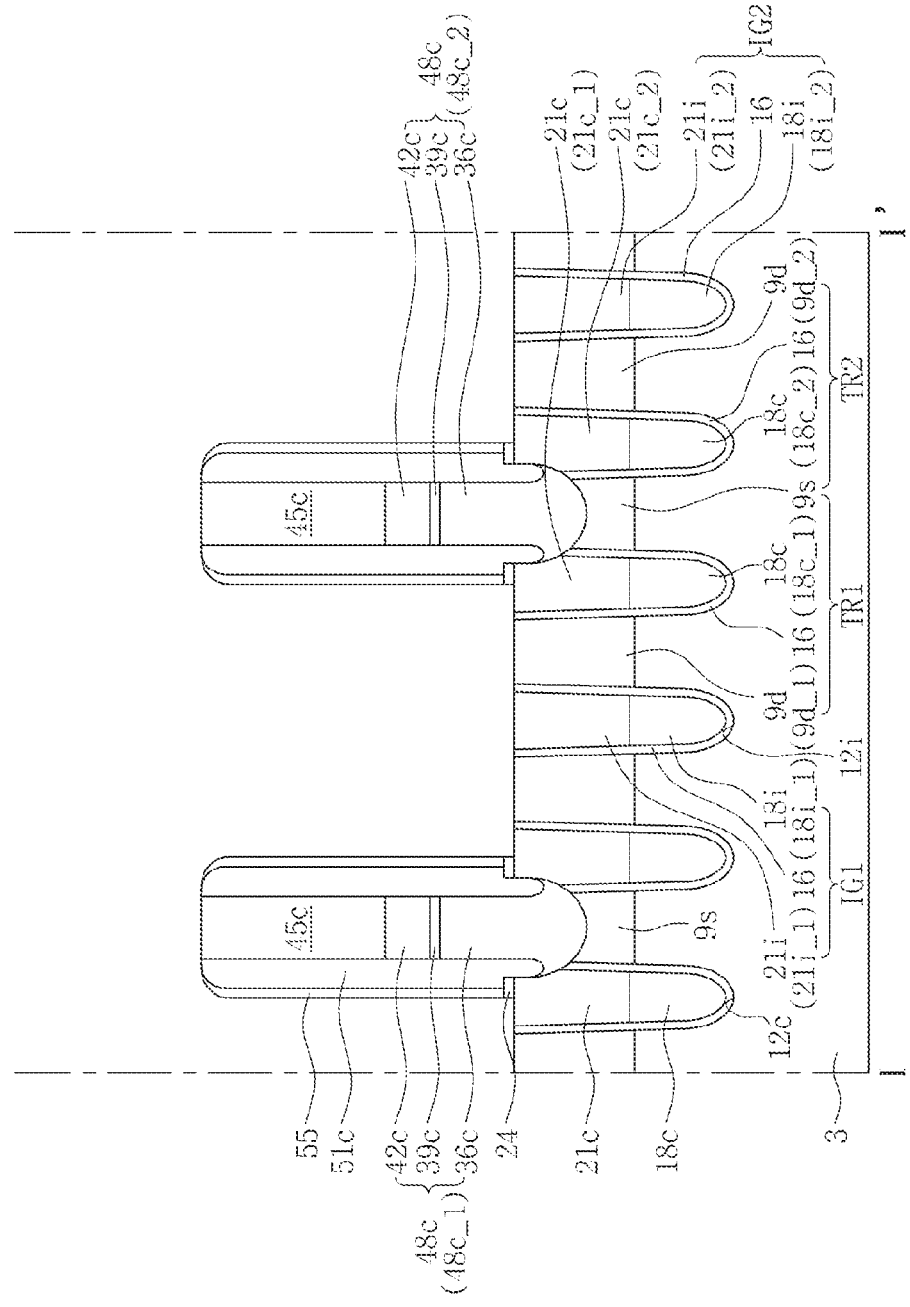
FIGS. 21A to 26B are cross-sectional views illustrating an example of a method for forming a semiconductor device according to an example embodiment of the inventive concepts.
Figure 21B:
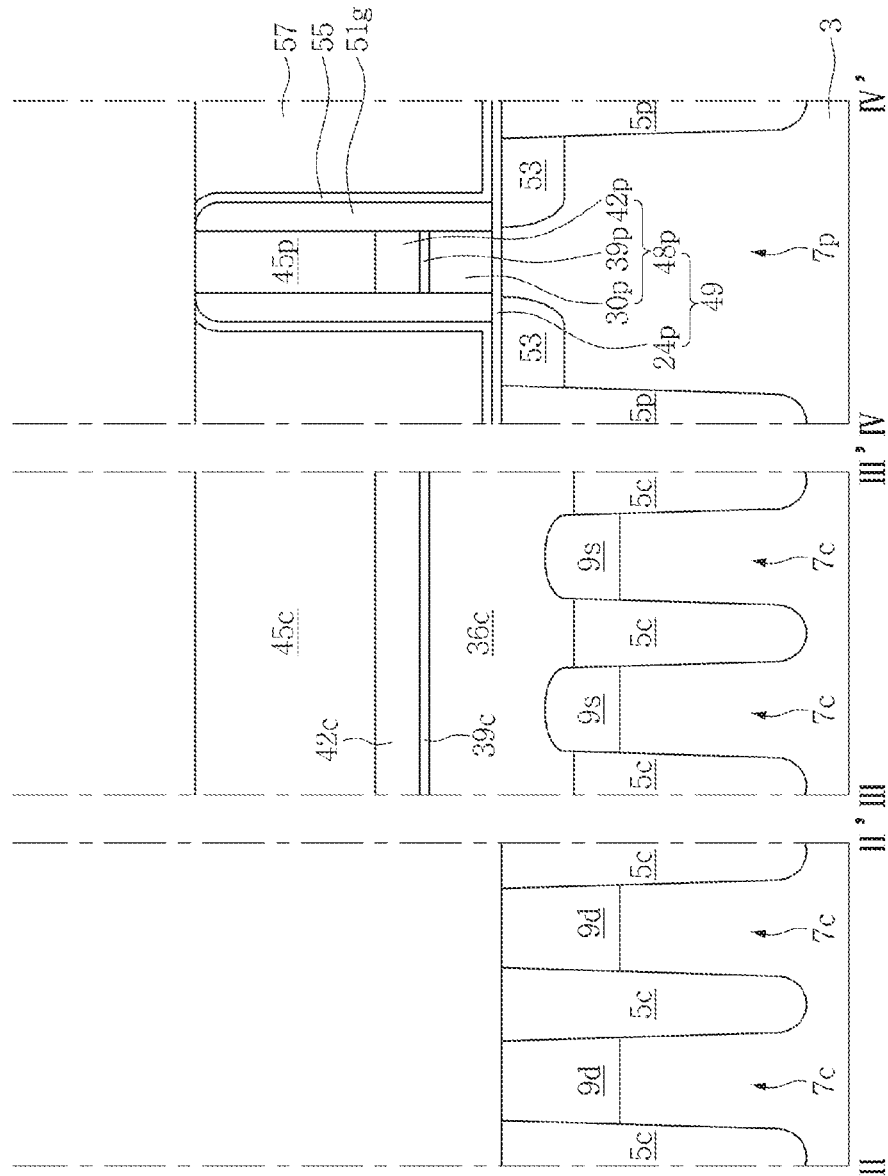

Referring to FIGS. 1, 21A and 21B, a semiconductor substrate may be prepared by performing the process as described with reference to FIGS. 6A to 10B. For example, by using the method described with reference to FIGS. 6A and 6B, the isolation regions 5c and 5p that define the active regions 7c and 7p may be formed in the semiconductor substrate 3, the isolating gate patterns IG1 and IG2, and the cell transistors TR1 and TR2 buried in the semiconductor substrate 3 may be formed, and a lower buffer layer 24, an upper buffer layer 27, and an interconnection lower layer 30 that are stacked, for example sequentially stacked on the semiconductor substrate 3 may be formed. Further, the contact grooves 33 as described with reference to FIGS. 7A and 7B may be formed, the interconnection lower lines 36 as described with reference to FIGS. 8A and 8B, may be formed, and the cell interconnection mask patterns 45c, the peripheral gate mask pattern 45p, the cell interconnection structures 48c and the peripheral gate electrode 48p as described with reference to FIGS. 9A and 9B may be formed. Further, as described with reference to FIGS. 10A and 10B, the interconnection spacers 51c and the peripheral gate spacers 51p may be formed, the insulating liner 55 may be formed, and the peripheral interlayer insulating layer 57 in the peripheral circuit region PA may be formed. Subsequently, the cell drain regions 9d may be exposed by etching the insulating liner 55 and the lower buffer insulating layer 24.

Figure 22A:
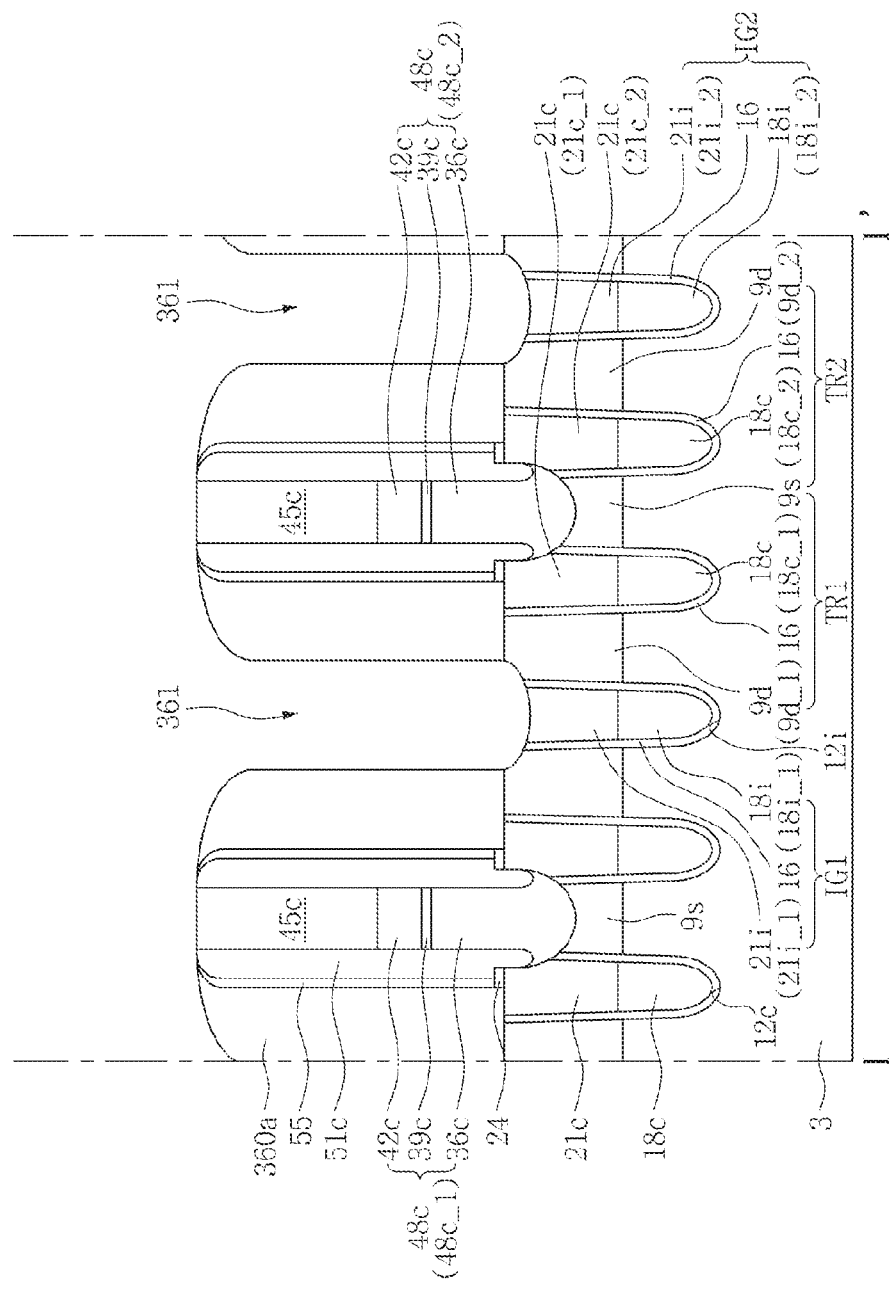
Figure 22B:
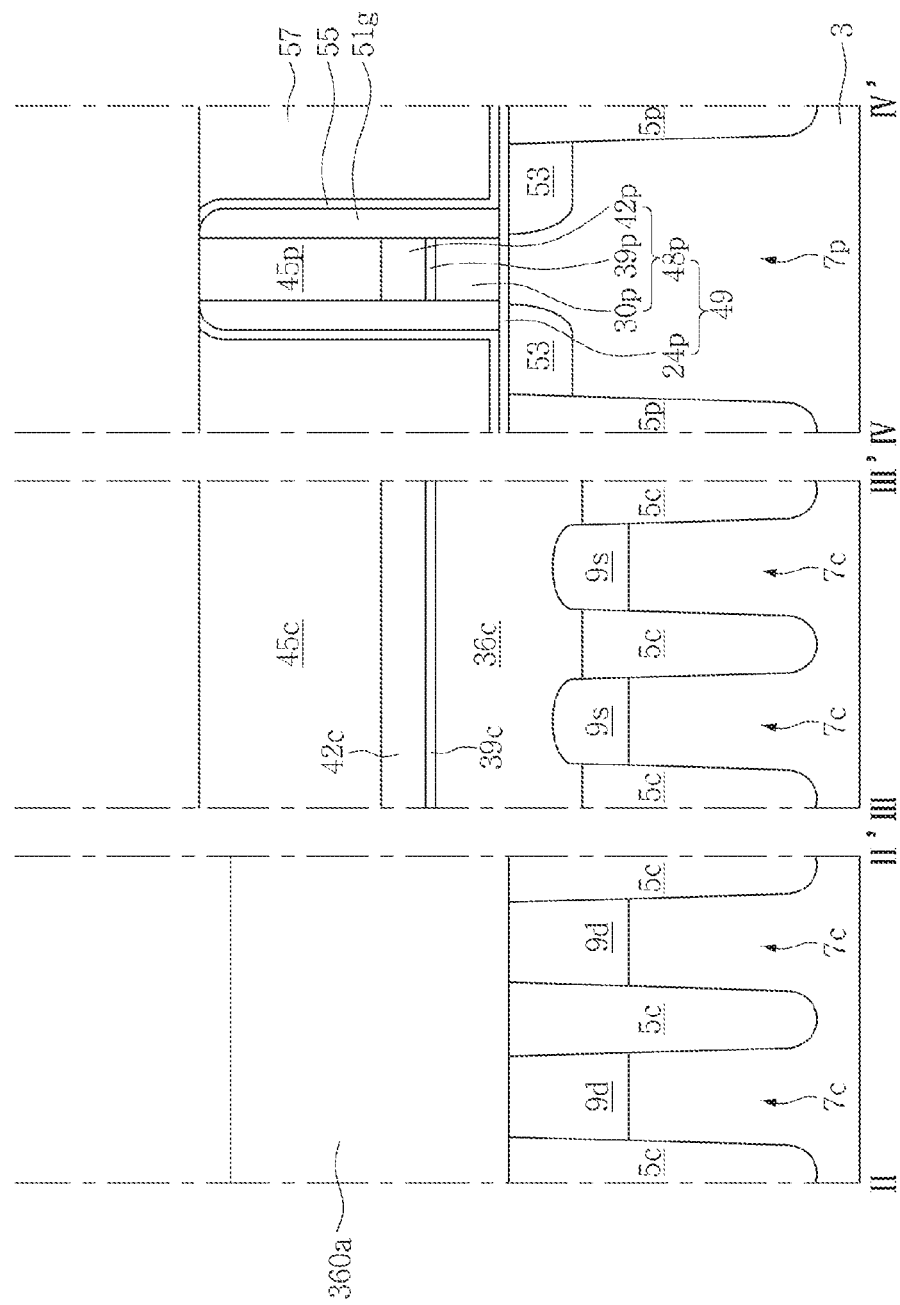

Referring to FIGS. 1, 22A and 22B, after the cell drain regions 9d are exposed, a contact spacer layer may be conformally formed on the semiconductor substrate 3, and the contact spacer layer may be anisotropically etched to form contact spacer lines 360a. The contact spacer lines 360a may be formed on side surfaces of the cell interconnection structures 48c and the cell interconnection mask patterns 45c. The contact spacer lines 360a may be formed of or include a conductive material, for example, a doped polysilicon material. The contact spacer lines 360a may be physically and/or electrically connected to the cell drain regions 9d.

When the etching process for forming the contact spacer lines 360a is performed on the contact spacer layer, a part of the isolating gate capping patterns 21i may be etched. Spaces disposed between the contact spacer lines 360a and disposed on the isolating gate capping patterns 21i may be referred to as isolation grooves 361.

Figure 23A:
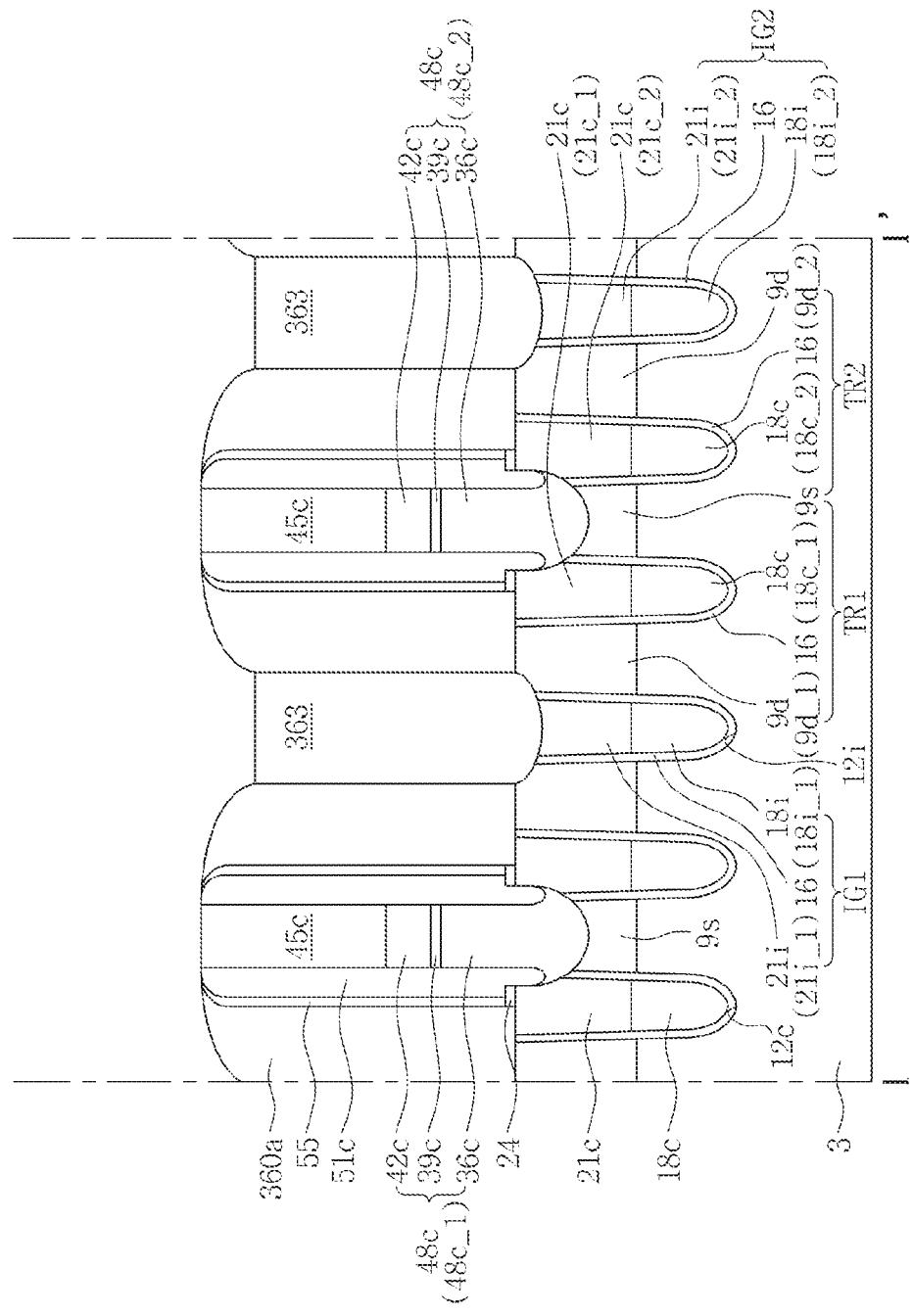
Figure 23B:
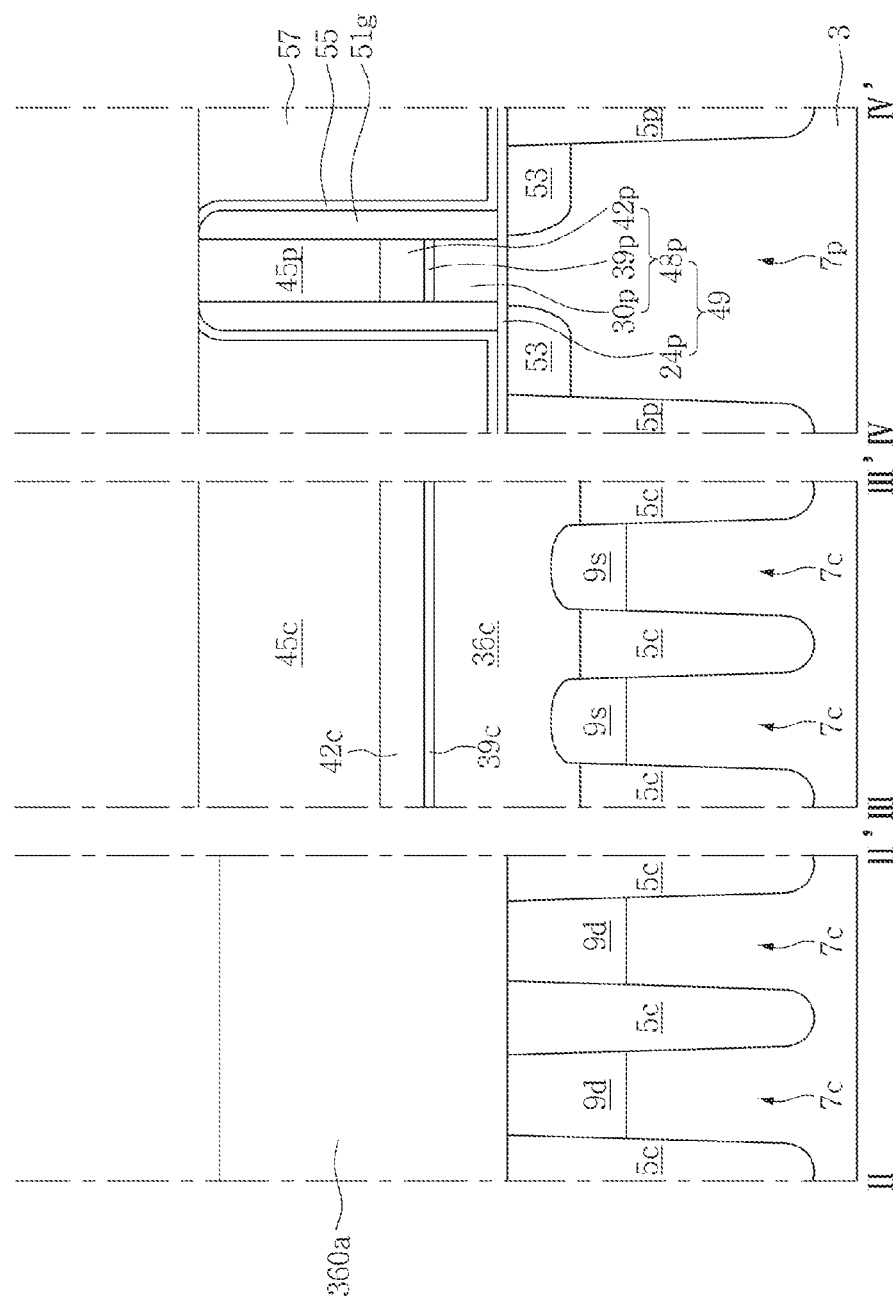

Referring to FIGS. 1, 23A and 23B, isolation patterns 363 that are insulating may be formed in the isolation grooves 361. The isolation patterns 363 may fill the isolation grooves 361. The isolation patterns 363 may be formed of or include an insulating material such as, for example, a silicon nitride. Forming the isolation patterns 363 may include forming an insulating material on a semiconductor substrate having the isolation grooves 361, and planarizing the insulating material.

Figure 24A:
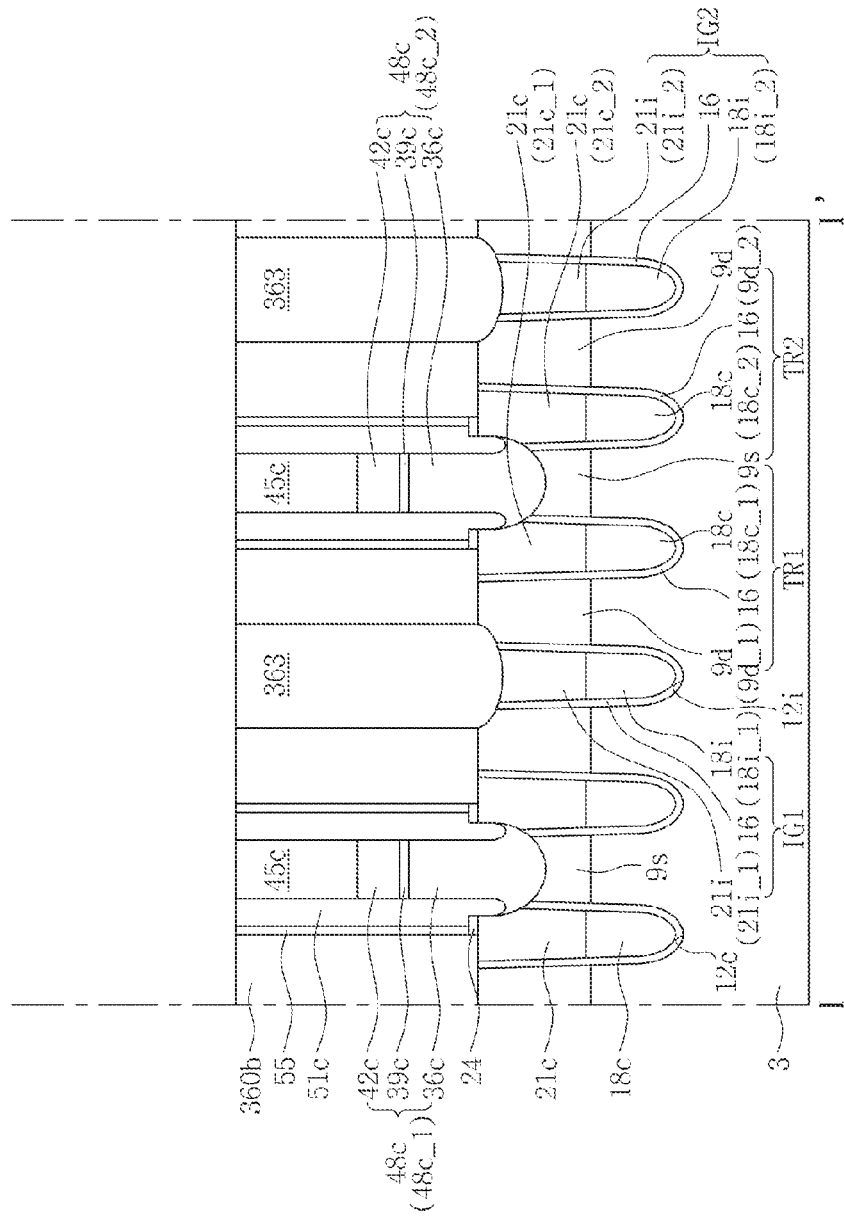
Figure 24B:
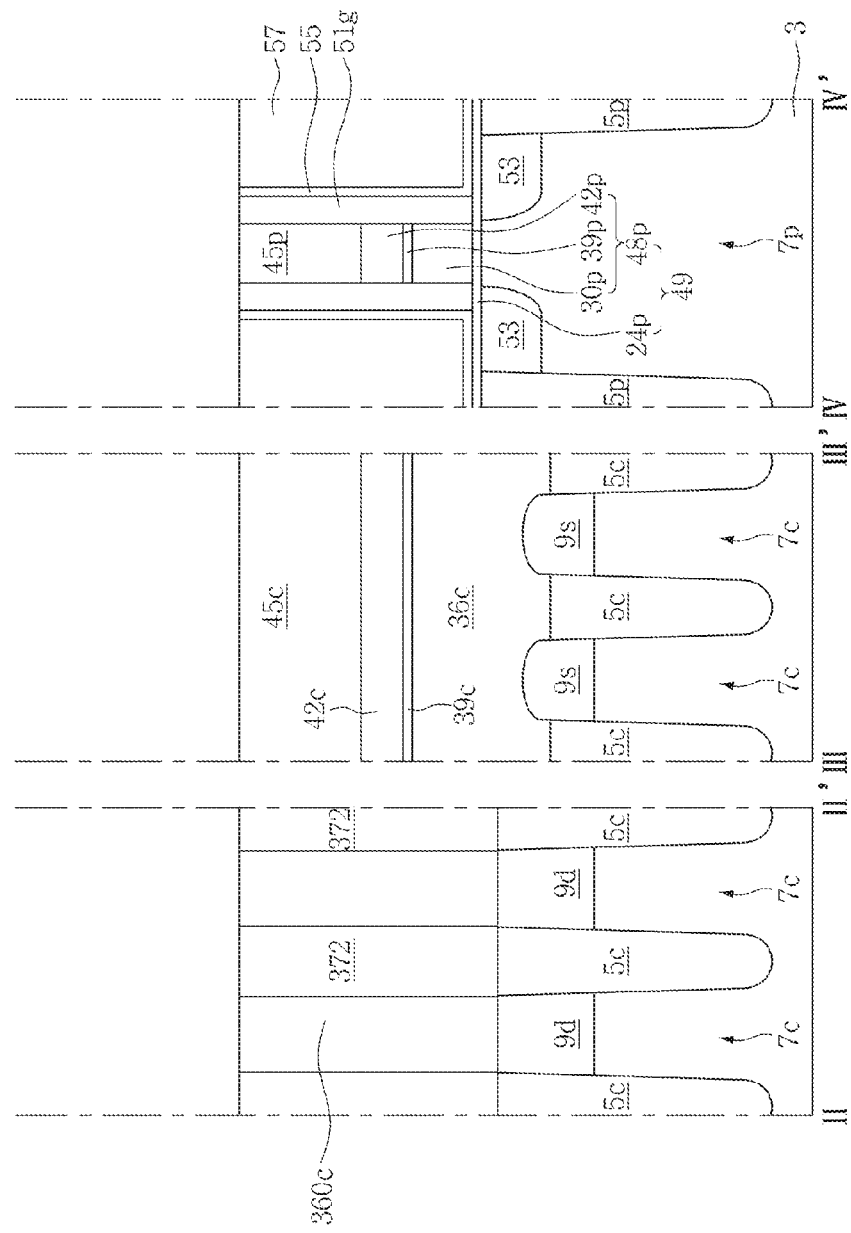

Referring to FIGS. 1, 24A and 24B, after the isolation patterns 363 are formed, contact spacer patterns 360b may be formed by patterning the contact spacer lines 360a using a photolithography and etching process. The contact spacer patterns 360b may be formed on the cell active regions 7c. Further, the contact spacer lines 360a disposed on the cell isolation regions 5c may be removed to form holes that expose the cell isolation regions 5c.

Insulating patterns 372 may be formed in the holes that are formed by removing the contact spacer lines 360a. Forming the insulating patterns 372 may include forming an insulating material on a semiconductor substrate having the holes that are formed by removing the contact spacer lines 360a and planarizing the insulating material. The insulating patterns 372 may be formed of or include a silicon nitride or silicon oxide.

Figure 25A:
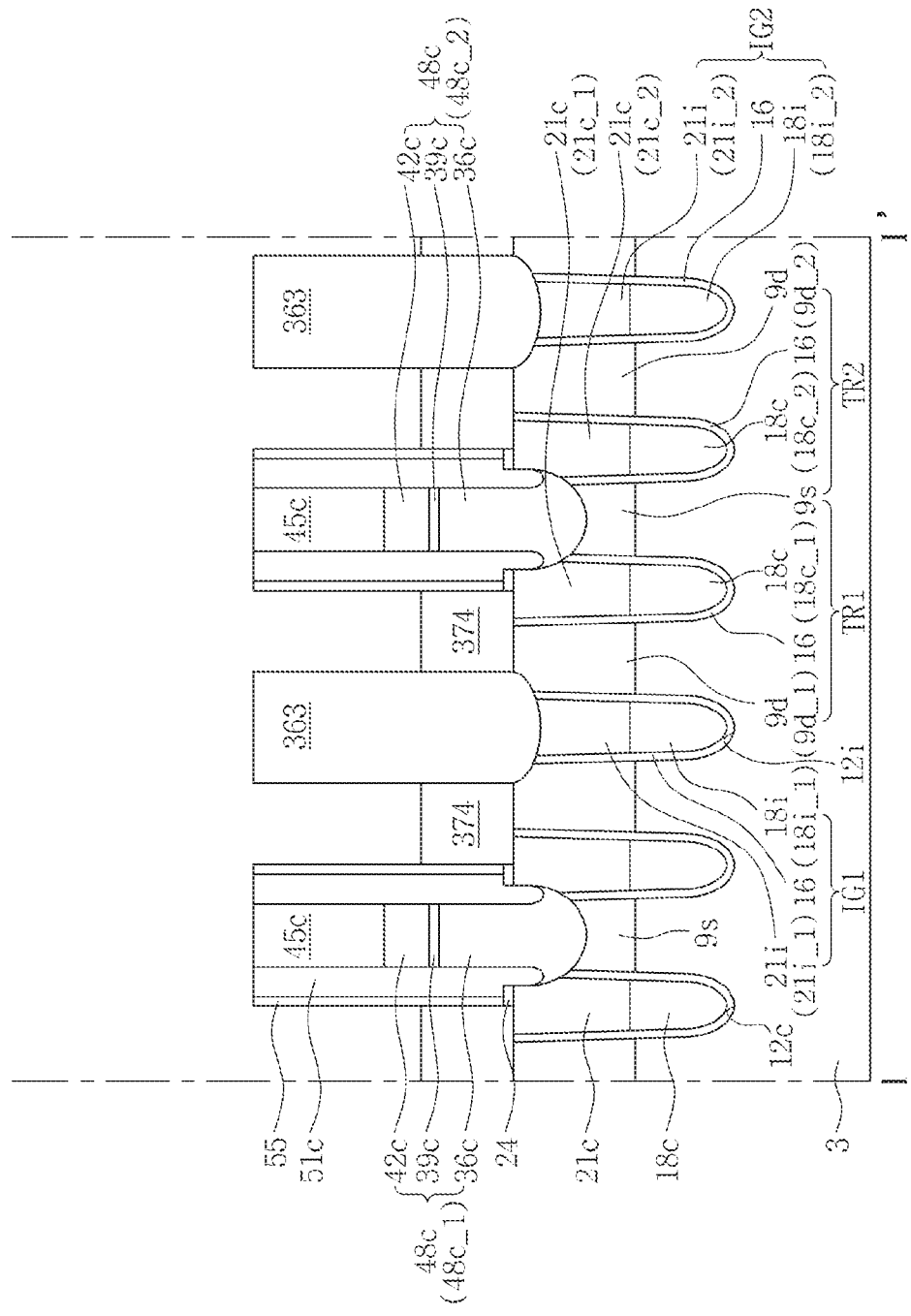
Figure 25B:
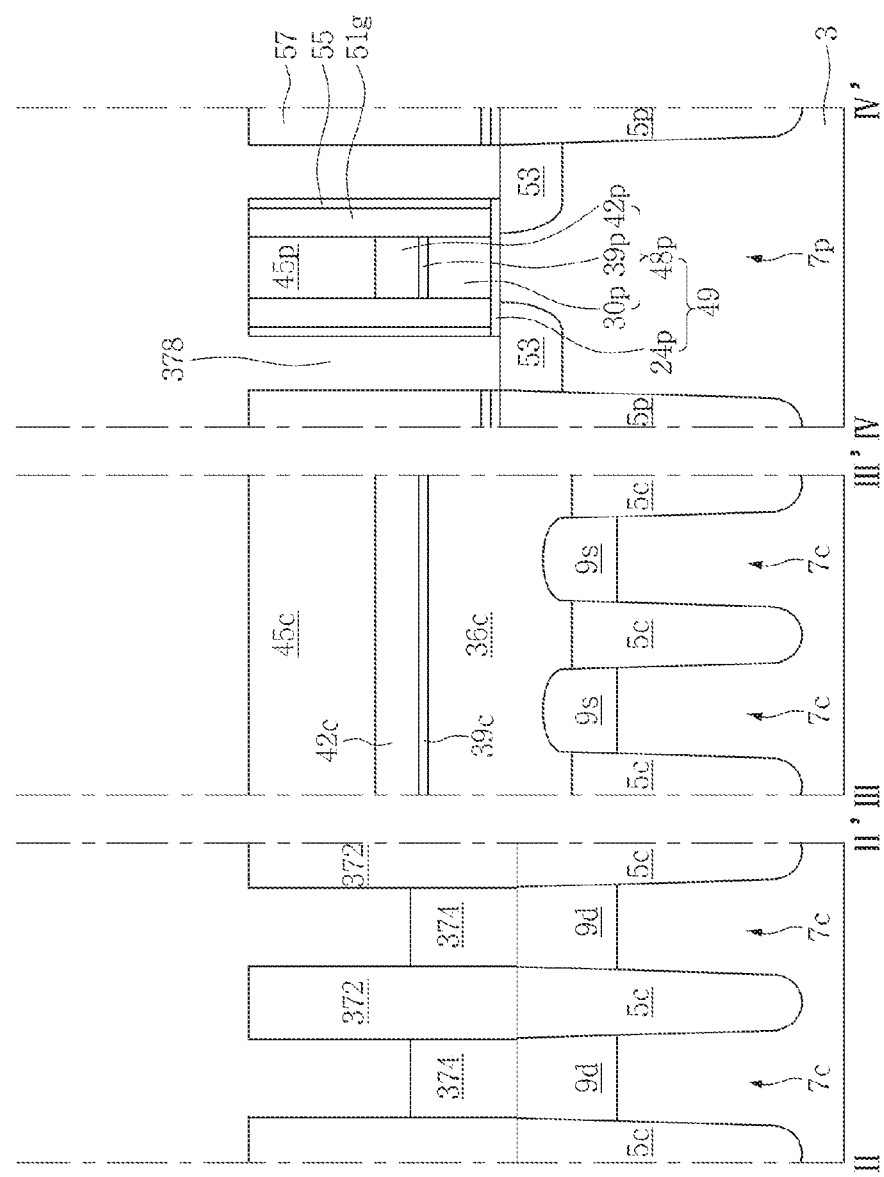

Referring to FIGS. 1, 25A and 25B, after the insulating patterns 372 are formed, cell lower contact patterns 374 may be formed by at least partially etching the contact spacer patterns 360b. Subsequently, peripheral contact holes 378 that pass through the peripheral interlayer insulating layer 57 and expose the peripheral source and drain regions 53 in the peripheral active region 7p may be formed by patterning the peripheral interlayer insulating layer 57.

Figure 26A:
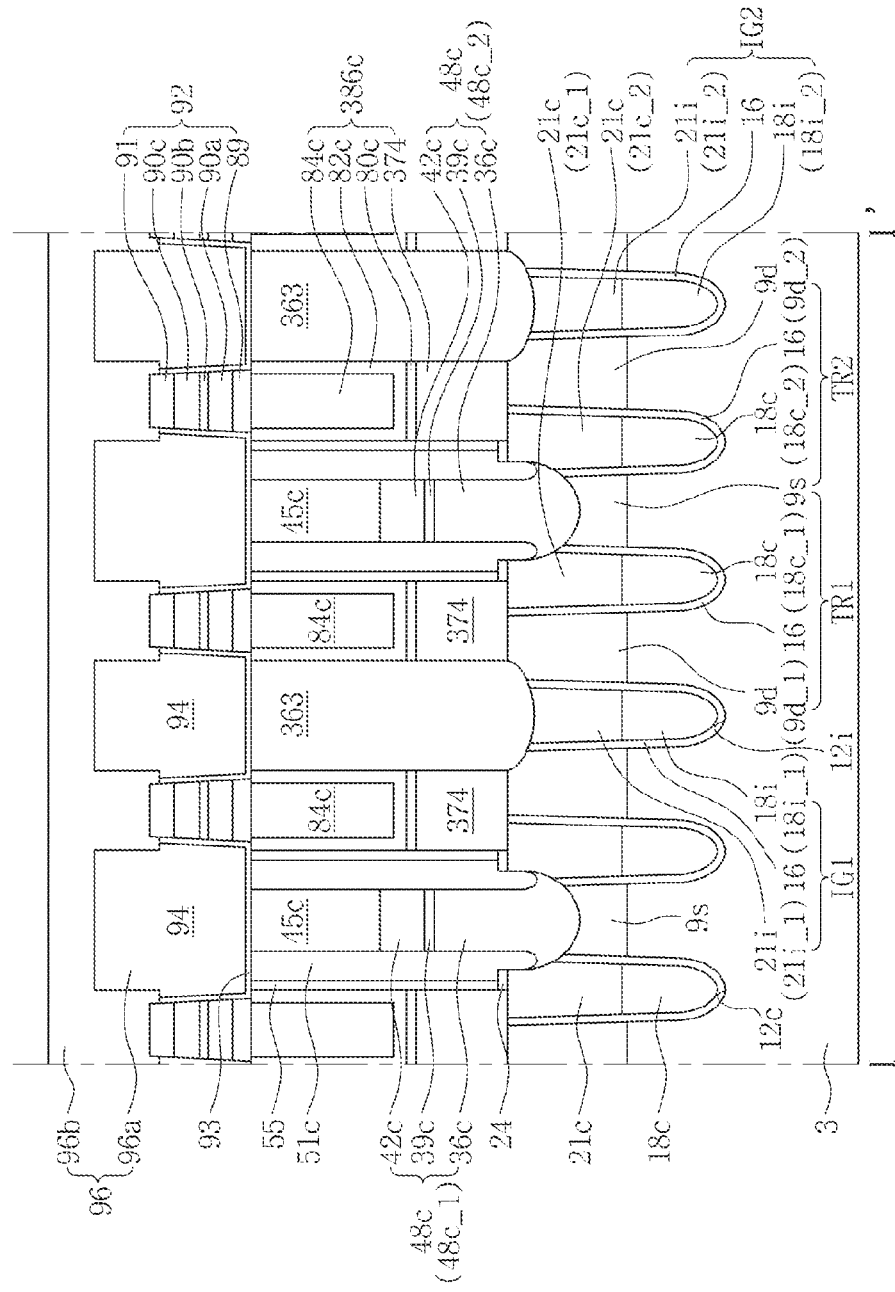
Figure 26B:
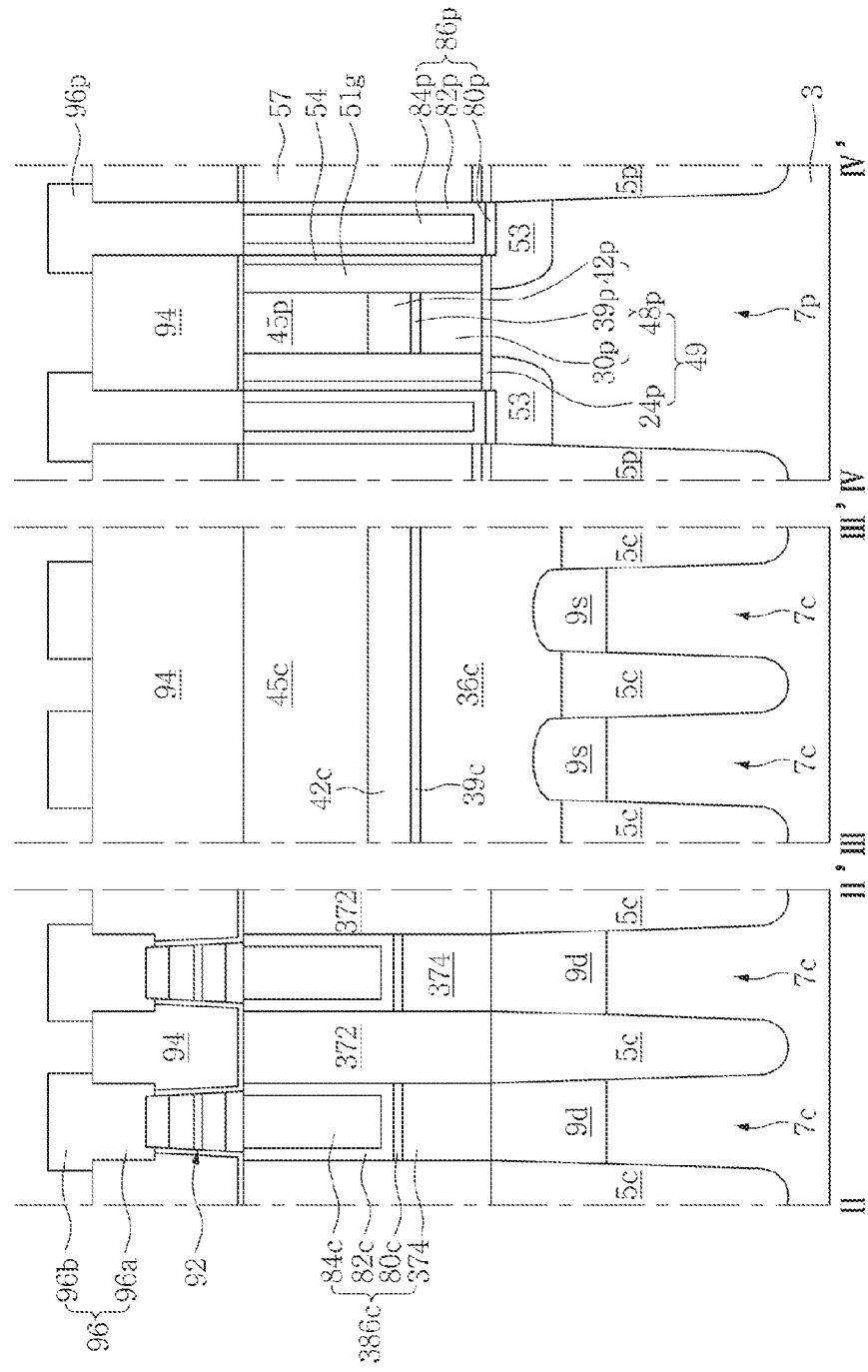

Referring to FIGS. 1, 26A and 26B, a peripheral contact silicide layer 80p may be formed by performing a silicide process to react a metal material with the peripheral source and drain regions 53 exposed by the peripheral contact holes 378. A cell contact silicide layer 80c may be formed by a performing silicide process to react a metal material with the cell lower contact patterns 374.

Subsequently, by performing the process of forming the barrier layer (see 82 in FIGS. 18A and 18B) and the upper conductive layer (see 84 in FIGS. 18A and 18B) as described with reference to FIGS. 18A and 18B and by performing the process as described with reference to FIGS. 19A and 19B, cell contact structures 348c and the peripheral contact structures 86p may be formed to be practically the same as the cell contact structures 86c and the peripheral contact structures 86p as described with reference to FIGS. 19A and 19B. For example, the cell contact structures 348c may include the cell lower contact patterns 374 corresponding to the configuration element of the cell contact structures 348c, the cell contact silicide layer 80c, the cell barrier patterns 82c and the cell upper contact patterns 84c. Subsequently, the data storage elements 92, the upper interlayer insulating layer 94, the bit line structures 96 and the peripheral interconnection structure 96p as described with reference to FIGS. 1, 2A and 2B may be formed.

According to an example embodiment of the inventive concepts, in order to reduce or prevent a bridge failure between patterns and to increase the degree of integration, a plurality of interconnections (e.g., see 48c in FIGS. 21A and 21B) substantially parallel to each other may be formed, spacer lines (e.g., see 360a in FIGS. 22A and 22B) may be formed on side surfaces of the interconnections 48c without a photolithography process, line-shaped isolation patterns (e.g., see 363 in FIGS. 23A and 23B) may be formed between the interconnections 48c without a photolithography process, contact spacer patterns (see 360b in FIGS. 24A and 24B) and first holes between the contact spacer patterns 360b may be formed by being patterned from spacer lines 360a using a photolithography process, and insulating patterns (see 372 in FIGS. 24A and 24B) in the first holes may be formed. The contact spacer patterns 360b may be formed into the cell lower contact patterns 374 as described with reference to FIGS. 25A and 25B and into the cell contact structures 386c as described with reference to FIGS. 26A and 26B using an etching process without a photolithography process.

A width of the cell contact structures 386c may be determined by a width of the spacer lines (e.g., 360a in FIGS. 22A and 22B) formed without using a photolithography process. Since a width of the contact spacer lines (e.g., see 360a in FIGS. 22A and 22B) may be determined by a deposition process, which is more precisely controlled than a photolithography process, the cell contact structures 386c formed using the contact spacer lines 360a may be formed in a small width, which is not easy to be implemented by a photolithography process. Therefore, the overall degree of integration of a semiconductor device may be enhanced.

According to embodiments of the inventive concepts, a method of forming a semiconductor can be provided to reduce or prevent an electrical short or a bridge failure between patterns and enhance the degree of integration.

The foregoing is illustrative of embodiments of the inventive concepts with reference to the accompanying drawings. Although a number of embodiments have been described, those of ordinary skill in the art will readily understand that many modifications are possible in embodiments without materially departing from the novel teachings and advantages. Therefore, it is to be understood that the foregoing is illustrative of various embodiments and is not to be construed as limited to the specific embodiments disclosed.

What is claimed is:

1. A semiconductor device comprising:
    first and second isolating gate patterns configured to have a line shape extending in a first direction;
    first and second cell transistors disposed between the first and second isolating gate patterns, the first and second cell transistors sharing a common source region, the first cell transistor including the common source region, a first cell drain region, and a first cell gate line, and the second cell transistor including the common source region, a second cell drain region, and a second cell gate line;
    a first isolation pattern disposed on the first isolating gate pattern and configured to have a line shape extending in the first direction;
    a second isolation pattern disposed on the second isolating gate pattern and configured to have a line shape extending in the first direction;
    a cell interconnection structure disposed between the first and second isolation patterns, disposed on the common source region, and configured to have a line shape extending in the first direction;
    a first contact structure disposed on the first cell drain region; and
    a second contact structure disposed on the second cell drain region.

2. The semiconductor device of claim 1, further comprising:
    an active region configured to have a line shape extending in a second direction that is substantially perpendicular to the first direction.

3. The semiconductor device of claim 2, wherein the first and second cell gate lines are buried in the active region.

4. The semiconductor device of claim 3, wherein at least one of the first and second isolating gate patterns include an isolating gate line buried in the active region.

5. The semiconductor device of claim 3, wherein the first and second cell gate lines have a line shape extending in the first direction.

6. The semiconductor device of claim 1, wherein the first isolating gate pattern includes a first isolating gate line and a first isolating gate capping pattern that are sequentially stacked, and the second isolating gate pattern includes a second isolating gate line and a second isolating gate capping pattern that are sequentially stacked.

7. The semiconductor device of claim 6, wherein the first isolation pattern is in contact with the first isolating gate capping pattern and the second isolation pattern is in contact with the second isolating gate capping pattern.

8. The semiconductor device of claim 6, further comprising:
    a first cell gate capping pattern disposed on the first cell gate line,
    wherein an uppermost portion of the first cell gate capping pattern is higher than an uppermost portion of the first isolating gate capping pattern.

9. The semiconductor device of claim 1, further comprising:
    a first data storage element disposed on the first contact structure; and
    a second data storage element disposed on the second contact structure.

10. The semiconductor device of claim 9, further comprising:
    a bit line disposed on the first and second data storage elements and configured to have a line shape extending in the first direction.

11. A semiconductor device comprising:
    cell isolation regions configured to define cell active regions;
    a pair of isolating gate lines disposed in a pair of isolating gate trenches that intersect the cell active regions and the cell isolation regions;
    a pair of cell gate lines disposed in a pair of cell gate trenches that intersect the cell active regions and the cell isolation regions, wherein the pair of cell gate lines are disposed between the pair of isolating gate lines;
    a pair of isolation patterns disposed on the pair of isolating gate lines;
    a cell interconnection structure disposed between the pair of isolation patterns and on the cell active regions and the cell isolation regions;
    cell contact structures disposed between the pair of isolation patterns and the cell interconnection structure and on the cell active regions; and
    insulating patterns disposed between the pair of isolation patterns and the cell interconnection structure and on the cell isolation regions.

12. The semiconductor device of claim 11, wherein the pair of isolating gate lines and the pair of cell gate lines have a line shape extending in a first direction, and the cell active regions and the cell isolation regions have a line shape extending in a second direction substantially perpendicular to the first direction.

13. The semiconductor device of claim 12, wherein the cell interconnection structure and the pair of isolation patterns have a line shape extending in the first direction.

14. The semiconductor device of claim 12, wherein the cell interconnection structure includes a contact portion in contact with the cell active region between the pair of cell gate lines and an interconnection portion on the contact portion, wherein the contact portion of the cell interconnection structure has a line shape extending in the first direction.

15. The semiconductor device of claim 11, further comprising:
    a peripheral isolation region configured to define a peripheral active region;
    a peripheral gate structure configured to intersect the peripheral active region;
    peripheral source and drain regions disposed in the peripheral active region at opposite sides of the peripheral gate structure;
    peripheral contact structures disposed on the peripheral source and drain regions; and
    cell drain regions disposed in the cell active regions under the cell contact structures,
    wherein the peripheral contact structures include a peripheral contact silicide layer disposed on the peripheral source, and drain regions and peripheral contact conductive patterns disposed on the peripheral contact silicide layer, and the cell contact structures include a cell lower contact pattern disposed on the cell drain region, a cell contact silicide layer disposed on the cell lower contact pattern, and a cell upper contact pattern disposed on the cell contact silicide layer,
wherein the cell contact silicide layer and the peripheral contact silicide layer include a same material, and the cell upper contact pattern and the peripheral contact conduction pattern include a same material.

16. A semiconductor device comprising:
a plurality of interconnection structures on an active region and on an isolation region, the plurality of interconnection structures extending in a first direction;
an isolation pattern on the active region and the isolation region, the isolation pattern being between two of the plurality of interconnection structures and extending in the first direction; and
an isolating gate pattern under the isolation pattern and extending in the first direction,
wherein the active region and the isolation region extend in a second direction substantially perpendicular to the first direction.

17. The semiconductor device of claim 16, further comprising:
contact structures between the two of the plurality of interconnection structures, at opposite sides of the isolation pattern, and overlapping the active region.

18. The semiconductor device of claim 17, further comprising:
insulating patterns between the two of the plurality of interconnection structures, at the opposite sides of the isolation pattern, and overlapping the isolation region.

19. The semiconductor device of claim 18, further comprising:
common source regions under the plurality of interconnection structures and in the active region.

20. The semiconductor device of claim 16, wherein the isolating gate pattern is in an isolating gate trench intersecting the active region and the isolation region.

* * * * *